United States Patent
Yamaji

(10) Patent No.: US 11,270,932 B2
(45) Date of Patent: Mar. 8, 2022

(54) CHIP PART AND MANUFACTURING METHOD THEREOF

(71) Applicant: ROHM CO., LTD., Kyoto (JP)

(72) Inventor: Hideaki Yamaji, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

(21) Appl. No.: 16/590,945

(22) Filed: Oct. 2, 2019

(65) Prior Publication Data

US 2020/0111733 A1 Apr. 9, 2020

(30) Foreign Application Priority Data

Oct. 5, 2018 (JP) .............................. JP2018-190198

(51) Int. Cl.

| | |
|---|---|
| H01L 23/31 | (2006.01) |
| H01L 23/522 | (2006.01) |
| H01L 23/29 | (2006.01) |
| H01L 29/861 | (2006.01) |
| H01L 21/56 | (2006.01) |
| H01L 21/304 | (2006.01) |

(52) U.S. Cl.
CPC ........ *H01L 23/522* (2013.01); *H01L 21/3043* (2013.01); *H01L 21/56* (2013.01); *H01L 23/29* (2013.01); *H01L 23/3157* (2013.01)

(58) Field of Classification Search
CPC ....... H01L 21/565–566; H01L 23/3142; H01L 23/16–26
See application file for complete search history.

(56) References Cited

U.S. PATENT DOCUMENTS

| | | | |
|---|---|---|---|
| 2016/0358007 A1* | 12/2016 | Chung | G06K 9/00053 |
| 2017/0083160 A1* | 3/2017 | Hashida | G02F 1/13338 |
| 2017/0200686 A1* | 7/2017 | Kang | H01L 23/3114 |
| 2019/0139843 A1* | 5/2019 | Shigeta | H01L 23/15 |
| 2019/0273195 A1* | 9/2019 | Ukawa | H01L 23/544 |
| 2020/0091120 A1* | 3/2020 | Higashisaka | F21V 19/00 |

FOREIGN PATENT DOCUMENTS

JP H08-115840 A 5/1996

\* cited by examiner

*Primary Examiner* — Julio J Maldonado
*Assistant Examiner* — Mohammad A Rahman
(74) *Attorney, Agent, or Firm* — Rabin & Berdo, P.C.

(57) ABSTRACT

A chip part includes a chip main body which has a first main surface at one side, a second main surface at the other side and side surfaces that connect the first main surface and the second main surface and which includes a terminal electrode exposed from the first main surface, and an outer surface resin which exposes the first main surface of the chip main body and covers an outer surface of the chip main body.

15 Claims, 38 Drawing Sheets

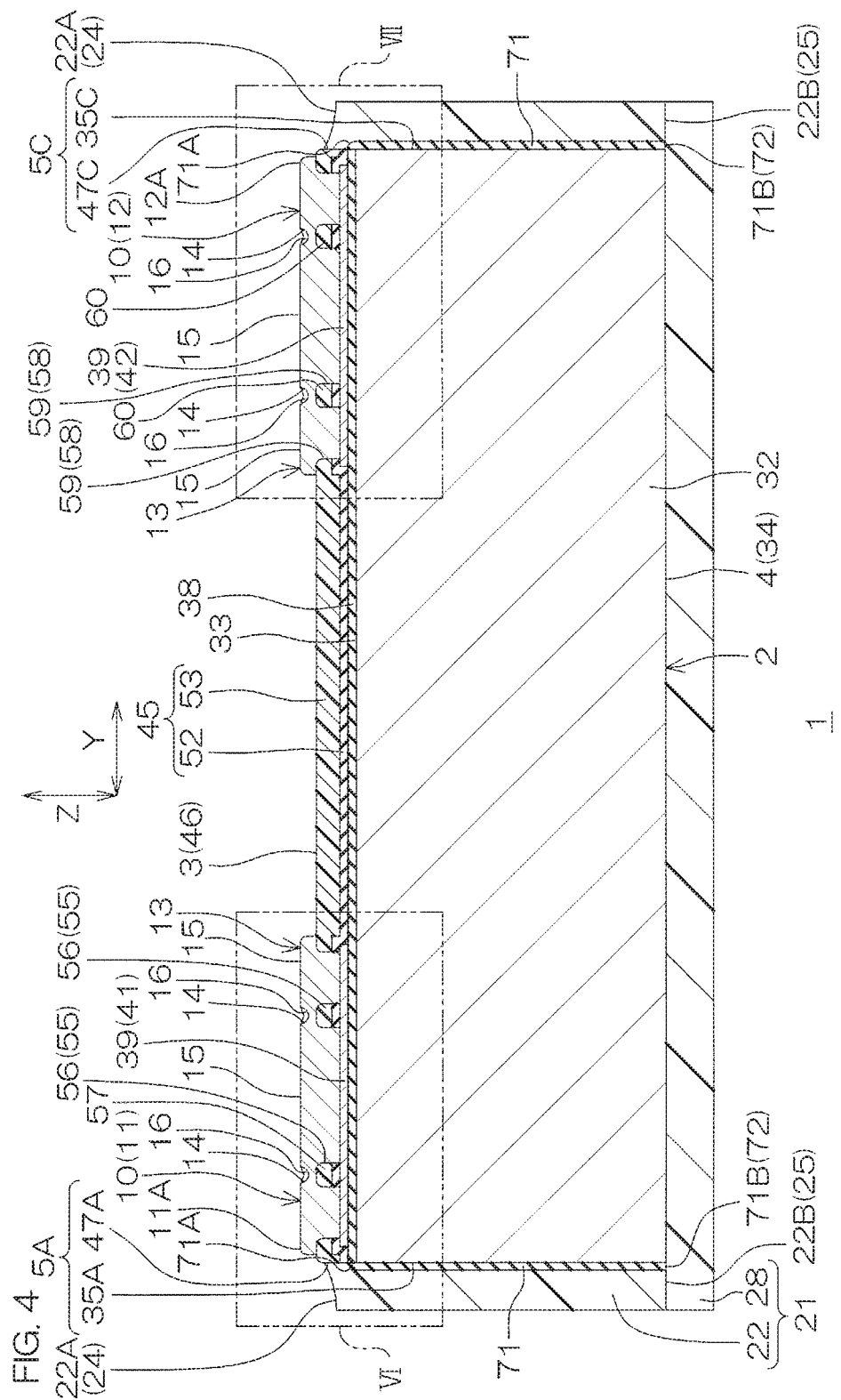

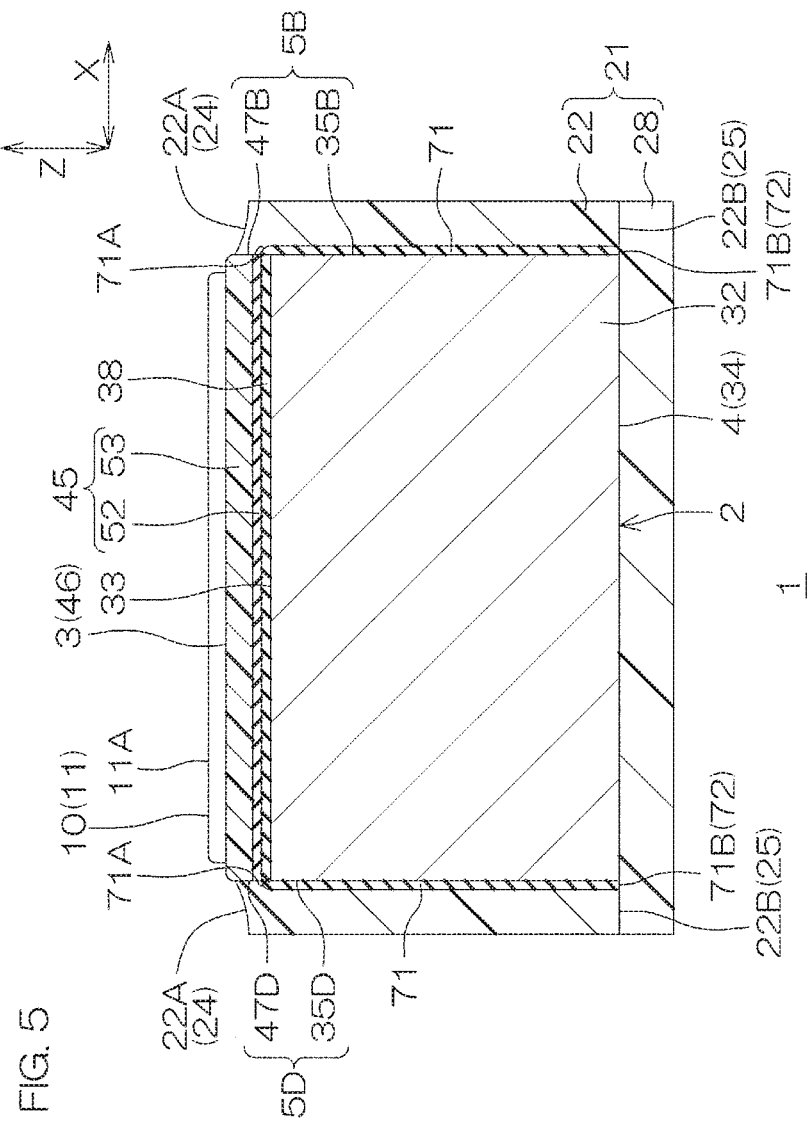

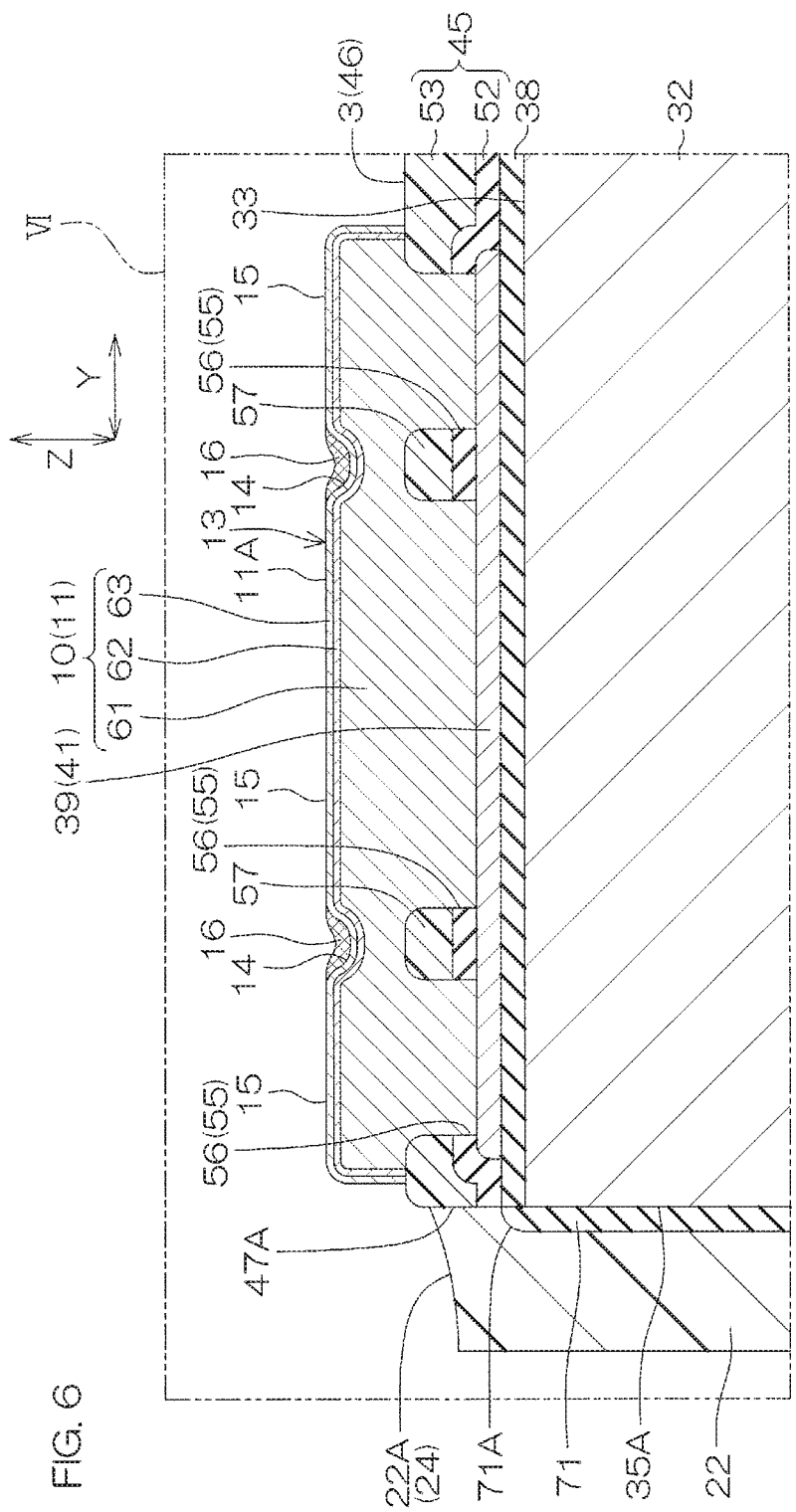

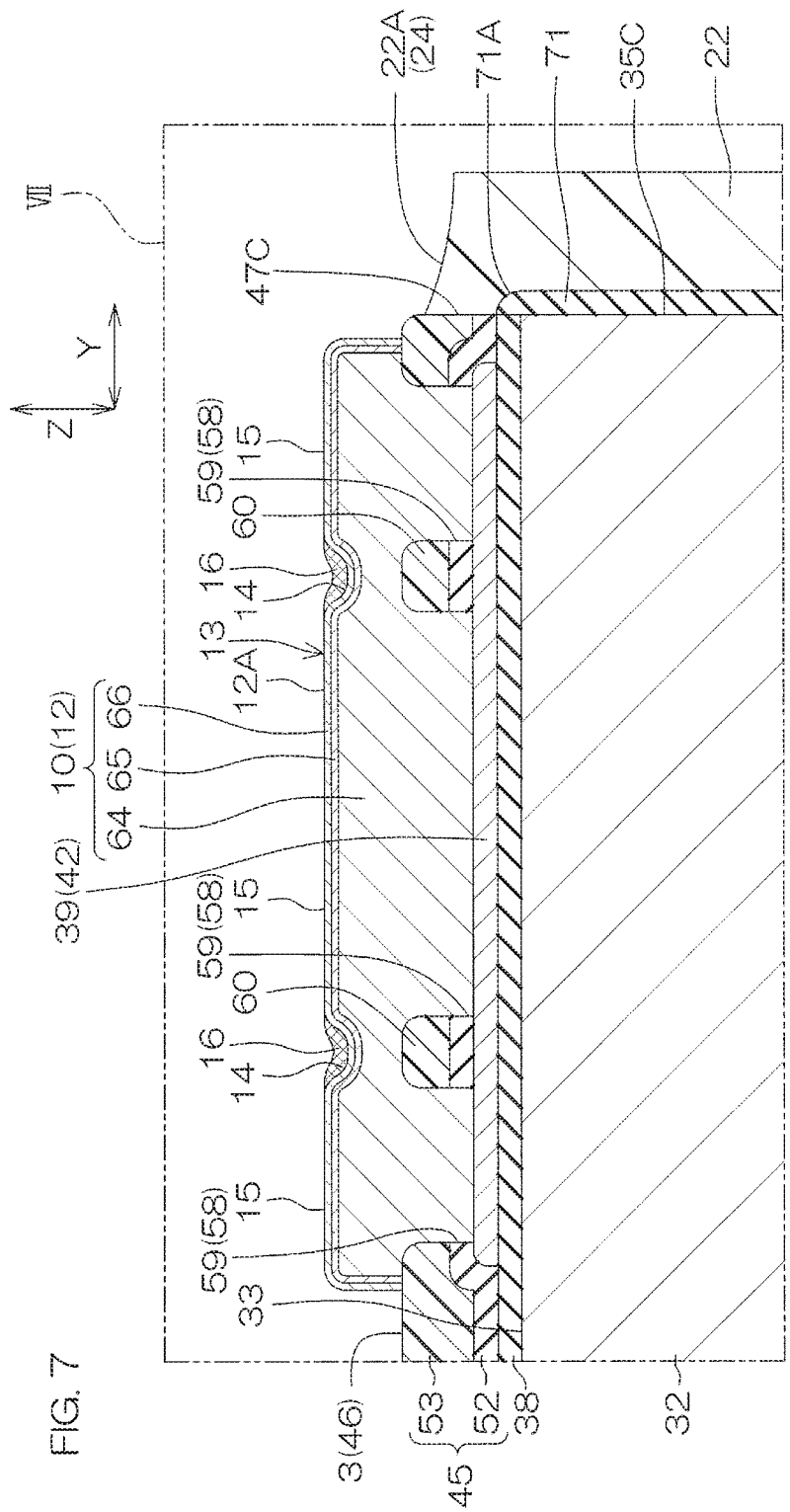

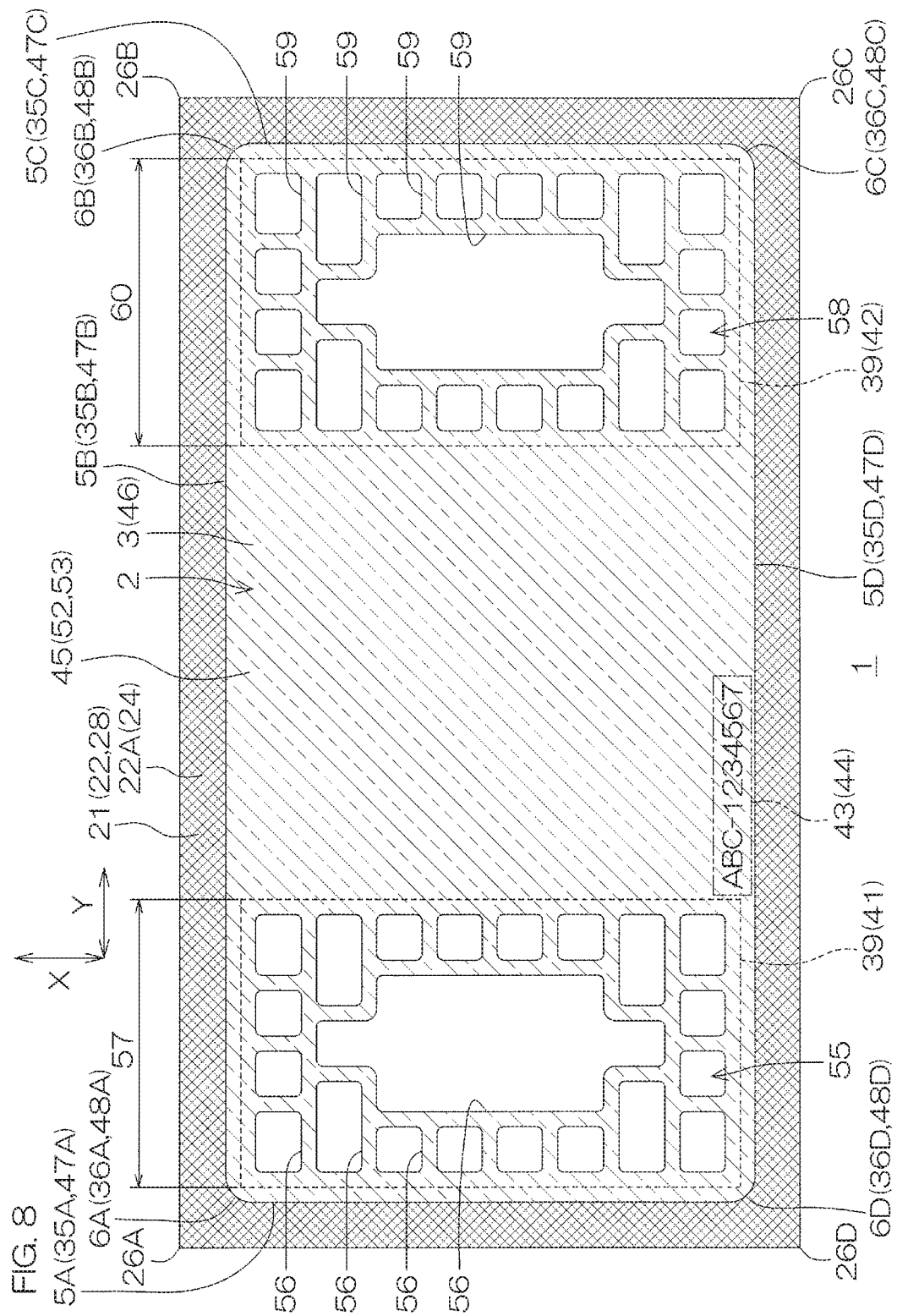

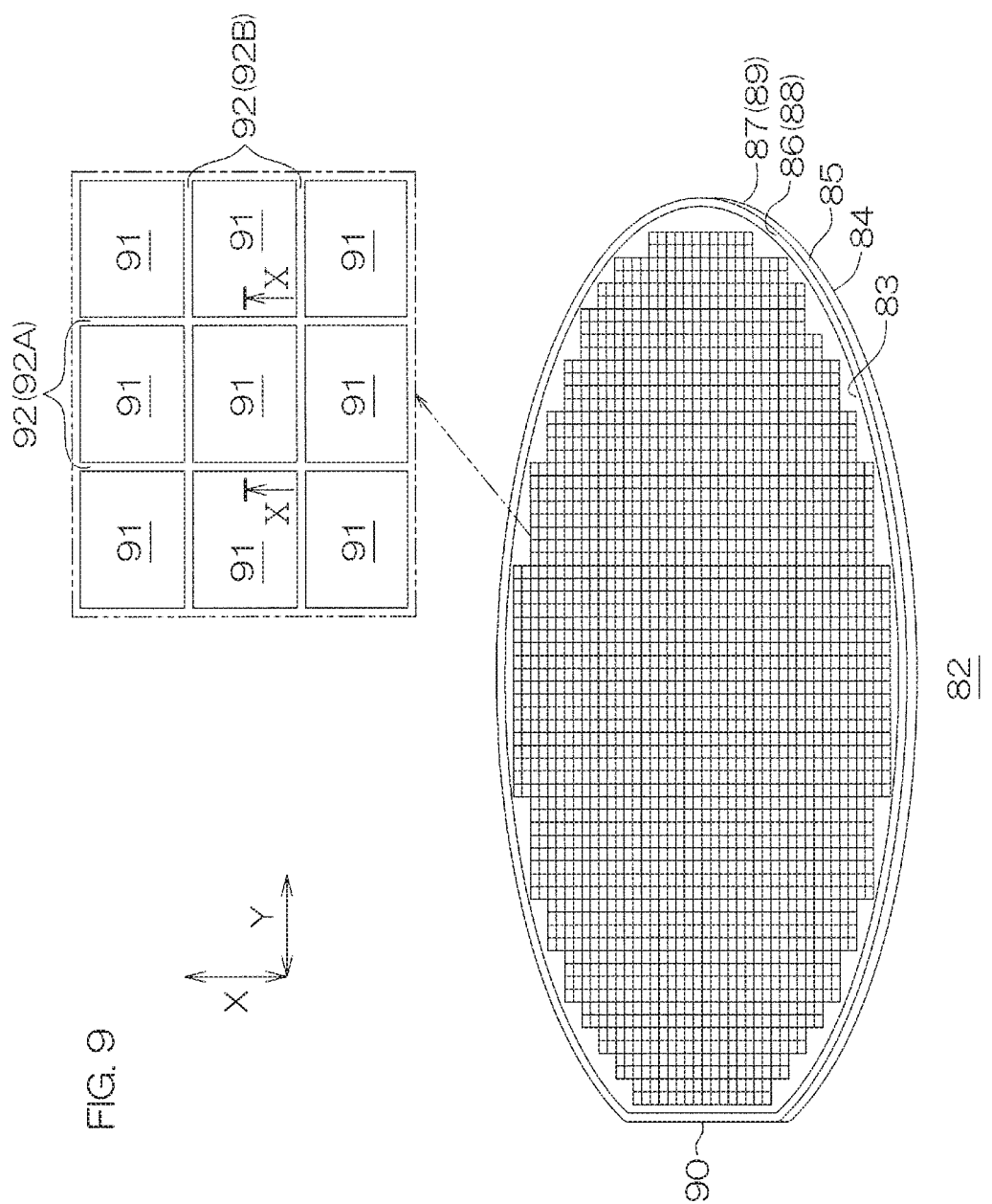

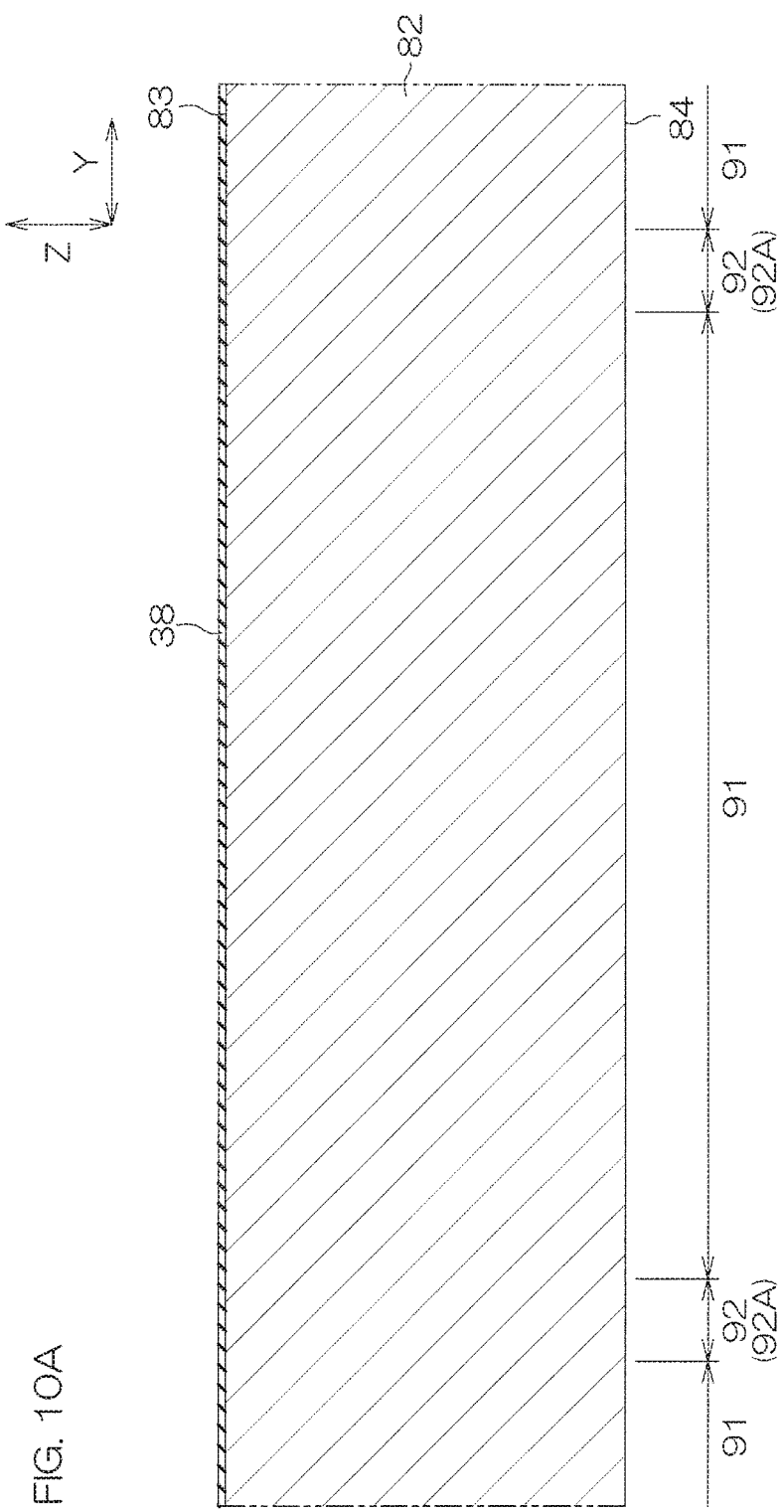

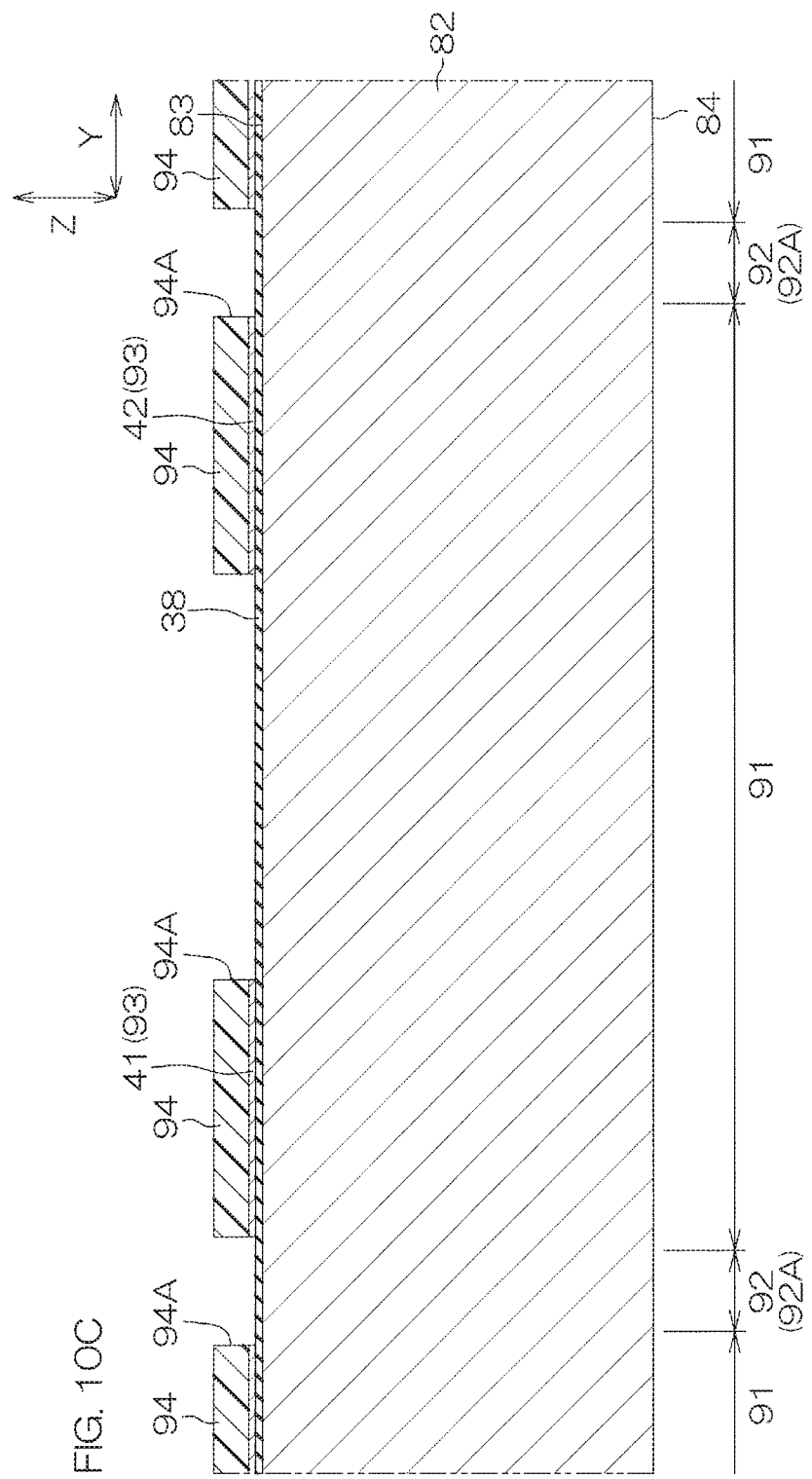

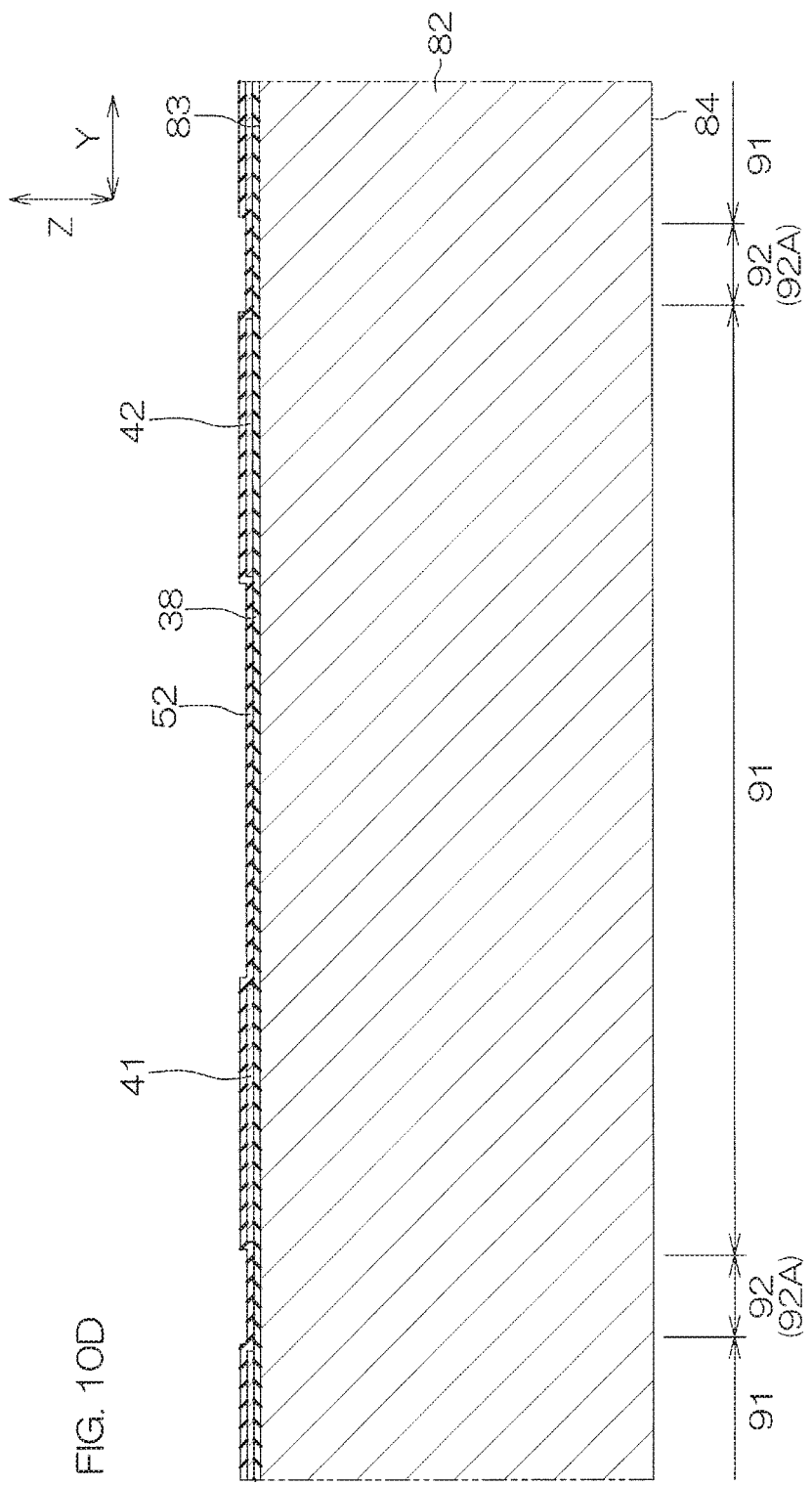

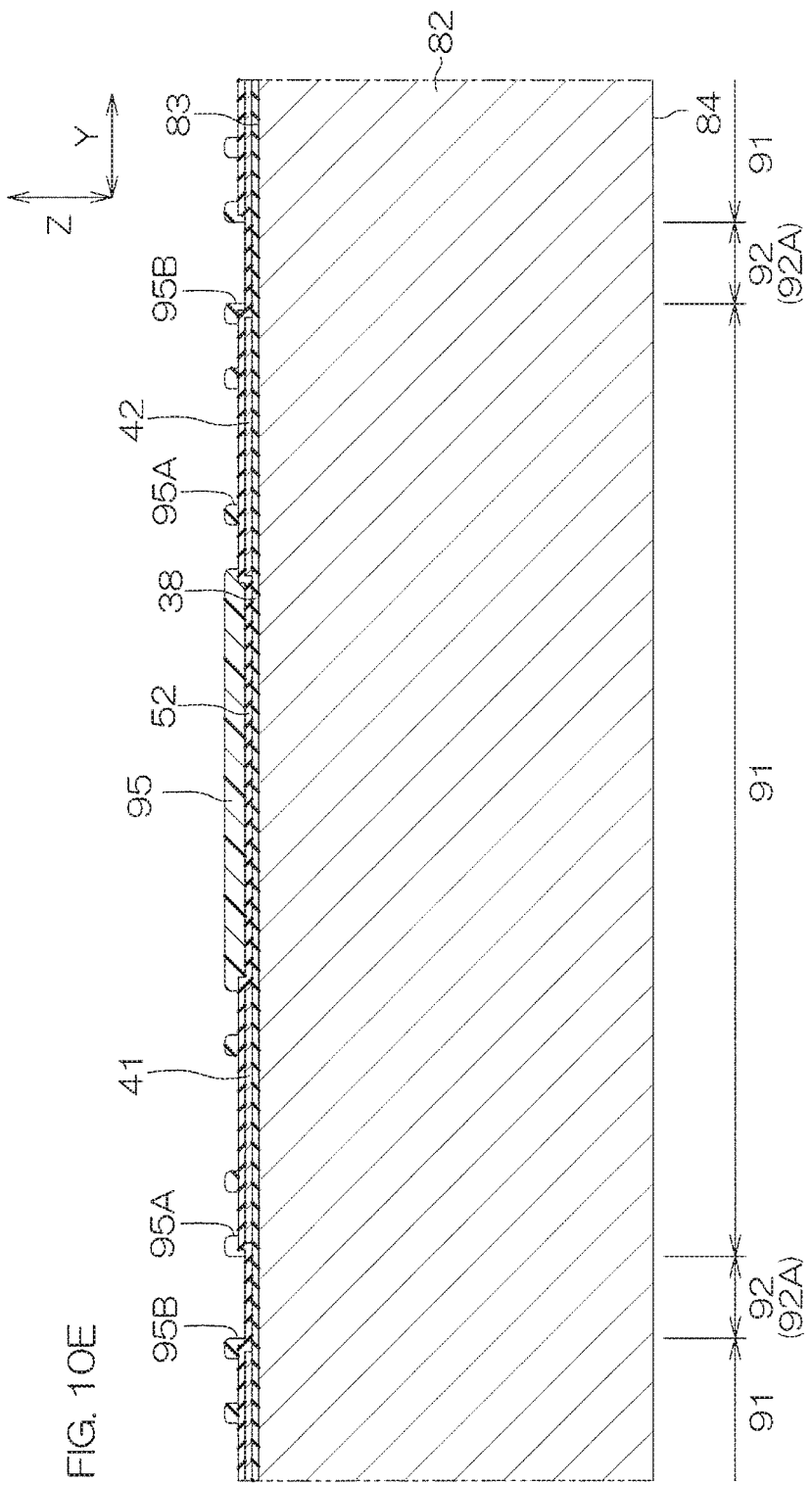

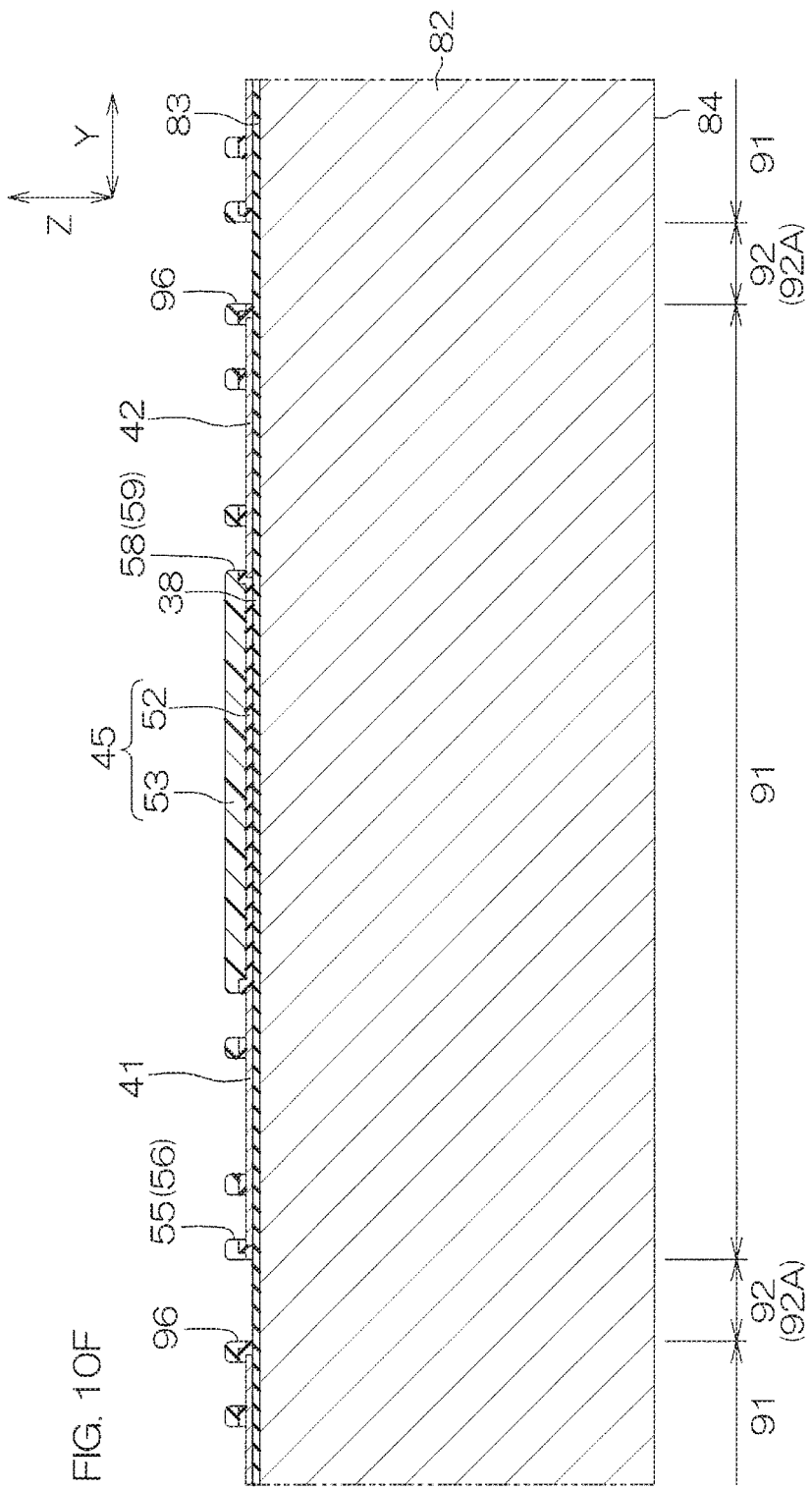

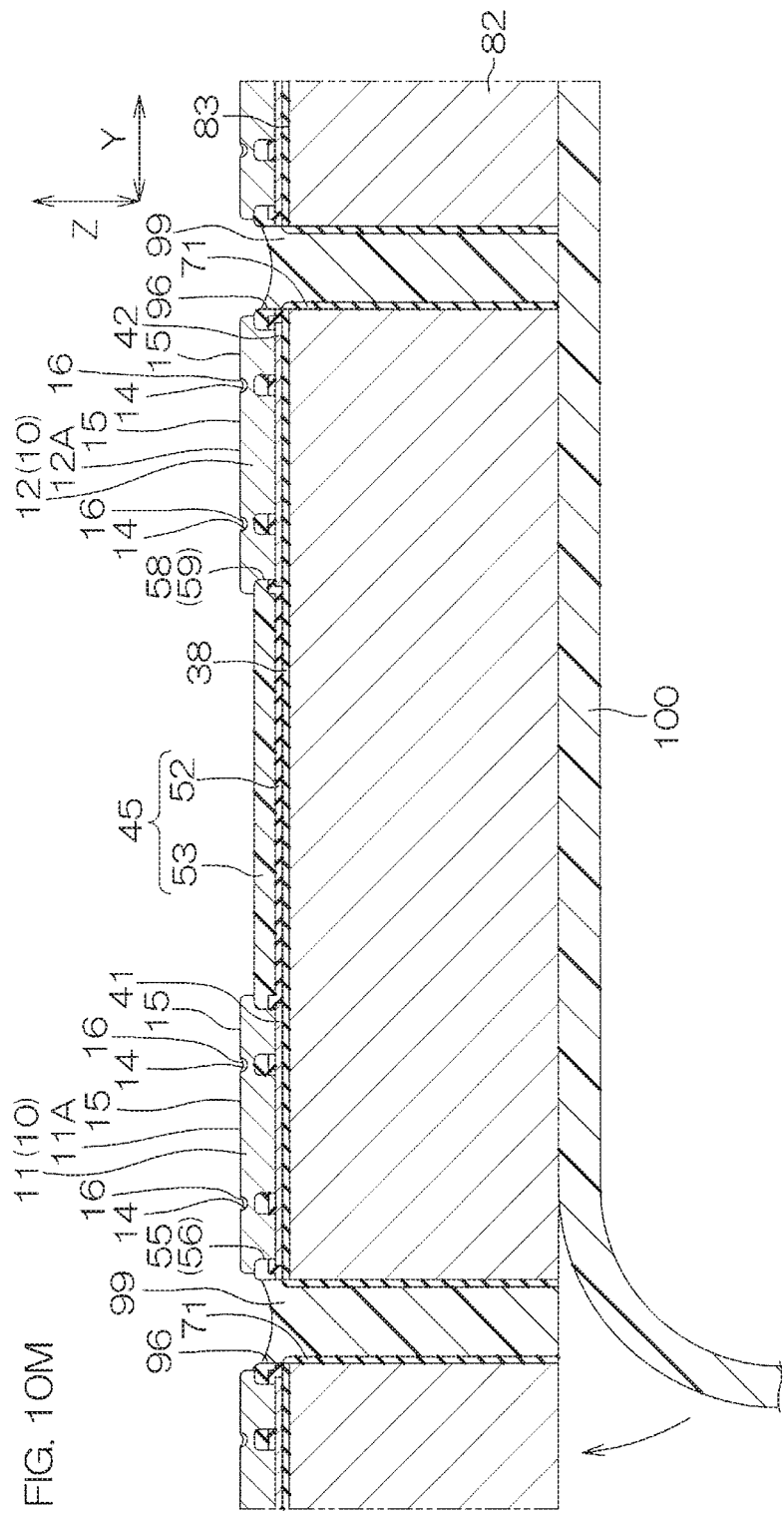

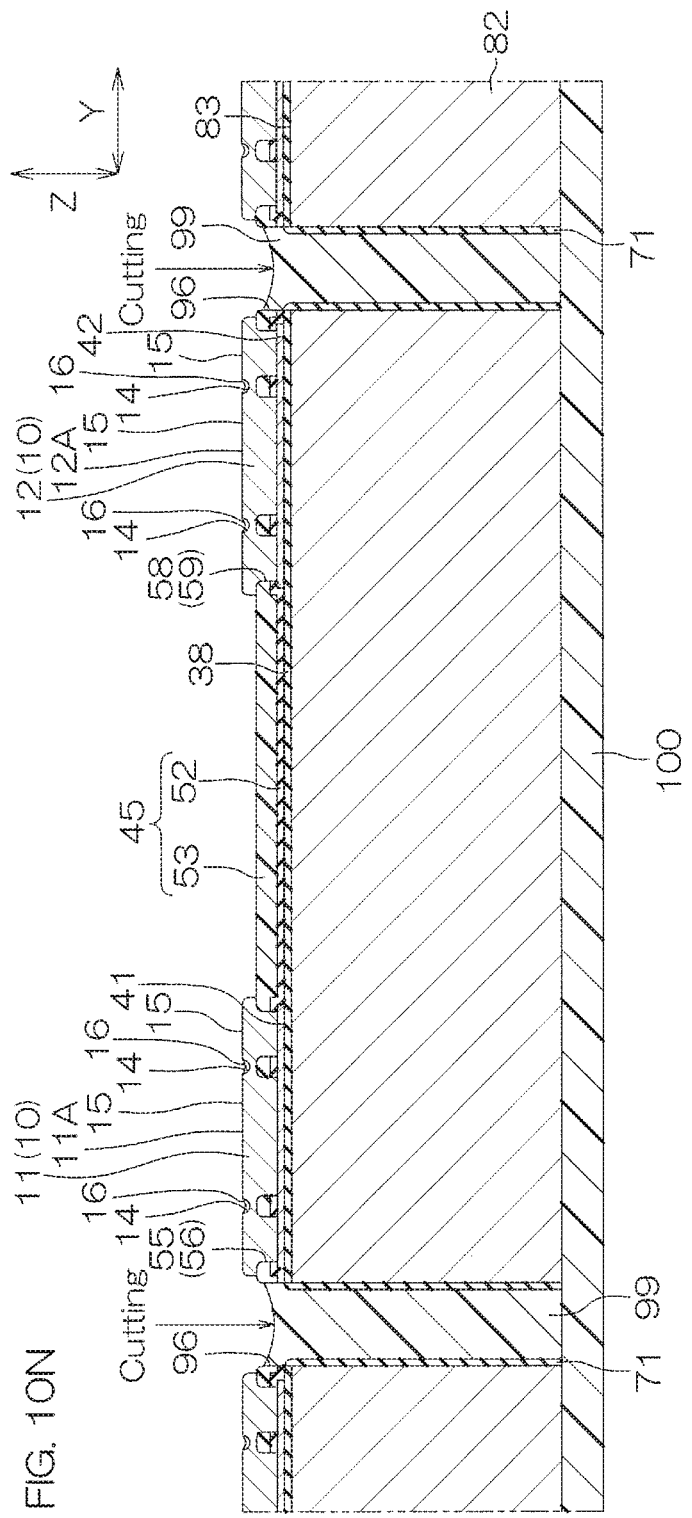

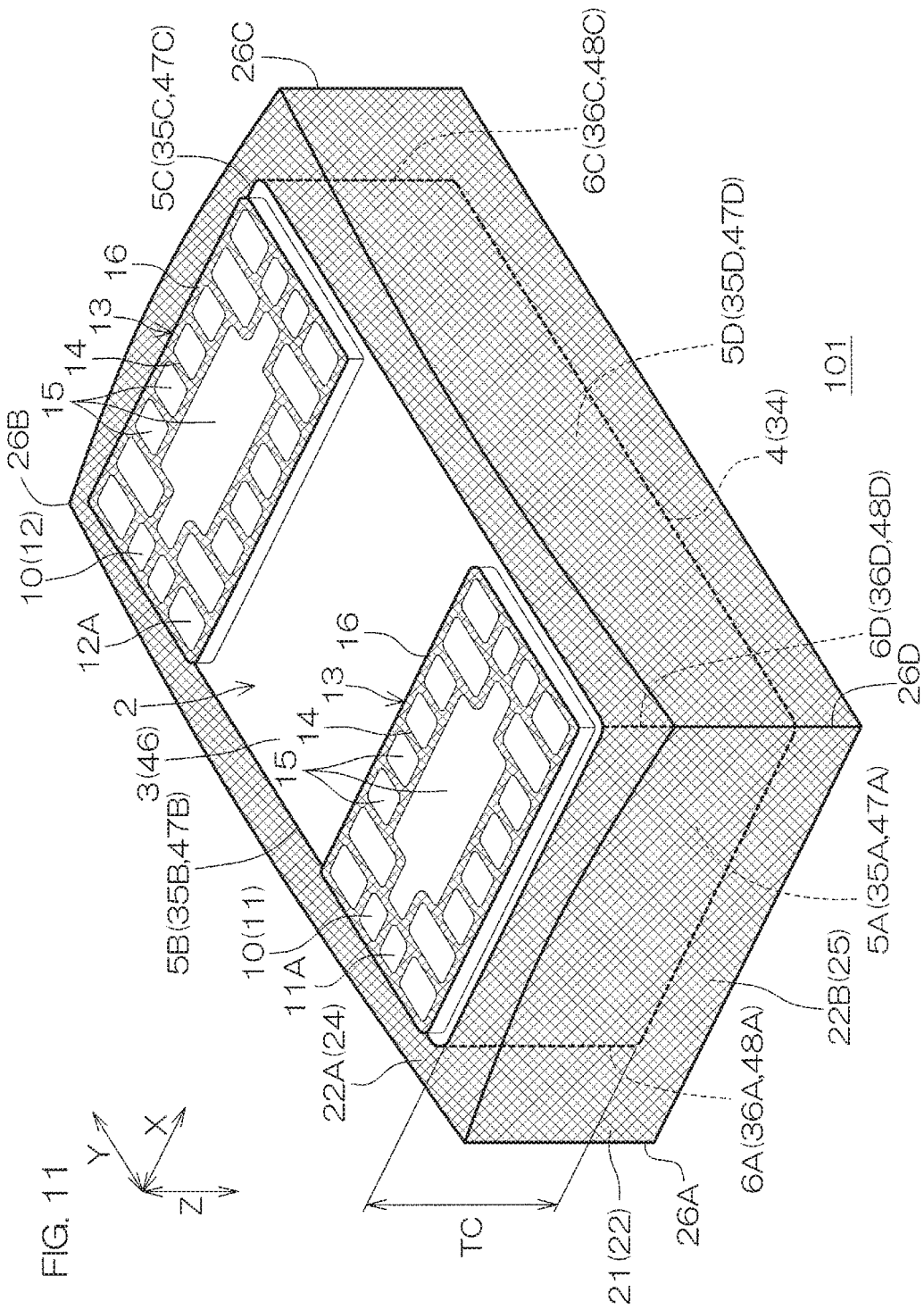

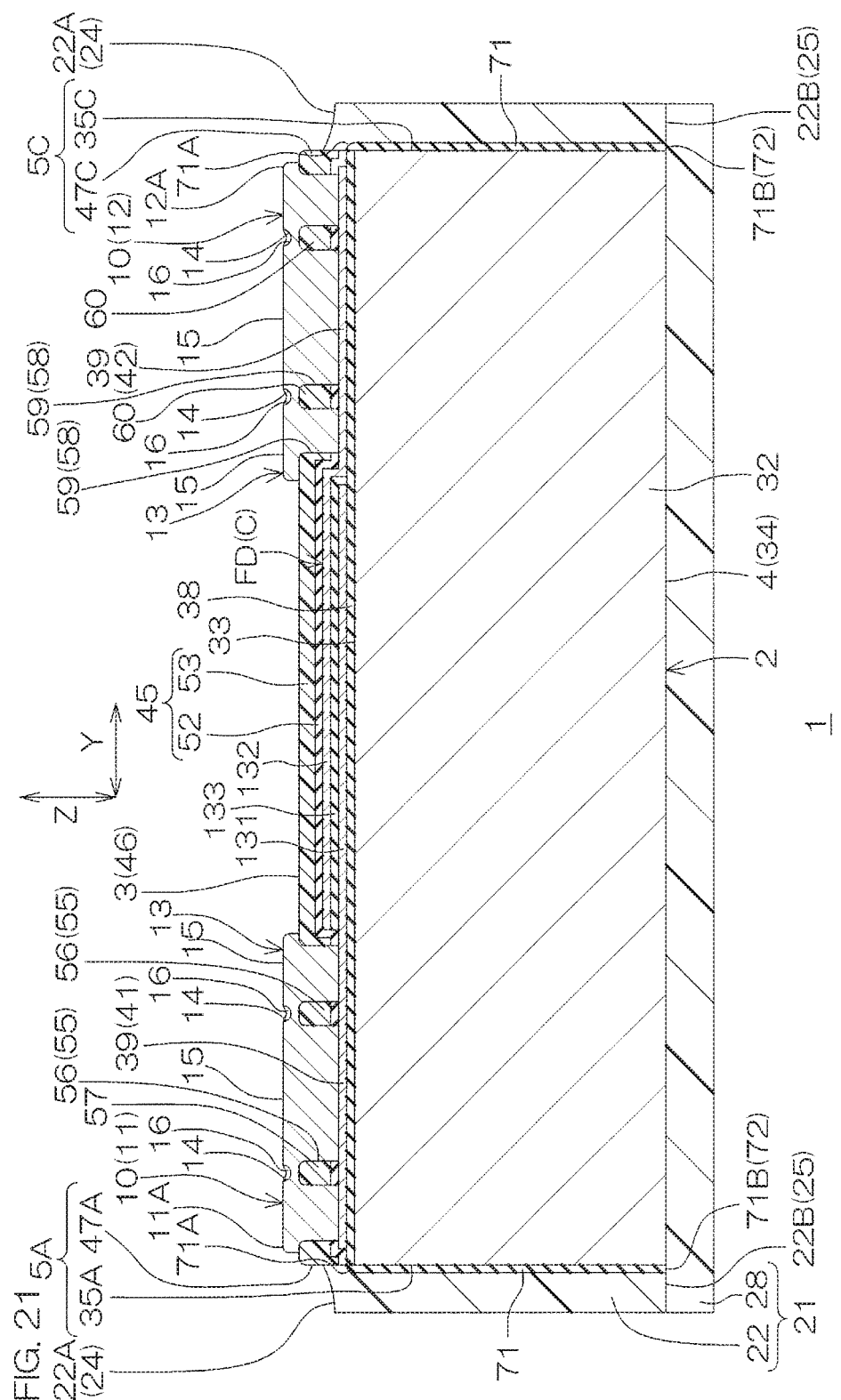

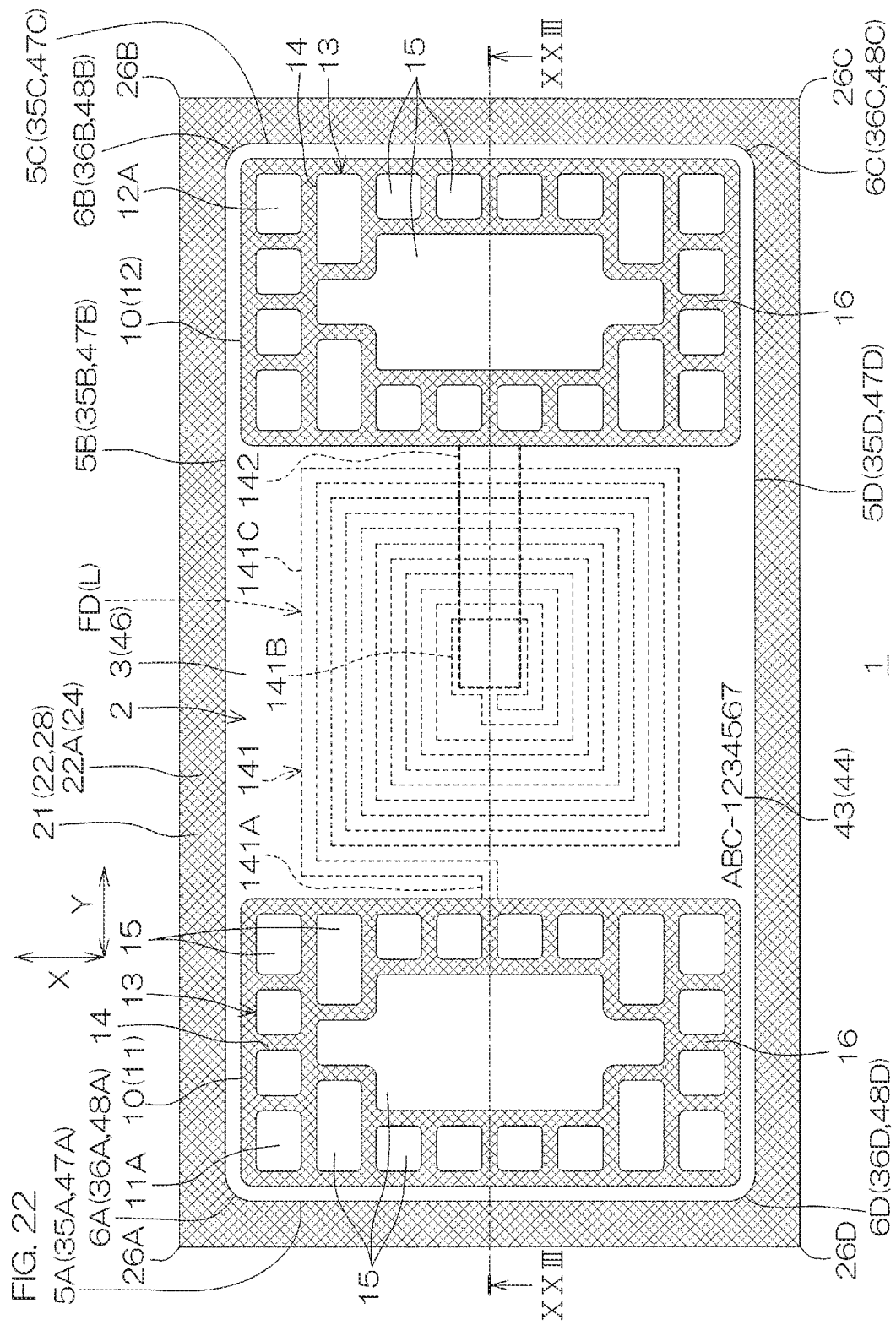

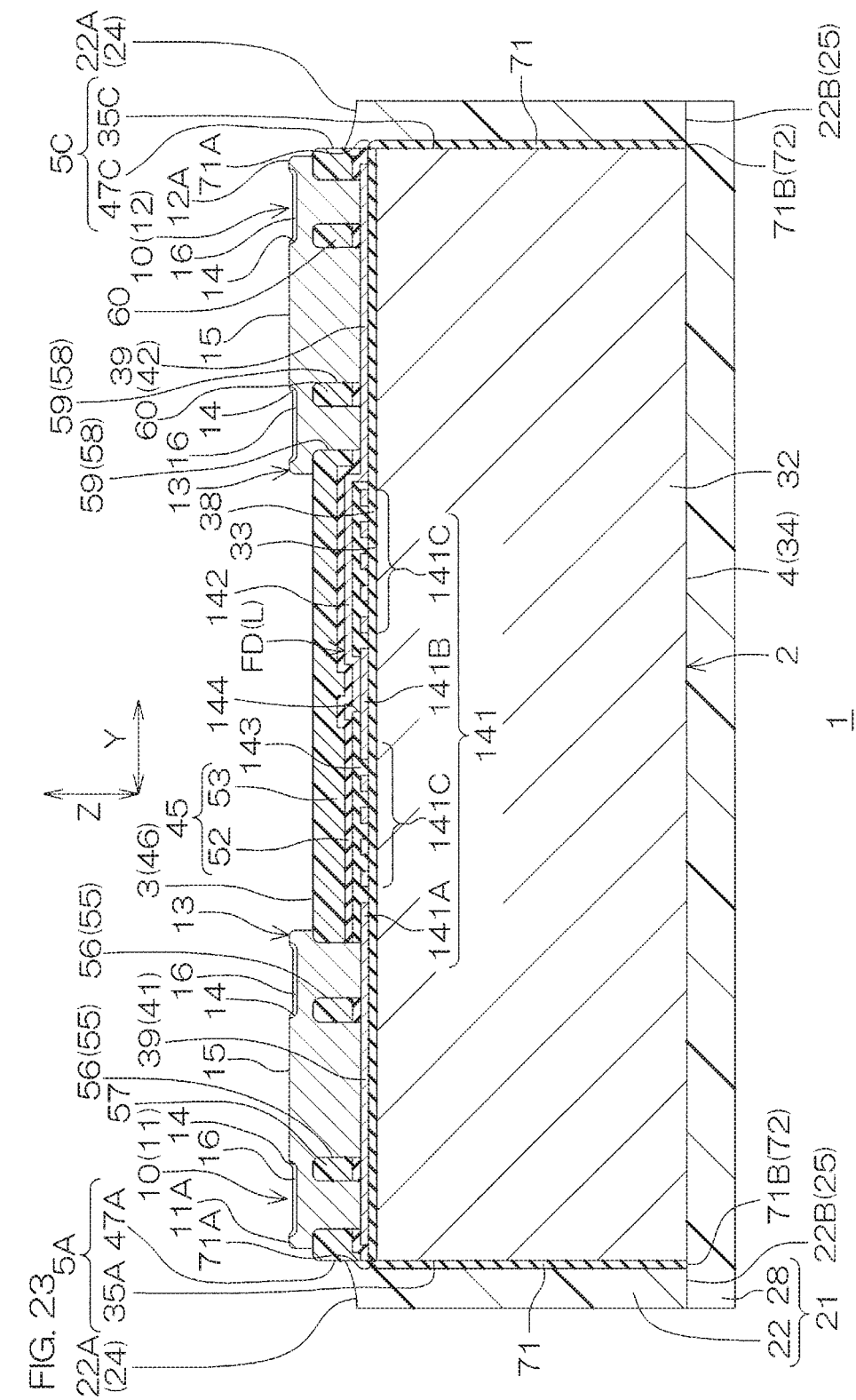

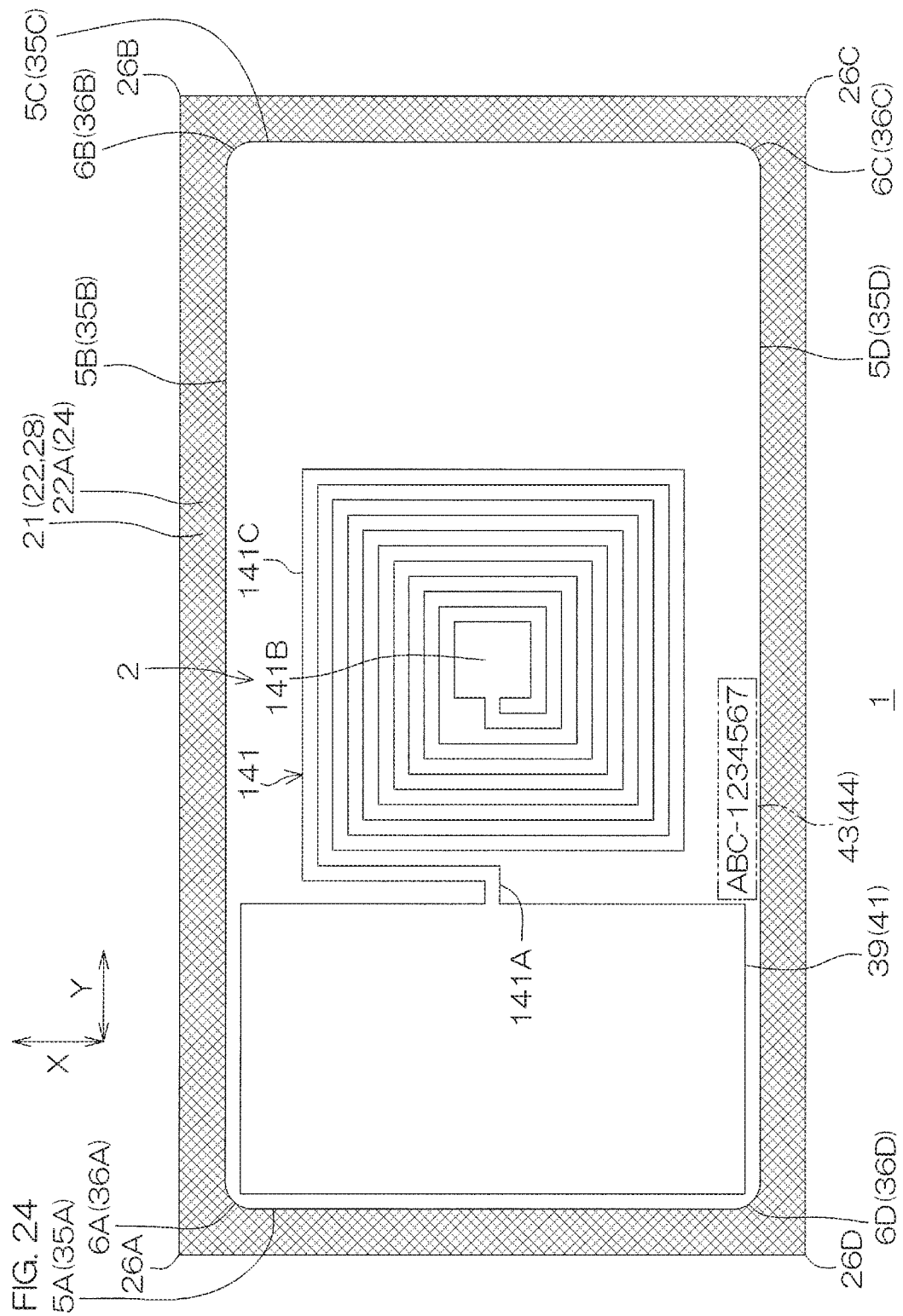

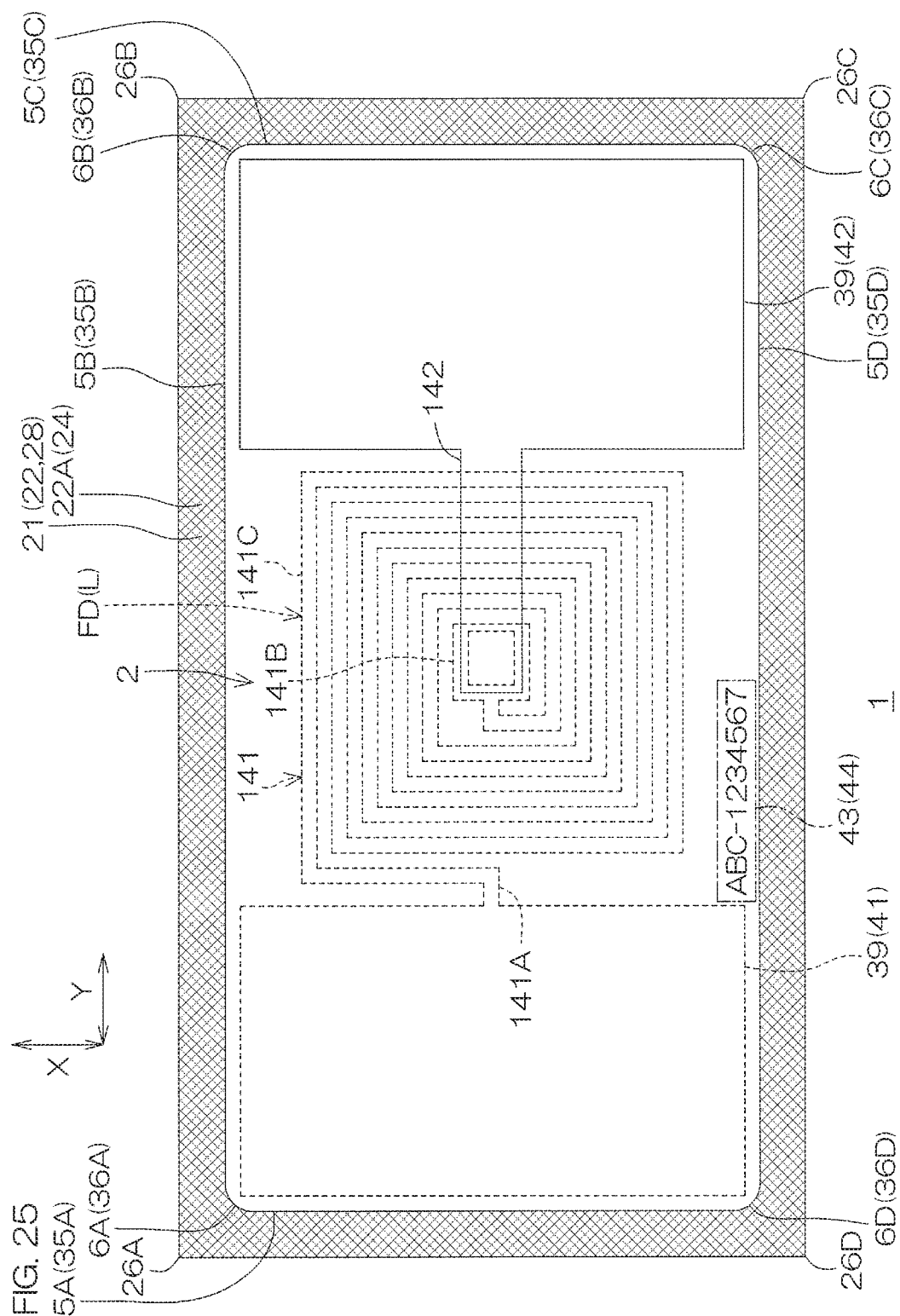

CHIP PART AND MANUFACTURING METHOD THEREOF

CROSS REFERENCE TO RELATED APPLICATIONS

This application claims the benefit of priority to Japanese Patent Application No. 2018-190198 filed on Oct. 5, 2018. The entire contents of these applications are hereby incorporated herein by reference.

BACKGROUND OF THE INVENTION

1. Field of the Invention

The present invention relates to a chip part and manufacturing method thereof.

2. Description of the Related Art

JPH08-115840 discloses a chip inductor as an example of a chip part. The chip inductor includes a substrate made of an inorganic substance. An inductor conductor layer is formed on the substrate. Terminal electrodes are each connected to both end portions of the inductor conductor layer.

SUMMARY OF THE INVENTION

A preferred embodiment of the present invention provides a chip part including a chip main body which has a first main surface at one side, a second main surface at the other side and side surfaces that connect the first main surface and the second main surface and which includes a terminal electrode exposed from the first main surface, and an outer surface resin which exposes the first main surface of the chip main body and covers an outer surface of the chip main body.

A preferred embodiment of the present invention provides a method for manufacturing a chip part including a step of preparing a base substrate which has a first main surface in which a chip forming region is set and a second main surface opposite to the first main surface, a step of forming a terminal electrode on the first main surface in the chip forming region, a step of forming a groove which demarcates the chip forming region in the first main surface, a burial step of burying a base resin layer in the groove so as to expose the chip forming region, a grinding step of grinding the second main surface until the base resin layer is exposed, and a cutting step of cutting the base resin layer so that a portion of the base resin layer which covers an inner wall of the groove remains and cutting out a chip part from the base substrate.

The aforementioned or other objects, features, and effects of the present invention will be clarified by the following description of preferred embodiments given below with reference to the accompanying drawings.

BRIEF DESCRIPTION OF THE DRAWINGS

FIG. 4 is a cross-sectional view which is taken along line IV-IV shown in FIG. 3.

FIG. 5 is a cross-sectional view which is taken along line V-V shown in FIG. 3.

FIG. 6 is an enlarged view of a region VI shown in FIG. 4.

FIG. 7 is an enlarged view of a region VII shown in FIG. 4.

FIG. 8 is a plan view which shows a structure of an insulation layer by removing structures on the insulation layer from FIG. 3.

FIG. 9 is a perspective view which shows a wafer used for manufacturing the chip part shown in FIG. 1.

FIG. 11 is a perspective view which shows a chip part according to a second preferred embodiment of the present invention when viewed at one angle.

FIG. 21 is a cross-sectional view which is taken along line XXI-XXI shown in FIG. 20.

FIG. 22 is a plan view corresponding to FIG. 3 and a plan view for describing a functional device (coil) which is incorporated in the chip part according to a fourth mode example.

FIG. 23 is a cross-sectional view which is taken along line XXIII-XXIII shown in FIG. 22.

FIG. 24 is a plan view for describing a structure of a portion of an internal electrode by removing a structure on a first pad electrode from FIG. 22.

FIG. 25 is a plan view for describing a structure of a portion of the internal electrode by removing a structure on a second pad electrode from FIG. 22.

DETAILED DESCRIPTION OF THE PREFERRED EMBODIMENTS

A chip part is connected to a connection target in a state of what-is-called a bare chip in which a chip main body is exposed outside in order to take advantage of a small electronic component. In such a structure, the chip body cannot be appropriately protected from an external force.

Thus, a preferred embodiment of the present invention provides a chip part capable of appropriately protecting a chip main body while taking advantage of a small electronic component and a manufacturing method thereof.

A preferred embodiment of the present invention provides a chip part including a chip main body which has a first main surface at one side, a second main surface at the other side and side surfaces that connect the first main surface and the second main surface and which includes a terminal electrode exposed from the first main surface, and an outer surface resin which exposes the first main surface of the chip main body and covers an outer surface of the chip main body.

According to the chip part, it is possible to protect the chip main body by the outer surface resin, with a connection portion of the chip main body with respect to a connection target being secured. It is, thereby, possible to provide the chip part which can appropriately protect the chip main body, while taking advantage of a small electronic component.

A preferred embodiment of the present invention provides a method for manufacturing a chip part including a step of preparing a base substrate which has a first main surface in which a chip forming region is set and a second main surface opposite to the first main surface, a step of forming a terminal electrode on the first main surface in the chip forming region, a step of forming a groove which demarcates the chip forming region in the first main surface, a burial step of burying a base resin layer in the groove so as to expose the chip forming region, a grinding step of grinding the second main surface until the base resin layer is exposed, and a cutting step of cutting the base resin layer so that a portion of the base resin layer which covers an inner wall of the groove remains and cutting out a chip part from the base substrate.

According to the method for manufacturing a chip part, it is possible to manufacture the chip part which can protect the chip main body by the outer surface resin, with a connection portion of the chip main body with respect to a connection target being secured. It is, thereby, possible to manufacture and provide the chip part which can appropriately protect the chip main body, while taking advantage of a small electronic component.

Hereinafter, preferred embodiments of the present invention will be described in detail with reference to the attached drawings.

Figure 1:
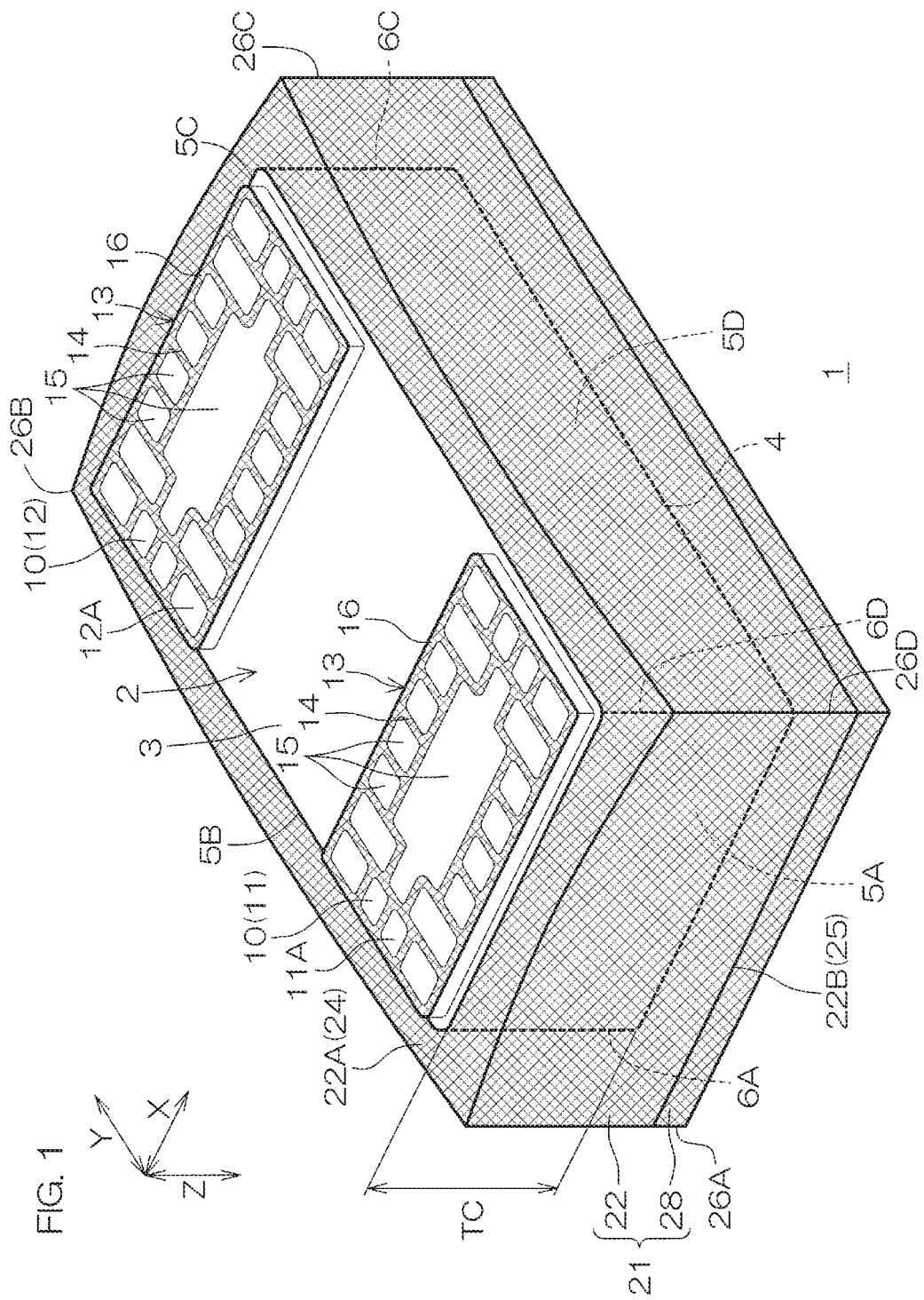
FIG. 1 is a perspective view which shows a chip part according to a first preferred embodiment of the present invention when viewed at one angle.
Figure 2:
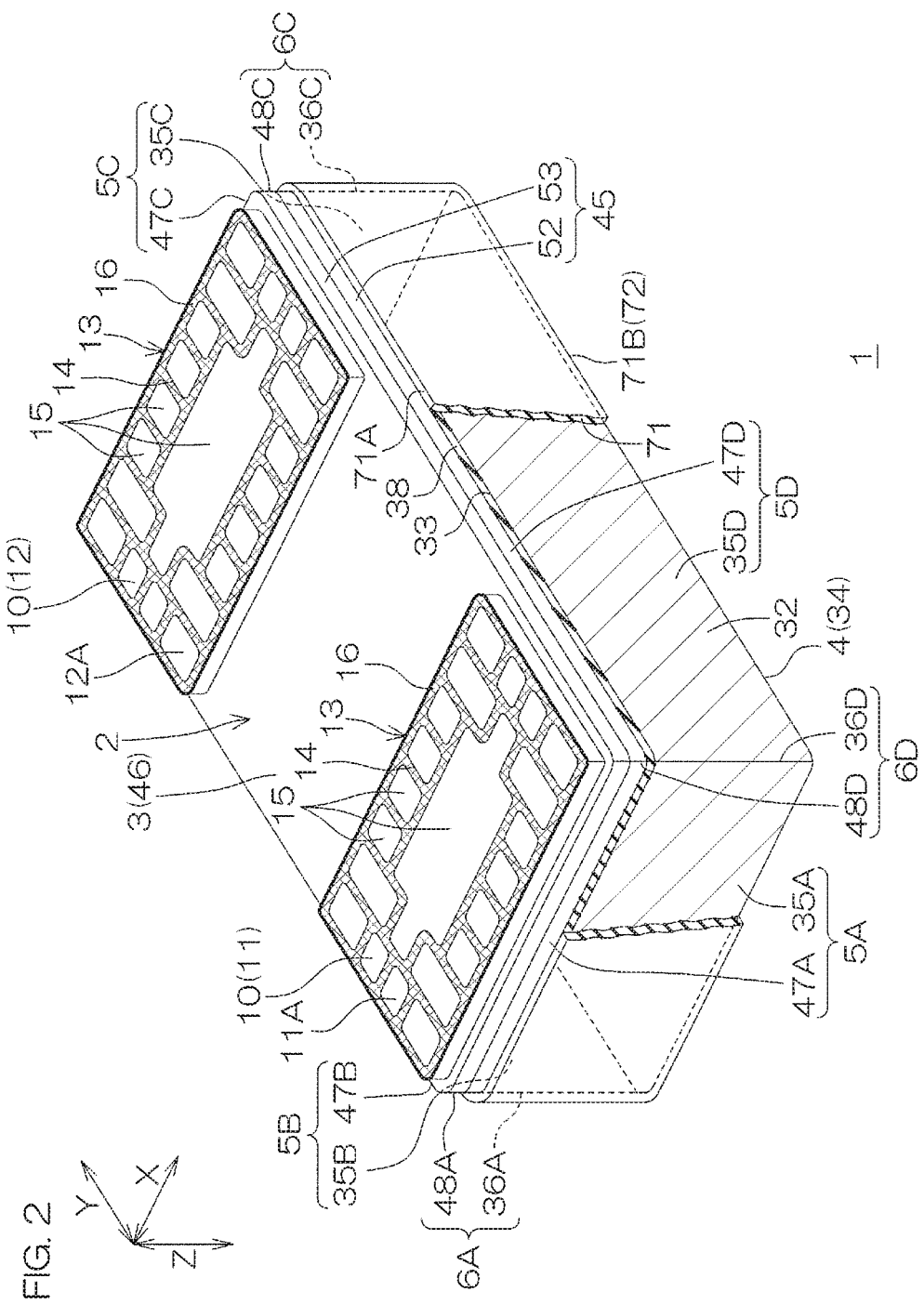
FIG. 2 is a partially notched perspective view which shows a chip main body by removing an outer surface resin from FIG. 1.
Figure 3:
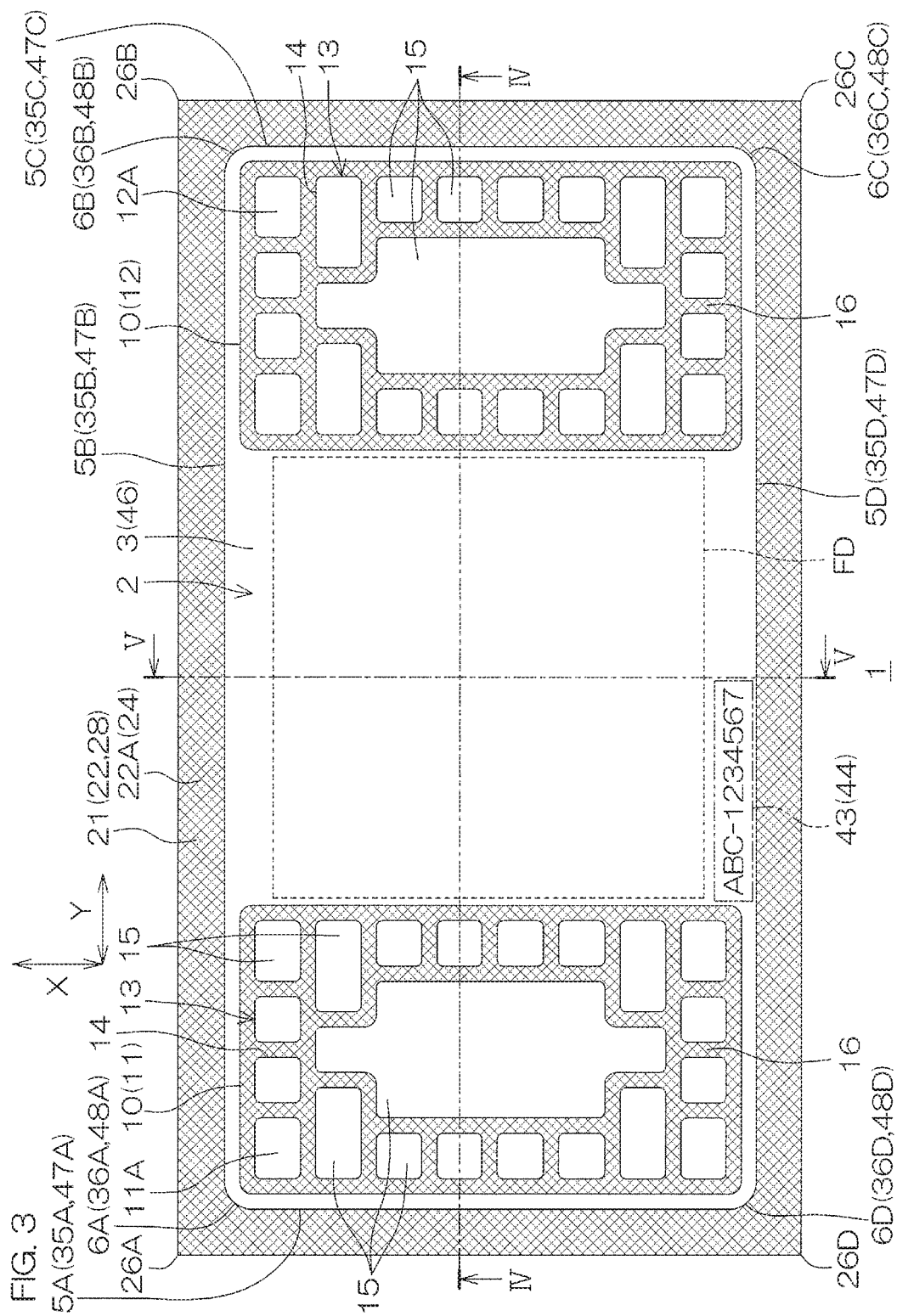
FIG. 3 is a plan view of the chip part shown in FIG. 1.

FIG. 1 is a perspective view which shows a chip part 1 according to a first preferred embodiment of the present invention when viewed at one angle. FIG. 2 is a partially notched perspective view which shows a chip main body 2 by removing an outer surface resin 21 from FIG. 1. FIG. 3 is a plan view of the chip part 1 shown in FIG. 1.

FIG. 4 is a cross-sectional view which is taken along line IV-IV shown in FIG. 3. FIG. 5 is a cross-sectional view which is taken along line V-V shown in FIG. 3. FIG. 6 is an enlarged view of a region VI shown in FIG. 4. FIG. 7 is an enlarged view of a region VII shown in FIG. 4. FIG. 8 is a plan view which shows a structure of an insulation layer 45 by removing structures on the insulation layer 45 from FIG. 3.

The chip part 1 is a small electronic component which is called a 1608 (1.6 mm×0.8 mm) chip, a 1005 (1.0 mm×0.5 mm) chip, a 0603 (0.6 mm×0.3 mm) chip, a 0402 (0.4 mm×0.2 mm) chip, a 03015 (0.3 mm×0.15 mm) chip, etc.

With reference to FIG. 1 and FIG. 2, the chip part 1 includes a chip main body 2 formed in a rectangular parallelepiped shape. The chip main body 2 includes a first chip main surface 3 at one side, a second chip main surface 4 at the other side and chip side surfaces 5A, 5B, 5C, 5D which connect the first chip main surface 3 and the second chip main surface 4.

The first chip main surface 3 and the second chip main surface 4 are formed in a square shape (specifically, in a rectangular shape) in a plan view which is taken from their normal directions Z (hereinafter, simply referred to as "plan view"). The chip side surfaces 5A to 5D extend along the normal directions Z. When being connected to a connection target such as a mounting substrate, the first chip main surface 3 is a connection surface (mounting surface) which faces the connection target. The second chip main surface 4 is a non-connection surface (non-mounting surface) opposite to the connection surface. The second chip main surface 4 is constituted of a grinding surface having a grinding mark.

The chip side surface 5A and the chip side surface 5C extend along a first direction X and face each other in a second direction Y which intersects the first direction X. Specifically, the second direction Y is orthogonal to the first direction X. The chip side surface 5A and the chip side surface 5C form short sides of the chip main body 2. The chip side surface 5B and the chip side surface 5D extend along the second direction Y and face each other in the first direction X. The chip side surface 5B and the chip side surface 5D form long sides of the chip main body 2.

The chip main body 2 includes chip corners 6A, 6B, 6C, 6D which connect the chip side surfaces 5A to 5D. The chip corner 6A connects the chip side surface 5A and the chip side surface 5B. The chip corner 6B connects the chip side surface 5B and the chip side surface 5C. The chip corner 6C connects the chip side surface 5C and the chip side surface 5D. The chip corner 6D connects the chip side surface 5D and the chip side surface 5A.

In this embodiment, the chip corners 6A to 6D are formed (chamfered) in a convex curved shape toward outside the chip main body 2. The chip corners 6A to 6D may be C-chamfered or R-chamfered. As a matter of course, the chip corners 6A to 6D may be angular.

The previously described "0603," "0402," "03015" and others are defined by a length of the long side of the chip main body 2 and a length of the short side thereof. The length of the long side of the chip main body 2 may be 0.1 mm or more and 2 mm or less. The length of the long side of the chip main body 2 may be 0.1 mm or more and 0.2 mm or less, 0.2 mm or more and 0.4 mm or less, 0.4 mm or more and 0.6 mm or less, 0.6 mm or more and 0.8 mm or less, 0.8 mm or more and 1 mm or less, 1 mm or more and 1.2 mm or less, 1.2 mm or more and 1.4 mm or less, 1.4 mm or more and 1.6 mm or less, 1.6 mm or more and 1.8 mm or less, or 1.8 mm or more and 2 mm or less.

The length of the short side of the chip main body 2 may be 0.05 mm or more and 1 mm or less. The length of the long side of the chip main body 2 may be 0.05 mm or more and 0.1 mm or less, 0.1 mm or more and 0.2 mm or less, 0.2 mm or more and 0.3 mm or less, 0.3 mm or more and 0.4 mm or less, 0.4 mm or more and 0.5 mm or less, 0.5 mm or more and 0.6 mm or less, 0.6 mm or more and 0.7 mm or less, 0.7 mm or more and 0.8 mm or less, 0.8 mm or more and 0.9 mm or less, or 0.9 mm or more and 1 mm or less.

A thickness TC of the chip main body 2 may be 50 μm or more and 700 μm or less. The thickness TC may be 50 μm or more and 100 μm or less, 100 μm or more and 150 μm or less, 150 μm or more and 200 μm or less, 200 μm or more and 250 μm or less, 250 μm or more and 300 μm or less, 300 μm or more and 350 μm or less, 350 μm or more and 400 μm or less, 400 μm or more and 450 μm or less, 450 μm or more and 500 μm or less, 500 μm or more and 550 μm or less, 550

μm or more and 600 μm or less, 600 μm or more and 650 μm or less, or 650 μm or more and 700 μm or less. The thickness TC is preferably 50 μm or more and 350 μm or less.

The chip main body 2 includes a functional device FD. The functional device FD is formed by using a first main surface 33 of a substrate 32. The functional device FD may include an active device or a passive device. The functional device FD may include at least any one of a diode D, a resistor R, a capacitor C and a coil L. Here, in FIG. 3, the functional device FD is indicated by a dotted line in a simplified form, with no specific structure of the functional device FD illustrated or described.

The chip main body 2 includes a terminal electrode 10 which is exposed from the first chip main surface 3. In this embodiment, the plurality of terminal electrodes 10 are exposed from the first chip main surface 3. The plurality of terminal electrodes 10 include a first terminal electrode 11 and a second terminal electrode 12. The first terminal electrode 11 and the second terminal electrode 12 are electrically connected to the functional device FD. One of the first terminal electrode 11 and the second terminal electrode 12 supplies a high potential to the functional device FD, and the other of the terminal electrodes supplies a low potential to the functional device FD.

The first terminal electrode 11 is exposed from a region at a side of the chip side surface 5A in the first chip main surface 3. The first terminal electrode 11 is formed in a rectangular shape extending along the first direction X. The second terminal electrode 12 is exposed from the first chip main surface 3 to be spaced from the first terminal electrode 11. The second terminal electrode 12 is exposed from a region at a side of the chip side surface 5C in the first chip main surface 3. The second terminal electrode 12 is formed in a rectangular shape extending along the first direction X.

The first terminal electrode 11 has a first electrode surface 11A which is connected to a connection target. The second terminal electrode 12 has a second electrode surface 12A which is connected to a connection target. Each of the electrode surfaces 11A, 12A extends along the first chip main surface 3. In this embodiment, the first terminal electrode 11 and the second terminal electrode 12 protrude from the first chip main surface 3 to the other side of the second chip main surface 4. Thereby, each of the electrode surfaces 11A, 12A is kept apart from the first chip main surface 3 to the other side of the second chip main surface 4.

Each of the electrode surfaces 11A, 12A includes an uneven structure 13. The uneven structure 13 forms contrast in each of the electrode surfaces 11A, 12A. It is, thereby, possible to make a visual inspection of the chip part 1 by using each of the electrode surfaces 11A, 12A. The visual inspection may include a judgment on whether the chip part 1 is placed face up or face down by using each of the electrode surfaces 11A, 12A.

The uneven structure 13 includes a recess 14 which is recessed toward the second chip main surface 4. The recess 14 of each of the electrode surfaces 11A, 12A may be formed in a lattice shape, a net shape, a line shape or a dot shape. In this embodiment, the recess 14 of each of the electrode surfaces 11A, 12A is formed in a net shape.

In each of the electrode surfaces 11A, 12A, the recess 14 demarcates a plurality of protrusion regions 15 as a region outside the recess 14. The plurality of protrusion regions 15 are respectively formed at a central portion of each of the electrode surfaces 11A, 12A and at a peripheral edge portion thereof. It is preferable that each of the protrusion regions 15 has a flat outer surface extending in parallel to the first chip main surface 3.

A planar shape of each of the protrusion regions 15 is not restricted to a specific shape. Each of the protrusion regions 15 may be demarcated in a polygonal shape such as a triangular shape, a square shape, a pentagonal shape and a hexagonal shape in plan view. Each of the protrusion regions 15 may also be demarcated in a circular shape or an elliptical shape.

In a case in which the recess 14 is formed in a line-shape, extending in an arbitrary direction, each of the protrusion regions 15 may be demarcated in a line shape, extending in the arbitrary direction. In this case, each of the protrusion regions 15 may be demarcated in a stripe shape in plan view. In a case in which the recess 14 is formed in a dot shape, an entire region outside the recess 14 is formed as the protrusion region 15 in each of the electrode surfaces 11A, 12A. The recess 14 may be formed in a dot shape along a peripheral edge of each of the electrode surfaces 11A, 12A to be spaced from each other such as to surround a central portion of each of the electrode surfaces 11A, 12A.

It is preferable that a protrusion region 15 having a relatively large plane area is formed in each of the electrode surfaces 11A, 12A. The protrusion region 15 having a relatively large plane area is formed as a contact portion with which a leading end of a probe is brought into contact when an electrical test is performed. The protrusion region 15 having a relatively large plane area is able to make an appropriate contact with the probe.

In this embodiment, the protrusion region 15 having a relatively large plane area is formed at the central portion of each of the electrode surfaces 11A, 12A. The protrusion region 15 at the central portion has a plane area that exceeds a plane area of the protrusion region 15 at a peripheral edge portion. The protrusion region 15 having a relatively large plane area may be formed at a peripheral edge portion of each of the electrode surfaces 11A, 12A in place of the central portion.

In this embodiment, the chip main body 2 includes a buried substance 16 which is buried in the recess 14. The buried substance 16 is buried in the recess 14 so that regions outside the recess 14 (a plurality of protrusion regions 15) are exposed in each of the electrode surfaces 11A, 12A. In FIG. 1 to FIG. 3, the buried substance 16 is indicated by hatching for clarification. An outer surface of the buried substance 16 may be recessed toward the second chip main surface 4 inside the recess 14.

The buried substance 16 is different in color from each of the electrode surfaces 11A, 12A. The buried substance 16 enhances contrast between the plurality of protrusion regions 15 and the recess 14. It is, thereby, possible to make a visual inspection smoothly by using the electrode surfaces 11A, 12A.

The buried substance 16 may be colored differently from each of the electrode surfaces 11A, 12A. The buried substance 16 may use an original color of a material. The buried substance 16 is preferably darker in shade than each of the electrode surfaces 11A, 12A.

The buried substance 16 may include an electrical conductor or an insulator. The buried substance 16 includes preferably an insulator. The buried substance 16 may also include a resin as an example of the insulator. The buried substance 16 may include an opaque resin as an example of the insulator. The buried substance 16 may include a photosensitive resin or a thermosetting resin as an example of the insulator. In this embodiment, the buried substance 16 is constituted of a resin (specifically, a thermosetting resin). The buried substance 16 may include an epoxy resin or a phenol resin as an example of the thermosetting resin. The buried substance 16 may include carbon black and be colored in black.

With reference to FIG. 1 to FIG. 8, the chip part 1 includes an outer surface resin 21 which covers the chip main body 2. In FIG. 1 to FIG. 3 and FIG. 8, the outer surface resin 21 is indicated by hatching for clarification. The outer surface resin 21 exposes the first chip main surface 3 of the chip main body 2 and covers an outer surface of the chip main body 2.

The outer surface resin 21 is formed in a film shape following an outer surface of the chip main body 2. The film-shape outer surface resin 21 prevents the chip part 1 from being increased in size, while protecting the chip main body 2. The outer surface resin 21 exposes the first terminal electrode 11 and the second terminal electrode 12 from the first chip main surface 3. The outer surface resin 21 is formed to be spaced from the first terminal electrode 11 and the second terminal electrode 12.

The outer surface resin 21 includes a side surface covering portion 22. The side surface covering portion 22 covers the chip side surfaces 5A to 5D of the chip main body 2. The side surface covering portion 22 passes through the chip corners 6A to 6D to collectively cover the chip side surfaces 5A to 5D. Thereby, the side surface covering portion 22 is formed in an annular shape (specifically, in an endless shape) surrounding the first chip main surface 3 in plan view.

The side surface covering portion 22 is formed in a film shape following the chip side surfaces 5A to 5D. The side surface covering portion 22 has a flat outer surface. The outer surface of the side surface covering portion 22 extends in parallel to the chip side surfaces 5A to 5D. In this embodiment, the outer surface of the side surface covering portion 22 is a ground surface having a ground mark.

The side surface covering portion 22 has a first end portion 22A at a side of the first chip main surface 3 and a second end portion 22B at a side of the second chip main surface 4. The first end portion 22A is positioned at a region at the side of the second chip main surface 4 with respect to each of the electrode surfaces 11A, 12A. In this embodiment, the first end portion 22A is positioned at a region at the side of the second chip main surface 4 with respect to the first chip main surface 3.

The first end portion 22A has an inclined surface 24 which is inclined with respect to the first chip main surface 3. Specifically, the inclined surface 24 is downwardly inclined to the outside from the chip main body 2. In this embodiment, the inclined surface 24 is inclined in a concave curved shape toward the second chip main surface 4 from the first chip main surface 3.

The first end portion 22A may bulge, sink or meander in a side view which is taken from the normal directions of the chip side surfaces 5A to 5D (hereinafter, simply referred to as "side view"). The first end portion 22A may include a bulged portion which bulges from the second chip main surface 4 to the first chip main surface 3 in side view. The first end portion 22A may include a sunk portion which sinks from the first chip main surface 3 to the second chip main surface 4 in side view. The first end portion 22A may include the bulged portion and the sunk portion in a side view.

The second end portion 22B continues to the second chip main surface 4. Specifically, the second end portion 22B has an end surface 25 which is formed such as to be flush with the second chip main surface 4. In this embodiment, the end surface 25 of the second end portion 22B is a grinding surface having a grinding mark. The grinding mark of the end surface 25 may continue to the grinding mark of the second chip main surface 4.

A thickness TS of the side surface covering portion 22 may be 10 µm or more and 100 µm or less. The thickness TS is a thickness along the normal directions of the chip side surfaces 5A to 5D in the side surface covering portion 22. The thickness TS may be 10 µm or more and 20 µm or less, 20 µm or more and 30 µm or less, 30 µm or more and 40 µm or less, 40 µm or more and 50 µm or less, 50 µm or more and 60 µm or less, 60 µm or more and 70 µm or less, 70 µm or more and 80 µm or less, 80 µm or more and 90 µm or less or 90 µm or more and 100 µm or less. The thickness TS is preferably 20 µm or more and 50 µm or less.

The outer surface resin 21 includes resin corners 26A, 26B, 26C, 26D. The resin corners 26A to 26D cover the chip corners 6A to 6D of the chip main body 2. The resin corners 26A to 26D are the respective portions at which the side surface covering portion 22 continues with the chip corners 6A to 6D. The resin corners 26A to 26D are angular, which is different from the chip corners 6A to 6D. The resin corners 26A to 26D are not chamfered. As a matter of course, the resin corners 26A to 26D may be C-chamfered or R-chamfered.

Portions of the first end portion 22A which form the resin corners 26A to 26D may sink toward the side of the second chip main surface 4 to a greater extent than a portion of the first end portion 22A which forms a region other than the resin corners 26A to 26D.

The outer surface resin 21 includes a main surface covering portion 28. The main surface covering portion 28 covers the second chip main surface 4 of the chip main body 2. Specifically, the main surface covering portion 28 buries the grinding mark and covers an entire region of the second chip main surface 4.

The main surface covering portion 28 is formed in a film shape following the second chip main surface 4. The main surface covering portion 28 has a flat main surface extending along the second chip main surface 4. The main surface of the main surface covering portion 28 extends in parallel to the second chip main surface 4. In this embodiment, the main surface of the main surface covering portion 28 is constituted of a smooth surface and has a mode different from that of the side surface covering portion 22 which is constituted of the grinding surface.

The main surface covering portion 28 covers the second end portion 22B of the side surface covering portion 22 in a region other than the second chip main surface 4. Specifically, the main surface covering portion 28 buries the grinding mark and covers the end surface 25 of the second end portion 22B. The main surface covering portion 28 is integrated with the side surface covering portion 22. A peripheral end surface of the main surface covering portion 28 continues to the outer surface of the side surface covering portion 22. The peripheral end surface of the main surface covering portion 28 forms a grinding surface together with the outer surface of the side surface covering portion 22.

The main surface covering portion 28 may be integrated with the side surface covering portion 22 in a mode that a boundary with the side surface covering portion 22 disappears. The main surface covering portion 28 may be integrated with the side surface covering portion 22 in a mode that a boundary with the side surface covering portion 22 can be visually recognized on a cut surface.

A thickness TM of the main surface covering portion 28 may be 10 µm or more and 100 µm or less. The thickness TM is a thickness along a normal direction of the second chip main surface 4 in the main surface covering portion 28. The thickness TM may be 10 µm or more and 20 µm or less, 20 µm or more and 30 µm or less, 30 µm or more and 40 µm or less, 40 µm or more and 50 µm or less, 50 µm or more and 60 µm or less, 60 µm or more and 70 µm or less, 70 µm or more and 80 µm or less, 80 µm or more and 90 µm or less, or 90 µm or more and 100 µm or less. The thickness TM is preferably 20 µm or more and 50 µm or less.

The thickness TM of the main surface covering portion 28 may be equal to or different from the thickness TS of the side surface covering portion 22. The thickness TM may exceed the thickness TS. The thickness TM may be less than the thickness TS.

As described above, the chip main body 2 is housed in a resin case in a closed-end square tubular shape which is demarcated by the outer surface resin 21. The resin case includes a main surface covering portion 28 which forms a bottom wall and a side surface covering portion 22 which demarcates an opening and forms side walls. The chip main body 2 is housed in the resin case in such a posture that the second chip main surface 4 faces the bottom wall.

The outer surface resin 21 may include an opaque resin. The outer surface resin 21 may include a thermosetting resin. The outer surface resin 21 may include an epoxy resin or a phenol resin as an example of the thermosetting resin. The outer surface resin 21 (thermosetting resin) may include carbon black and be colored in black. In a case in which the buried substance 16 is constituted of a resin material, the outer surface resin 21 may include the same resin material as that of the buried substance 16. The main surface covering portion 28 may include the same resin material as that of the side surface covering portion 22 or may include a resin material different from each other. A resin filler of the main surface covering portion 28 may be different in particle diameter from a resin filler of the side surface covering portion 22.

With reference to FIG. 2, the chip main body 2 includes a substrate 32. Specifically, the substrate 32 includes a first main surface 33 at one side, a second main surface 34 at the other side, and side surfaces 35A, 35B, 35C, 35D which connect the first main surface 33 and the second main surface 34. The first main surface 33 and the second main surface 34 are formed in a square shape (in this embodiment, a rectangular shape) in plan view. The side surfaces 35A to 35D extend in a normal direction Z.

The first main surface 33 of the substrate 32 is a device forming surface in which the functional device FD is formed. The functional device FD is formed on a surface layer portion of the first main surface 33 and/or on the first main surface 33. The second main surface 34 forms the second chip main surface 4 of the chip main body 2. That is, the second main surface 34 of the substrate 32 is constituted of a grinding surface having a grinding mark.

The side surfaces 35A to 35D form the respective portions of the chip side surfaces 5A to 5D of the chip main body 2. The substrate 32 includes corners 36A, 36B, 36C, 36D which connect the side surfaces 35A to 35D. The corners 36A to 36D form the respective portions of the chip corners 6A to 6D of the chip main body 2.

A thickness Tsub of the substrate 32 may be 10 µm or more and 650 µm or less. The thickness Tsub may be 10 µm or more and 50 µm or less, 50 µm or more and 100 µm or less, 100 µm or more and 150 µm or less, 150 µm or more and 200 µm or less, 200 µm or more and 250 µm or less, 250 µm or more and 300 µm or less, 300 µm or more and 350 µm or less, 350 µm or more and 400 µm or less, 400 µm or more and 450 µm or less, 450 µm or more and 500 µm or less, 500 µm or more and 550 µm or less, 550 µm or more and 600 µm or less, or 600 µm or more and 650 µm or less. The thickness Tsub is preferably 30 µm or more and 500 µm or less.

The chip main body 2 includes a main surface insulation layer 38 which covers the first main surface 33 of the substrate 32. A peripheral edge portion of the main surface insulation layer 38 continues to the side surfaces 35A to 35D of the substrate 32. The peripheral edge portion of the main surface insulation layer 38 forms portions of the chip side surfaces 5A to 5D of the chip main body 2.

The main surface insulation layer 38 may have a single layer structure including a silicon oxide layer or a silicon nitride layer. The main surface insulation layer 38 may have a stacked-layer structure including a silicon oxide layer and a silicon nitride layer stacked in an arbitrary order. In this embodiment, the main surface insulation layer 38 has a single layer structure made of a silicon oxide layer.

The chip main body 2 includes an internal electrode 39 which is formed on the main surface insulation layer 38. The internal electrode 39 includes a first pad electrode 41 and a second pad electrode 42. The first pad electrode 41 and the second pad electrode 42 are electrically connected to the functional device FD.

The first pad electrode 41 is positioned at a region at the side of the chip side surface 5A. The first pad electrode 41 is formed in a rectangular shape extending along the first direction X. The second pad electrode 42 is formed at a region at the side of the chip side surface 5C to be spaced from the first pad electrode 41. The second pad electrode 42 is formed in a rectangular shape extending along the first direction X.

The first pad electrode 41 may include at least any one of aluminum, copper, aluminum alloy and copper alloy. The first pad electrode 41 may include at least any one of AlSiCu (aluminum silicon copper) alloy, AlSi (aluminum silicon) alloy and AlCu (aluminum copper) alloy.

The second pad electrode 42 may include at least any one of aluminum, copper, aluminum alloy and copper alloy. The second pad electrode 42 may include at least any one of AlSiCu alloy, AlSi alloy and AlCu alloy. The second pad electrode 42 may include the same electroconductive material as that of the first pad electrode 41 or may include a different electroconductive material. In this embodiment, the second pad electrode 42 is constituted of the same electroconductive material as that of the first pad electrode 41.

The chip main body 2 includes a marker 43 which is formed on the main surface insulation layer 38. The marker 43 is formed at an arbitrary region on the main surface insulation layer 38. The marker 43 is preferably formed to be spaced from the functional device FD in plan view. The marker 43 is preferably formed at a region which does not overlap with the functional device FD in plan view. In this embodiment, the marker 43 is formed at a region along the side surface 35D of the substrate 32 in plan view.

In FIG. 3 and FIG. 8, for the sake of convenience, there is shown the marker 43 which includes characters and symbols of "ABC-1234567". However, in reality, the marker 43 indicates a logo, a picture, a character, a symbol or information on specifications of the chip part 1 or various types of information of their combinations. The information on the specifications of the chip part 1 may include a model number, a size, a shape, a manufacture date, a rated voltage, a rated current, etc., of the chip part 1. The marker 43 enhances the convenience of the chip part 1. The marker 43 may be or may not be provided, and a chip part 1 without the marker 43 may be adopted.

In this embodiment, the marker 43 includes a marker conductor layer 44. The marker conductor layer 44 may include at least any one of aluminum, copper, aluminum alloy and copper alloy. The marker conductor layer 44 may include at least any one of AlSiCu alloy, AlSi alloy and AlCu alloy. The marker conductor layer 44 may include the same electroconductive material as that of the first pad electrode 41 and/or that of the second pad electrode 42.

The chip main body 2 includes an insulation layer 45 formed on the main surface insulation layer 38. In FIG. 8, the insulation layer 45 is indicated by hatching. The insulation layer 45 covers the internal electrode 39 and the marker 43. The insulation layer 45 includes an insulation main surface 46 and insulation side surfaces 47A, 47B, 47C, 47D. The insulation main surface 46 forms the first main surface 33 of the chip main body 2. The insulation side surfaces 47A to 47D form the respective portions of the chip side surfaces 5A to 5D of the chip main body 2.

The insulation main surface 46 includes insulation corners 48A, 48B, 48C, 48D which connect the insulation side surfaces 47A to 47D. The insulation corners 48A to 48D form the respective portions of the chip corners 6A to 6D of the chip main body 2. The insulation side surfaces 47A to 47D may continue to the side surfaces 35A to 35D of the substrate 32. The insulation side surfaces 47A to 47D may be formed at an inner region of the substrate 32 to be spaced from the side surfaces 35A to 35D of the substrate 32. In this case, the first main surface 33 (main surface insulation layer 38) of the substrate 32 may be exposed from spaces between the side surfaces 35A to 35D and the insulation side surfaces 47A to 47D.

The insulation layer 45 is formed with a material which allows light to pass through so that the marker 43 can be visually recognized. The insulation layer 45 includes a transparent insulation material or a translucent insulation material. In this embodiment, the insulation layer 45 has a stacked-layer structure including a passivation layer 52 and a resin layer 53.

The passivation layer 52 may have a single layer structure including a silicon oxide layer or a silicon nitride layer. The passivation layer 52 may have a stacked-layer structure including a silicon oxide layer and a silicon nitride layer stacked in an arbitrary order. In this embodiment, the passivation layer 52 has a single layer structure made of a silicon nitride layer.

The resin layer 53 includes a resin material different from the outer surface resin 21. The resin layer 53 may include a negative type or a positive type photosensitive resin. In this embodiment, the resin layer 53 includes a polyimide as an example of the negative type photosensitive resin. The resin layer 53 may include polybenzoxazole as an example of the positive type photosensitive resin.

With reference to FIG. 6 to FIG. 8, the insulation layer 45 includes a first pad opening 54. The first pad opening 54 exposes the first pad electrode 41. In this embodiment, the first pad opening 54 includes a plurality of first sub pad openings 55.

Specifically, the insulation layer 45 includes a first covering portion 57 which is formed in a lattice shape, a net shape, a line shape or a dot shape and covers the first pad electrode 41. In this embodiment, the first covering portion 57 is formed in a net shape. The first covering portion 57 demarcates the plurality of first sub pad openings 55. A planar shape of the first covering portion 57 is adjusted depending on a planar shape of the protrusion region 15 to be formed. Among the plurality of first sub pad openings 55, one first sub pad opening 55 which exposes a central portion of the first pad electrode 41 is larger in opening area than that of other first sub pad openings 55 which expose a peripheral edge portion of the first pad electrode 41.

With reference to FIG. 6 to FIG. 8, the insulation layer 45 includes a second pad opening 58. The second pad opening 58 is formed to be spaced from the first pad opening 54, and exposes the second pad electrode 42. In this embodiment, the second pad opening 58 includes a plurality of second sub pad openings 59.

Specifically, the insulation layer 45 includes a second covering portion 60 which is formed in a lattice shape, a net shape, a line shape or a dot shape and covers the second pad electrode 42. In this embodiment, the second covering portion 60 is formed in a net shape. The second covering portion 60 demarcates the plurality of second sub pad openings 59. A planar shape of the second covering portion 60 is adjusted depending on a planar shape of the protrusion region 15 to be formed. Among the plurality of second sub pad openings 59, one second sub pad opening 59 which exposes a central portion of the second pad electrode 42 is larger in opening area than that of other second sub pad openings 59 which expose a peripheral edge portion of the second pad electrode 42.

With reference to FIG. 6, the previously described first terminal electrode 11 is buried into the first pad opening 54. Specifically, the first terminal electrode 11 reburies the plurality of first sub pad openings 55 and is integrated on the insulation layer 45 (first chip main surface 3). Thereby, the first electrode surface 11A of the first terminal electrode 11 is formed.

The recess 14 and the plurality of protrusion regions 15 in the first electrode surface 11A are formed, arising from the first covering portion 57 of the insulation layer 45. The recess 14 of the first electrode surface 11A is formed at a region which faces the first covering portion 57 of the insulation layer 45 in the first electrode surface 11A. The plurality of protrusion regions 15 in the first electrode surface 11A are respectively formed on the plurality of first sub pad openings 55. Each of the protrusion regions 15 has a plane area corresponding to an opening area of each of the first sub pad openings 55.

The first terminal electrode 11 is electrically connected to the first pad electrode 41 inside the first pad opening 54 (the plurality of first sub pad openings 55). Thereby, an electrical signal input into the first terminal electrode 11 is transmitted to the functional device FD via the first pad electrode 41.

In this embodiment, the first terminal electrode 11 has a stacked-layer structure including a plurality of electrode layers. In this embodiment, the first terminal electrode 11 has a stacked-layer structure including a first Ni (nickel) layer 61, a first Pd (palladium) layer 62 and a first Au (gold) layer 63 stacked in this order from the side of the chip main body 2.

The first Ni layer 61 reburies the plurality of first sub pad openings 55 and is integrated on the insulation layer 45 (the insulation main surface 46, the first chip main surface 3). The first Pd layer 62 covers an outer surface of the first Ni layer 61. The first Pd layer 62 is formed in a film shape following the outer surface of the first Ni layer 61. The first Pd layer 62 is in contact with the insulation layer 45 at a peripheral edge portion of the first Ni layer 61.

The first Au layer 63 covers an outer surface of the first Pd layer 62. The first Au layer 63 is formed in a film shape following the outer surface of the first Pd layer 62. The first Au layer 63 is in contact with the insulation layer 45 at a peripheral edge portion of the first Pd layer 62. The first Au layer 63 forms the first electrode surface 11A of the first terminal electrode 11. The recess 14 of the first electrode surface 11A is formed by recesses of the first Ni layer 61, the first Pd layer 62 and the first Au layer 63.

With reference to FIG. 7, the previously described second terminal electrode 12 is buried into the second pad opening 58. Specifically, the second terminal electrode 12 reburies the plurality of second sub pad openings 59 and is integrated on the insulation layer 45 (the first chip main surface 3). Thereby, the second electrode surface 12A of the second terminal electrode 12 is formed.

The recess 14 and the plurality of protrusion regions 15 in the second electrode surface 12A are formed, arising from the second covering portion 60 of the insulation layer 45. The recess 14 of the second electrode surface 12A is formed at a region which faces the second covering portion 60 of the insulation layer 45 in the second electrode surface 12A. The plurality of protrusion regions 15 in the second electrode surface 12A are respectively formed on the plurality of second sub pad openings 59. Each of the protrusion regions 15 has a plane area depending on an opening area of each of the second sub pad openings 59.

The second terminal electrode 12 is electrically connected to the second pad electrode 42 inside the second pad opening 58 (the plurality of second sub pad openings 59). Thereby, an electrical signal input into the second terminal electrode 12 is transmitted to the functional device FD via the second pad electrode 42.

In this embodiment, the second terminal electrode 12 has a stacked-layer structure including a plurality of electrode layers. In this embodiment, the second terminal electrode 12 has a stacked-layer structure which includes a second Ni (nickel) layer 64, a second Pd (palladium) layer 65 and a second Au (gold) layer 66 stacked in this order from the side of the chip main body 2.

The second Ni layer 64 reburies the plurality of second sub pad openings 59 and is integrated on the insulation layer 45 (the insulation main surface 46, the first chip main surface 3). The second Pd layer 65 covers an outer surface of the second Ni layer 64. The second Pd layer 65 is formed in a film shape following the outer surface of the second Ni layer 64. The second Pd layer 65 is in contact with the insulation layer 45 at a peripheral edge portion of the second Ni layer 64.

The second Au layer 66 covers an outer surface of the second Pd layer 65. The second Au layer 66 is formed in a film shape following the outer surface of the second Pd layer 65. The second Au layer 66 is in contact with the insulation layer 45 at a peripheral edge portion of the second Pd layer 65. The second Au layer 66 forms the second electrode surface 12A of the second terminal electrode 12. The recess 14 of the second electrode surface 12A is formed by recesses of the second Ni layer 64, the second Pd layer 65 and the second Au layer 66.

In this embodiment, the chip part 1 further includes a side surface insulation layer 71 which covers the chip side surfaces 5A to 5D of the chip main body 2. The side surface insulation layer 71 is formed as a protection layer which not only enhances external insulation properties of the chip main body 2 but also protects the chip main body 2 from the chip side surfaces 5A to 5D.

The side surface insulation layer 71 may have a single layer structure including a silicon oxide layer or a silicon nitride layer. The side surface insulation layer 71 may have a stacked-layer structure which includes a silicon oxide layer and a silicon nitride layer stacked in an arbitrary order. In this embodiment, the side surface insulation layer 71 has a single layer structure made of a silicon oxide layer.

The side surface insulation layer 71 exposes the second main surface 34 of the substrate 32 and covers the side surfaces 35A to 35D of the substrate 32. The side surface insulation layer 71 passes through the corners 36A to 36D of the substrate 32 to collectively cover the side surfaces 35A to 35D. Thereby, the side surface insulation layer 71 is formed in an annular shape (specifically, in an endless shape) surrounding the substrate 32 in plan view.

The side surface insulation layer 71 is formed in a film shape following the side surfaces 35A to 35D of the substrate 32. The side surface insulation layer 71 has a flat outer surface. The outer surface of the side surface insulation layer 71 extends in parallel to the side surfaces 35A to 35D of the substrate 32. The side surface insulation layer 71 may cover the main surface insulation layer 38. The side surface insulation layer 71 may cover the insulation layer 45.

Specifically, the side surface insulation layer 71 includes a first end portion 71A at the side of the first chip main surface 3 and a second end portion 71B at the side of the second chip main surface 4. In this embodiment, the first end portion 71A is led out from the side surfaces 35A to 35D of the substrate 32 toward the side of the first chip main surface 3 and covers the main surface insulation layer 38.

In this embodiment, the first end portion 71A exposes the insulation layer 45. The first end portion 71A may cover the insulation layer 45. The first end portion 71A may cover the passivation layer 52 of the insulation layer 45. The first end portion 71A may cover the passivation layer 52 and the resin layer 53 of the insulation layer 45.

The second end portion 71B continues to the second main surface 34 of the substrate 32. Specifically, the second end portion 71B has an end surface 72 which is formed such as to be flush with the second main surface 34 of the substrate 32. In this embodiment, the end surface 72 of the second end portion 71B is a grinding surface having a grinding mark. The grinding mark of the end surface 72 may continue to the grinding mark of the second main surface 34 (the second chip main surface 4).

The previously described outer surface resin 21 covers the side surfaces 35A to 35D of the substrate 32 and the insulation side surfaces 47A to 47D of the insulation layer 45, with the side surface insulation layer 71 interposed therebetween. The outer surface resin 21 covers an entire region of the side surface insulation layer 71 and covers the second main surface 34 of the substrate 32 exposed from the side surface insulation layer 71. The outer surface resin 21 may cover the passivation layer 52 of the insulation layer 45. The outer surface resin 21 may cover the passivation layer 52 and the resin layer 53 of the insulation layer 45.

With reference to FIG. 6 and FIG. 7, the first end portion 22A of the outer surface resin 21 overlaps with the first end portion 71A of the side surface insulation layer 71 and covers the insulation side surfaces 47A to 47D of the insulation layer 45. In a case in which the side surface insulation layer 71 covers the insulation side surfaces 47A to 47D of the insulation layer 45, the first end portion 22A of the outer surface resin 21 covers the insulation layer 45 by way of the side surface insulation layer 71.

The first end portion 22A of the outer surface resin 21 may cover the passivation layer 52 of the insulation layer 45 through the side surface insulation layer 71. The first end portion 22A of the outer surface resin 21 may cover the passivation layer 52 and the resin layer 53 of the insulation layer 45 through the side surface insulation layer 71. The second end portion 22B of the side surface covering portion 22 continues to the second end portion 71B of the side surface insulation layer 71. Thereby, one flat surface (a grinding surface) is formed by the second main surface 34 of the substrate 32, the second end portion 22B of the side surface covering portion 22 and the second end portion 71B of the side surface insulation layer 71.

The main surface covering portion 28 of the outer surface resin 21 collectively covers the second main surface 34 of the substrate 32, the second end portion 22B of the side surface covering portion 22 and the second end portion 71B of the side surface insulation layer 71. The main surface covering portion 28 of the outer surface resin 21 buries the grinding mark and collectively covers the second main surface 34 of the substrate 32, the second end portion 22B of the side surface covering portion 22 and the second end portion 71B of the side surface insulation layer 71.

As described above, in the chip part 1, the opaque outer surface resin 21 is formed in an annular shape (in an endless shape) surrounding the transparent insulation layer 45 in plan view. Therefore, the visibility of the marker 43 is not impaired by the outer surface resin 21.

As described above, according to the chip part 1, the chip main body 2 can be protected by the outer surface resin 21, with a connection portion of the chip main body 2 to a connection target being secured. It is, thereby, possible to provide the chip part 1 capable of appropriately protecting the chip main body 2, while taking advantage of a small electronic component.

FIG. 9 is a perspective view which shows a wafer 82 used in manufacturing the chip part 1 shown in FIG. 1.

In manufacturing the chip part 1, a wafer 82 is used as an example of the base substrate. The wafer 82 is a base member of the chip main body 2. The wafer 82 is formed in a plate shape or a disk shape. The wafer 82 may be formed in a circular shape.

The wafer 82 has a first wafer main surface 83 at one side, a second wafer main surface 84 at the other side, and a wafer side surface 85 which connects the first wafer main surface 83 and the second wafer main surface 84. The first wafer main surface 83 and the second wafer main surface 84 of the wafer 82 respectively correspond to the first main surface 33 and the second main surface 34 of the substrate 32.

A thickness TW of the wafer 82 exceeds the thickness Tsub of the substrate 32 (Tsub<TW). The thickness TW of the wafer 82 is matched to the thickness Tsub of the substrate 32 by grinding. The thickness TW may be 300 μm or more and 750 μm or less. The thickness TW may be 300 μm or more and 350 μm or less, 350 μm or more and 400 μm or less, 400 μm or more and 450 μm or less, 450 μm or more and 500 μm or less, 500 μm or more and 550 μm or less, 550 μm or more and 600 μm or less, 600 μm or more and 650 μm or less, 650 μm or more and 700 μm or less, or 700 μm or more and 750 μm or less.

The wafer 82 includes a first wafer corner 86 and a second wafer corner 87. The first wafer corner 86 connects the first wafer main surface 83 and the wafer side surface 85. The second wafer corner 87 connects the second wafer main surface 84 and the wafer side surface 85.

The first wafer corner 86 has a first chamfer portion 88 which is downwardly inclined from the first wafer main surface 83 toward the wafer side surface 85. The first chamfer portion 88 may be formed in a convex curved shape. The second wafer corner 87 has a second chamfer portion 89 which is downwardly inclined from the second wafer main surface 84 toward the wafer side surface 85. The second chamfer portion 89 may be formed in a convex curved shape. The first chamfer portion 88 and the second chamfer portion 89 suppress occurrence of cracks on the wafer 82.

A notched portion 90 as a positioning marker is formed in the wafer side surface 85. In this embodiment, the notched portion 90 extends in a line shape along the first direction X. In the wafer side surface 85 of the wafer 82, there may be formed a notched portion 90 extending along the first direction X and a notched portion 90 extending along the second direction Y.

A plurality of chip forming regions 91, each of which corresponds to the chip main body 2, are set in the first wafer main surface 83. The plurality of chip forming regions 91 are set in a matrix shape to be spaced from each other along the first direction X and the second direction Y. The plurality of chip forming regions 91 are respectively demarcated by a scheduled cutting line 92 extending in a lattice shape along the first direction X and the second direction Y. The scheduled cutting line 92 includes a plurality of first scheduled cutting lines 92A and a plurality of second scheduled cutting lines 92B.

The plurality of first scheduled cutting lines 92A respectively extend along the first direction X. The plurality of second scheduled cutting lines 92B respectively extend along the second direction Y. After a predetermined structure is formed into the plurality of chip forming regions 91, the wafer 82 is cut along the scheduled cutting line 92. Thereby, the plurality of chip parts 1 are cut out from a single sheet of the wafer 82.

FIG. 10A to FIG. 10N are each a cross-sectional view which is taken along line X-X shown in FIG. 9 and a cross-sectional view for describing an example of the method for manufacturing the chip part 1 shown in FIG. 1. Hereinafter, for the sake of convenience of description, the functional device FD and a step of forming thereof will be omitted.

With reference to FIG. 10A, at first, the previously described wafer 82 (refer to FIG. 9) is prepared. Next, the main surface insulation layer 38 is formed on the first wafer main surface 83 of the wafer 82. The main surface insulation layer 38 may be formed by oxidation treatment (for example, thermal oxidation treatment). The main surface insulation layer 38 may be formed by a CVD (Chemical Vapor Deposition) method.

Figure 10B:
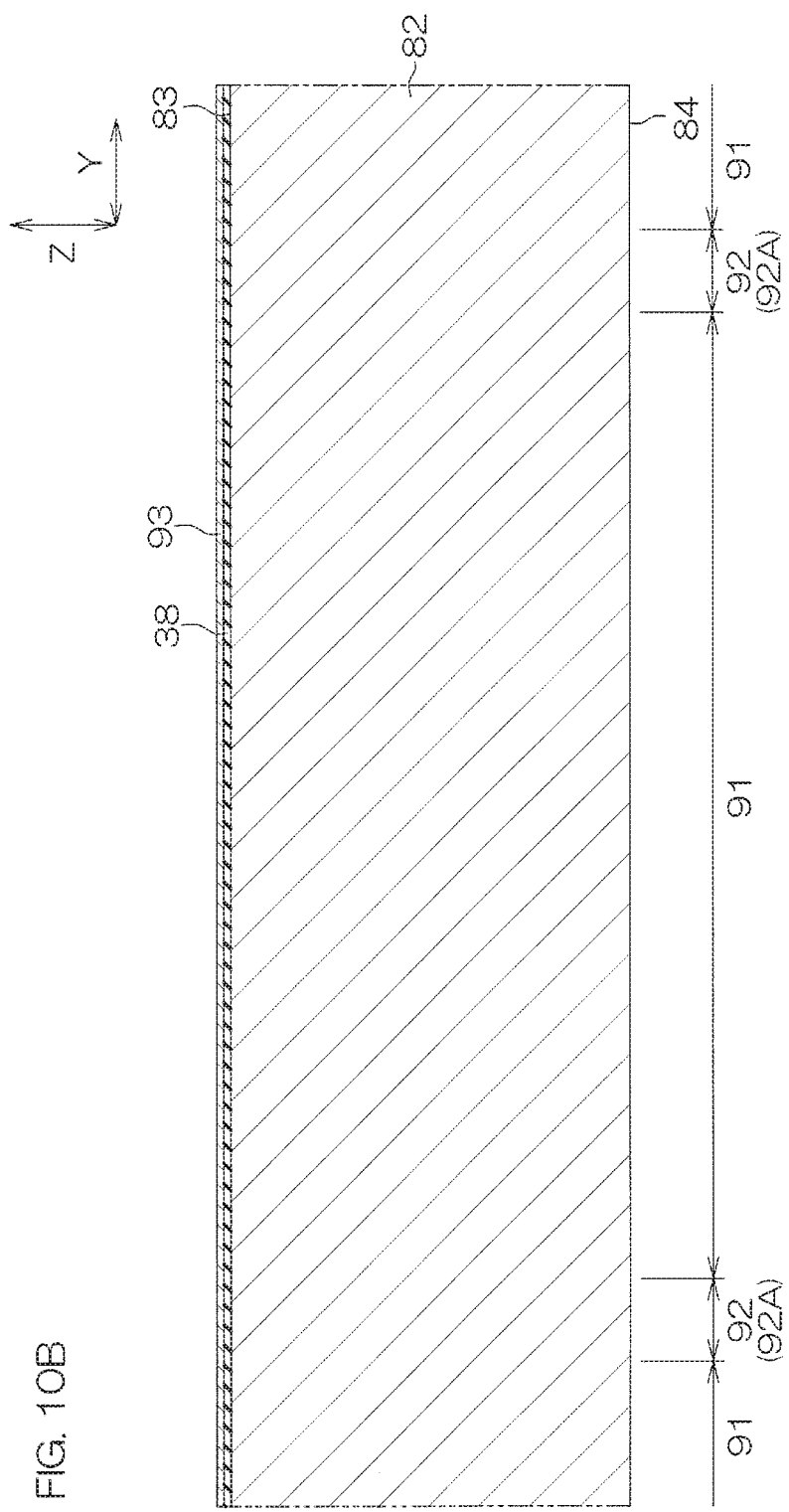
FIG. 10A to FIG. 10N are each a cross-sectional view which is taken along line X-X shown in FIG. 9 and a cross-sectional view for describing an example of a method for manufacturing the chip part shown in FIG. 1.

Next, with reference to FIG. 10B, a base electrode layer 93 which is to be a base of each of the first pad electrode 41, the second pad electrode 42 and the marker 43 is formed on the main surface insulation layer 38. The base electrode layer 93 may be formed by a sputtering method or a vapor deposition method.

Next, with reference to FIG. 10C, a mask 94 having a predetermined pattern is formed on the base electrode layer 93. The mask 94 covers a region in which the first pad electrode 41 is to be formed, a region in which the second pad electrode 42 is to be formed and a region in which the marker 43 is to be formed, and has a plurality of openings 94A which expose a region other than those regions.

Next, an unnecessary portion of the base electrode layer 93 is removed by an etching method via the mask 94. The etching method may be a wet etching method. Thereby, the first pad electrode 41, the second pad electrode 42 and the marker 43 are formed. Thereafter, the mask 94 is removed.

Next, with reference to FIG. 10D, the passivation layer 52 is formed on the main surface insulation layer 38. The passivation layer 52 may be formed by a CVD method. The passivation layer 52 covers the first pad electrode 41, the second pad electrode 42 and the marker 43.

Next, with reference to FIG. 10E, a resin layer 95 which has a predetermined pattern and which is to be a base of the resin layer 53 is formed on the passivation layer 52. Specifically, the resin layer 95 has a plurality of openings 95A corresponding to the first pad opening 54 (the plurality of first sub pad openings 55) and the second pad opening 58 (the plurality of first sub pad openings 55) and also has an opening 95B along the scheduled cutting line 92.

In this step, at first, a photosensitive resin is coated on the passivation layer 52. Next, the photosensitive resin is photo-exposed via a photo mask (not shown) having predetermined patterns. Specifically, the photo mask (not shown) has patterns which correspond to the first pad opening 54 (the plurality of first sub pad openings 55), the second pad opening 58 (the plurality of second sub pad openings 59) and the scheduled cutting line 92. Then, the photosensitive resin is immersed into a developing fluid. Thereby, the resin layer 95 having the predetermined pattern is formed.

Next, with reference to FIG. 10F, an unnecessary portion of the passivation layer 52 is removed by an etching method using the resin layer 95 as a mask. Specifically, portions exposed from openings 95A, 95B of the resin layer 95 in the passivation layer 52 are removed. The etching method may be a wet etching method.

The plurality of openings 95A of the resin layer 95 become the first pad opening 54 and the second pad opening 58. The opening 95B of the resin layer 95 become a dicing street 96 along the scheduled cutting line 92. Thus, there is formed the insulation layer 45 including the passivation layer 52 and the resin layer 53.

Figure 10G:
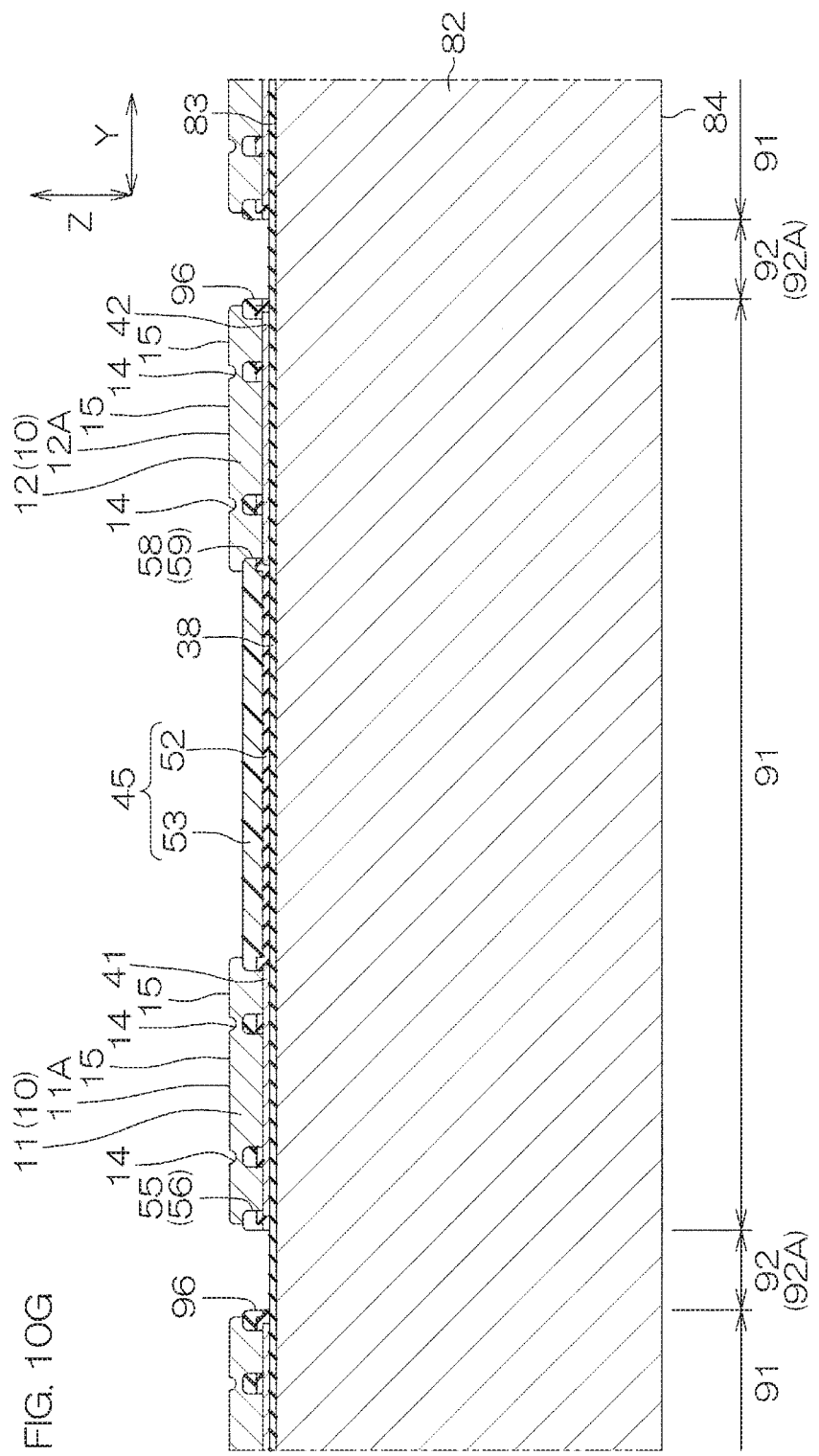

Next, with reference to FIG. 10G, the first terminal electrode 11 is formed inside the first pad opening 54, and the second terminal electrode 12 is formed inside the second pad opening 58. The second terminal electrode 12 is formed at the same time with the first terminal electrode 11.

In this step, the recess 14 and the protrusion region 15 are formed in the first electrode surface 11A of the first terminal electrode 11, arising from the shape of the plurality of first sub pad openings 55. Further, the recess 14 and the protrusion region 15 are formed in the second electrode surface 12A of the second terminal electrode 12, arising from the shape of the plurality of second sub pad openings 59.

The step of forming the first terminal electrode 11 includes a step of forming the first Ni layer 61, the first Pd layer 62 and the first Au layer 63 in this order on the first pad electrode 41. The first Ni layer 61, the first Pd layer 62 and the first Au layer 63 may be each formed by a plating method. The plating method may be an electroless plating method.

The step of forming the second terminal electrode 12 includes a step of forming the second Ni layer 64, the second Pd layer 65 and the second Au layer 66 in this order on the second pad electrode 42. The second Ni layer 64, the second Pd layer 65 and the second Au layer 66 may be each formed by a plating method. The plating method may be an electroless plating method.

Figure 10H:
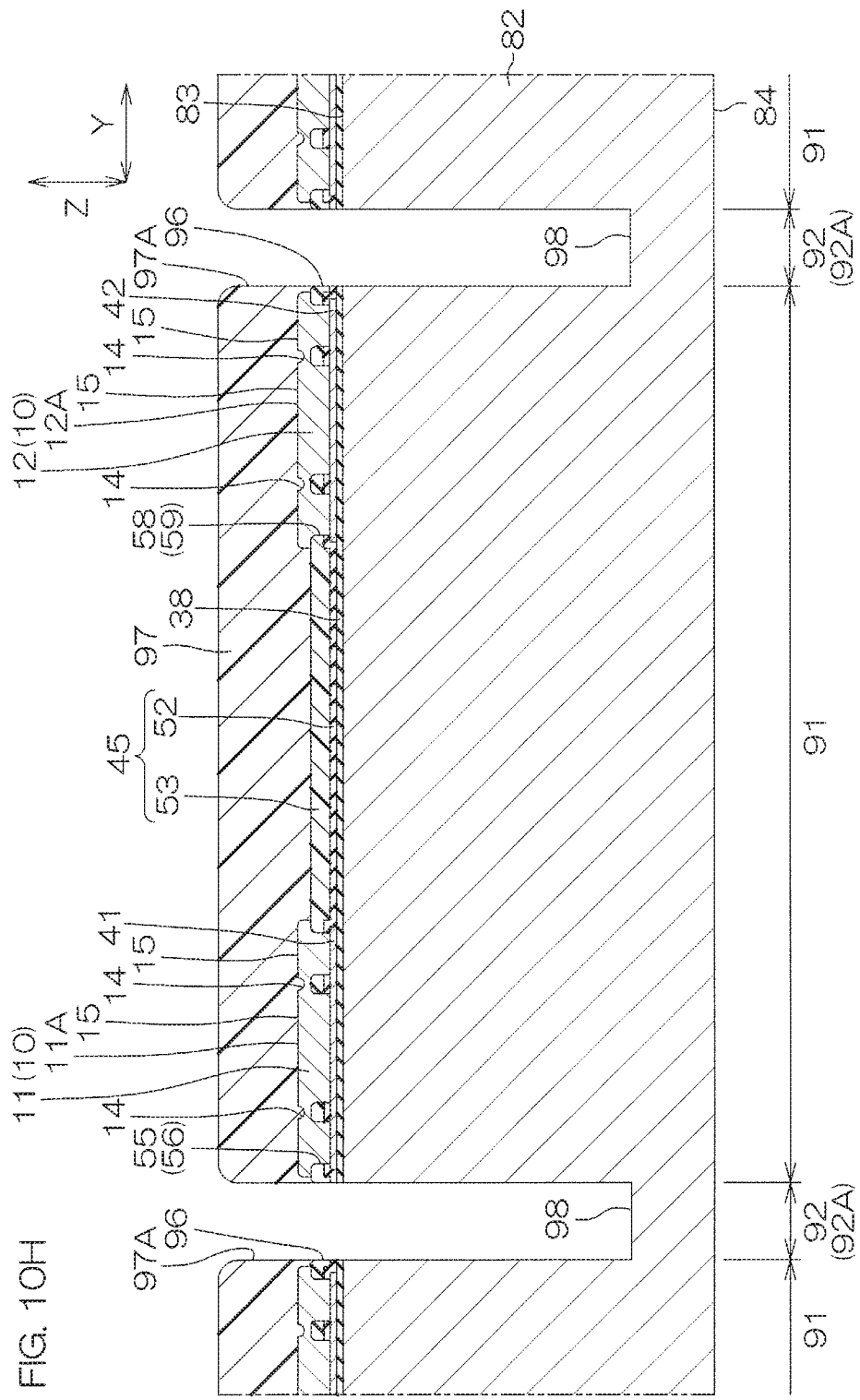
Figure 10:
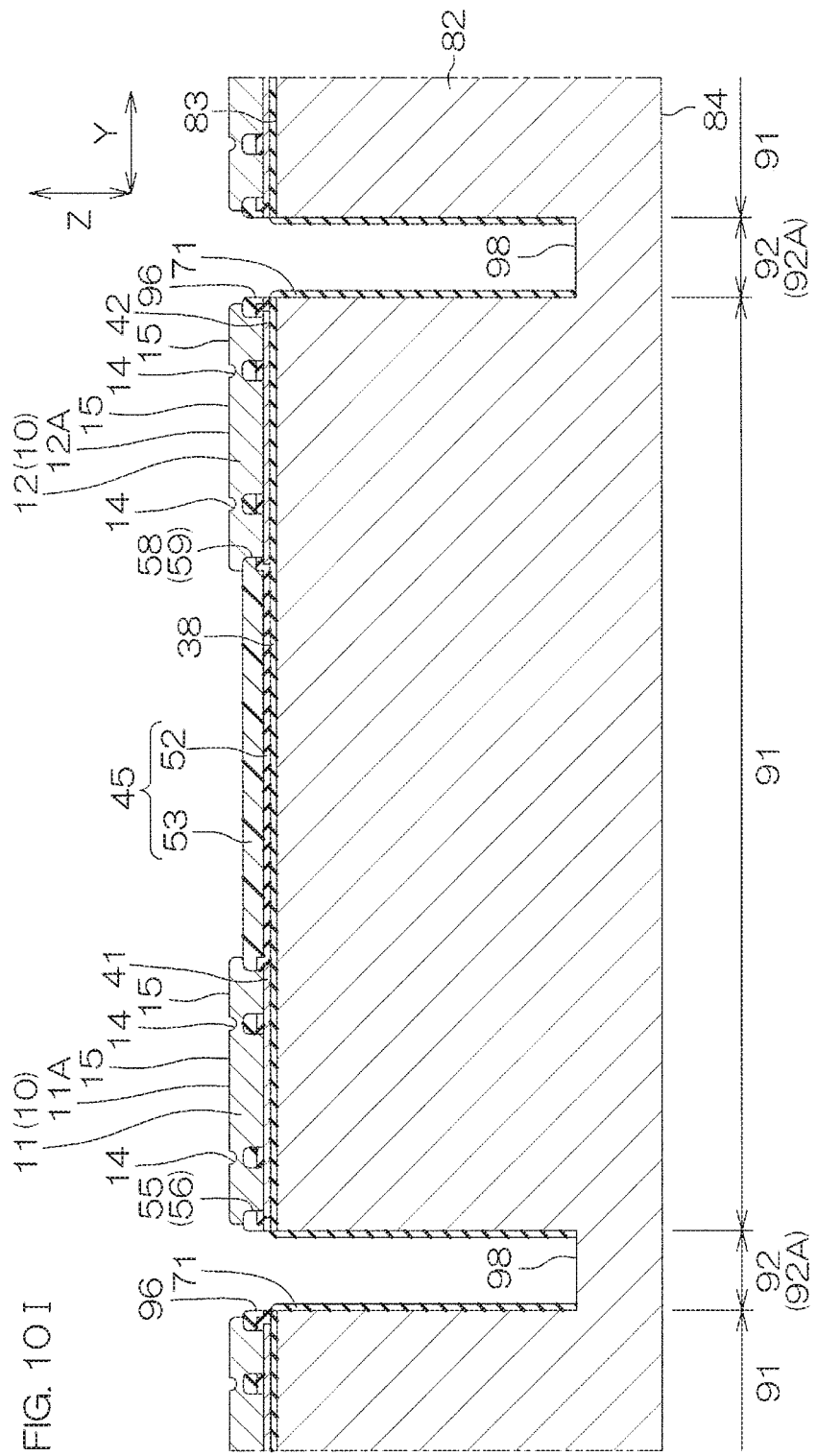

Next, with reference to FIG. 10H, a mask 97 having a predetermined pattern is formed on the first wafer main surface 83 of the wafer 82. The mask 97 has an opening 97A which exposes the dicing street 96 (the scheduled cutting line 92).

Next, an unnecessary portion of the wafer 82 is removed by an etching method via the mask 97. The etching method may be a dry etching method (for example, reactive ion etching method). Thereby, a groove 98 which demarcates the chip forming regions 91 along the dicing street 96 (the scheduled cutting line 92) is formed in the first wafer main surface 83 of the wafer 82. Thereafter, the mask 97 is removed.

Next, with reference to FIG. 10I, the side surface insulation layer 71 is formed on a side wall of the groove 98. In this step, at first, a base insulation layer (not shown) in a film shape which covers an inner wall of the groove 98 and covers the chip forming regions 91 is formed on the first wafer main surface 83 of the wafer 82.

Next, an unnecessary portion of the base insulation layer is removed by an etching method so that a portion of the base insulation layer which covers the side wall of the groove 98 remains. The etching method may be a dry etching method (for example, a reactive ion etching method). Thereby, the side surface insulation layer 71 is formed.

Figure 10J:
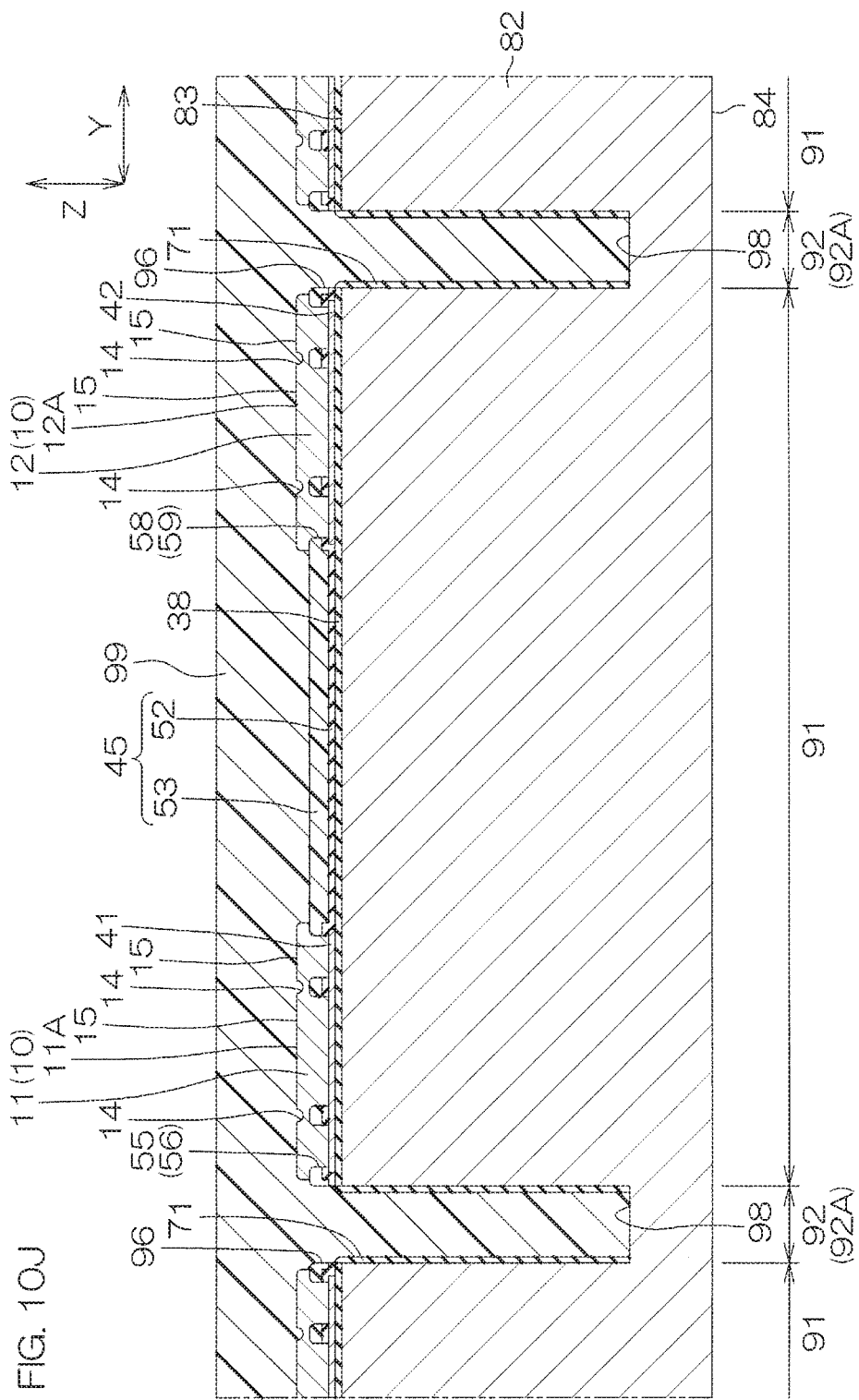

Next, with reference to FIG. 10J, a first base resin layer 99 which is to be a base of the outer surface resin 21 (the side surface covering portion 22) is formed. In this step, a solvent which includes a thermosetting resin (for example, an epoxy resin) is supplied onto the first wafer main surface 83 of the wafer 82.

The solvent is different in color from each of the electrode surfaces 11A, 12A. The solvent is preferably darker in shade than each of the electrode surfaces 11A, 12A. In this embodiment, the solvent includes carbon black and is colored in black. The solvent is filled into the groove 98, the recess 14 of the first electrode surface 11A and the recess 14 of the second electrode surface 12A and covers the chip forming regions 91.

Next, the solvent is heated and cured. The solvent is preferably semi-cured. Thereby, the first base resin layer 99 which buries the groove 98, the recess 14 of the first electrode surface 11A and the recess 14 of the second electrode surface 12A and covers the chip forming region 91 is formed.

Figure 10K:
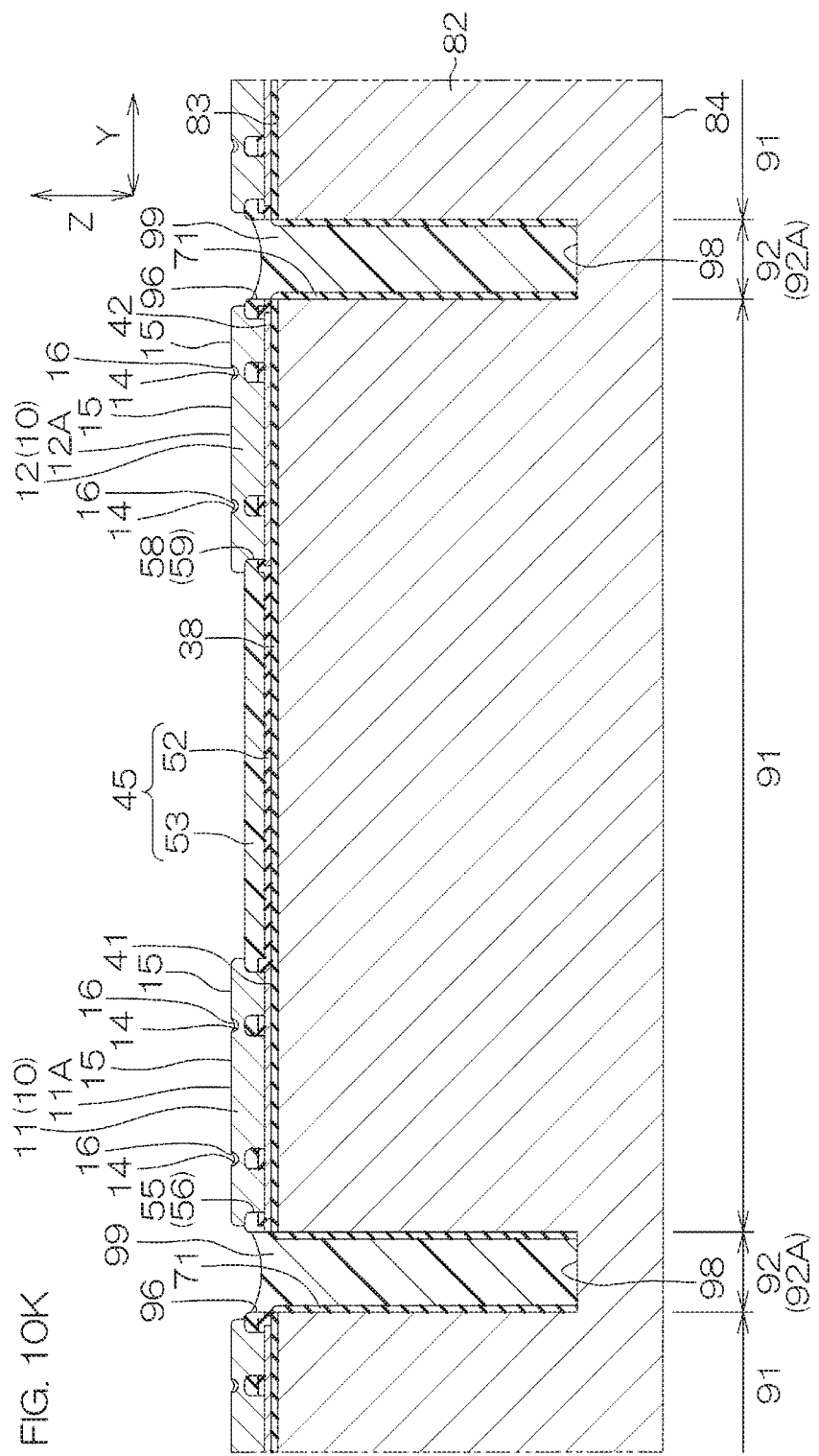

Next, with reference to FIG. 10K, an unnecessary portion of the first base resin layer 99 is removed. In this step, a portion of the first base resin layer 99 which covers the chip forming regions 91 is removed so that a portion of the first base resin layer 99 which is buried in the groove 98 remains.

Further, in this step, a portion of the first base resin layer 99 which covers the first electrode surface 11A is removed so that a portion of the first base resin layer 99 which is buried in the recess 14 of the first electrode surface 11A remains. Thereby, the buried substance 16 is formed in the recess 14 of the first electrode surface 11A.

Similarly, in this step, a portion of the first base resin layer 99 which covers the second electrode surface 12A is removed so that a portion of the first base resin layer 99 which is buried in the recess 14 of the second electrode surface 12A remains. Thereby, the buried substance 16 is formed in the recess 14 of the second electrode surface 12A.

An unnecessary portion of the first base resin layer 99 may be removed by grinding, peeling or wiping. A cloth or a grinding member may be used in removing the unnecessary portion of the first base resin layer 99. According to the first base resin layer 99 in the semi-cured state, the unnecessary portion thereof can be easily removed.

In this step, a cloth is used to wipe the unnecessary portion of the first base resin layer 99. In this case, an end portion at the side of an opening in the first base resin layer 99 remaining in the groove 98 is recessed in a concave curved surface toward a bottom wall of the groove 98. Further, the end portion at the side of the opening in the first base resin layer 99 is formed such as to bulge and/or sink along the scheduled cutting line 92.

At an intersecting portion of the first scheduled cutting line 92A with the second scheduled cutting line 92B, the groove 98 is increased in width of the opening. Therefore, a quantity of the first base resin layer 99 removed at an intersecting portion of the groove 98 is larger than a quantity of the first base resin layer 99 removed at a region other than the intersecting portion of the groove 98.

Thereby, the end portion at the side of the opening in the first base resin layer 99 remaining at the intersecting portion of the groove 98 sinks toward the side of the bottom wall of the groove 98, rather than an end portion at the side of the opening in the first base resin layer 99 remaining in a region other than the intersecting portion. Thereafter, the first base resin layer 99 buried in the groove 98 is heated and completely cured.

Figure 10L:
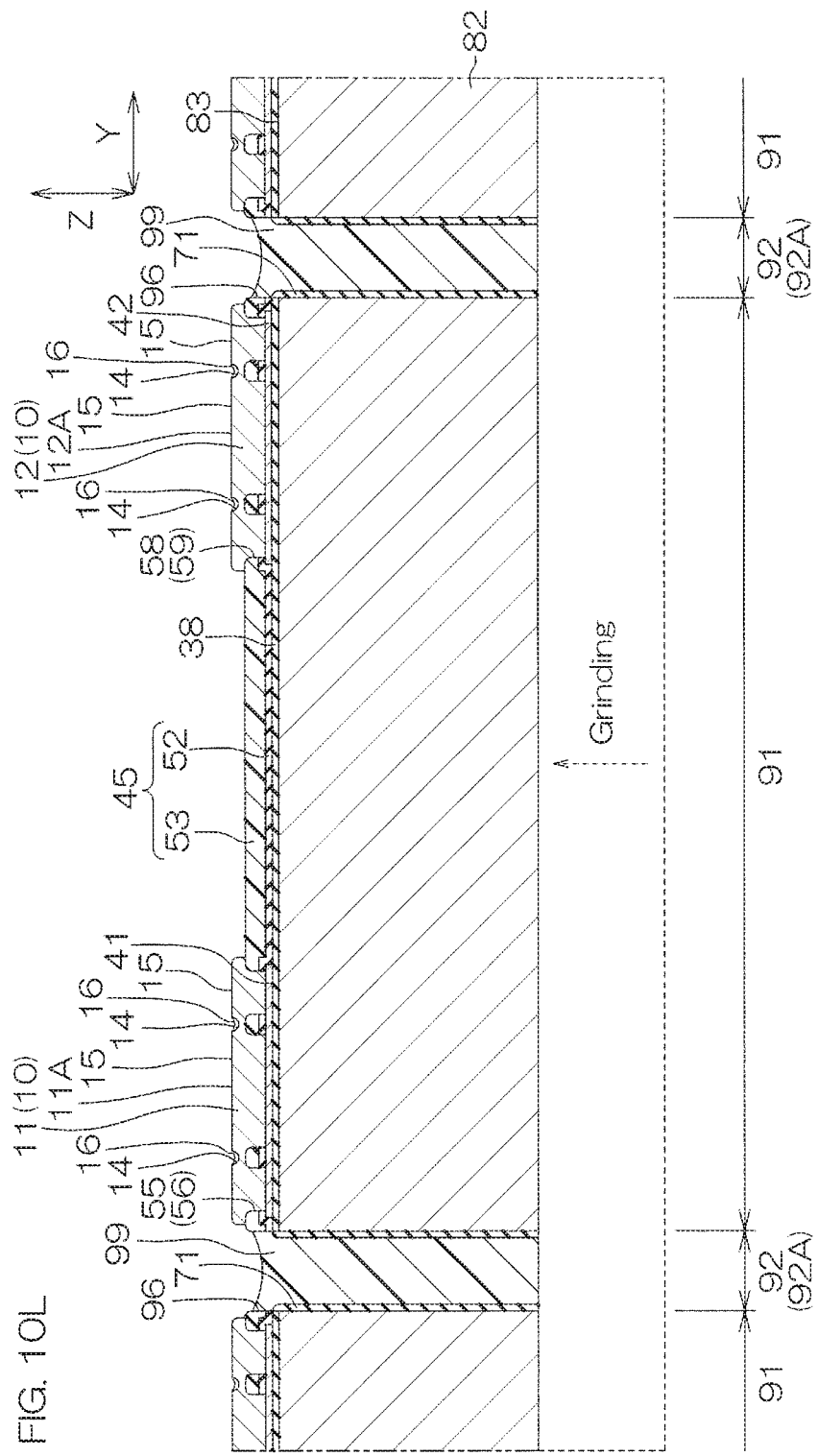

Next, with reference to FIG. 10L, the second wafer main surface 84 of the wafer 82 is ground. The second wafer main surface 84 may be ground by a CMP (Chemical Mechanical Polishing) method. The second wafer main surface 84 is ground until the first base resin layer 99 buried in the groove 98 is exposed.

Thereby, one flat surface which is constituted of the second wafer main surface 84, the side surface insulation layer 71 and the first base resin layer 99 is formed. A grinding mark is also formed in the second wafer main surface 84, the side surface insulation layer 71 and the first base resin layer 99. In this step, the plurality of chip forming regions 91 are separated as the plurality of chip main bodies 2. The plurality of chip main bodies 2 are supported by the first base resin layer 99 which has been firmly fixed.

Next, with reference to FIG. 10M, a second base resin layer 100 which is to be a base of the outer surface resin 21 (the main surface covering portion 28) is formed on the second wafer main surface 84 of the wafer 82. In this step, at first, a resin tape containing a thermosetting resin (for example, an epoxy resin) is attached on the second wafer main surface 84.

The resin tape collectively covers the second wafer main surface 84, the side surface insulation layer 71 and the first base resin layer 99. Next, the resin tape is heated and cured. Thereby, the second base resin layer 100 which has been integrated with the first base resin layer 99 is formed.

The second base resin layer 100 may be formed by using a solvent including a thermosetting resin (for example, an epoxy resin), in a similar method as the first base resin layer 99. In this case, at first, the solvent is supplied onto the second wafer main surface 84 of the wafer 82. Next, the solvent is heated and cured. Thereby, the second base resin layer 100 which has been integrated with the first base resin layer 99 is formed.

Next, with reference to FIG. 10N, the wafer 82 is cut along the scheduled cutting line 92. Specifically, the first base resin layer 99 is cut so that a portion of the first base resin layer 99 which covers the side wall of the groove 98 remains. The second base resin layer 100 is cut together with the first base resin layer 99. Thereby, the plurality of chip parts 1 are cut out from a single sheet of the wafer 82. The chip part 1 is manufactured through steps which include the description so far made.

Figure 12:
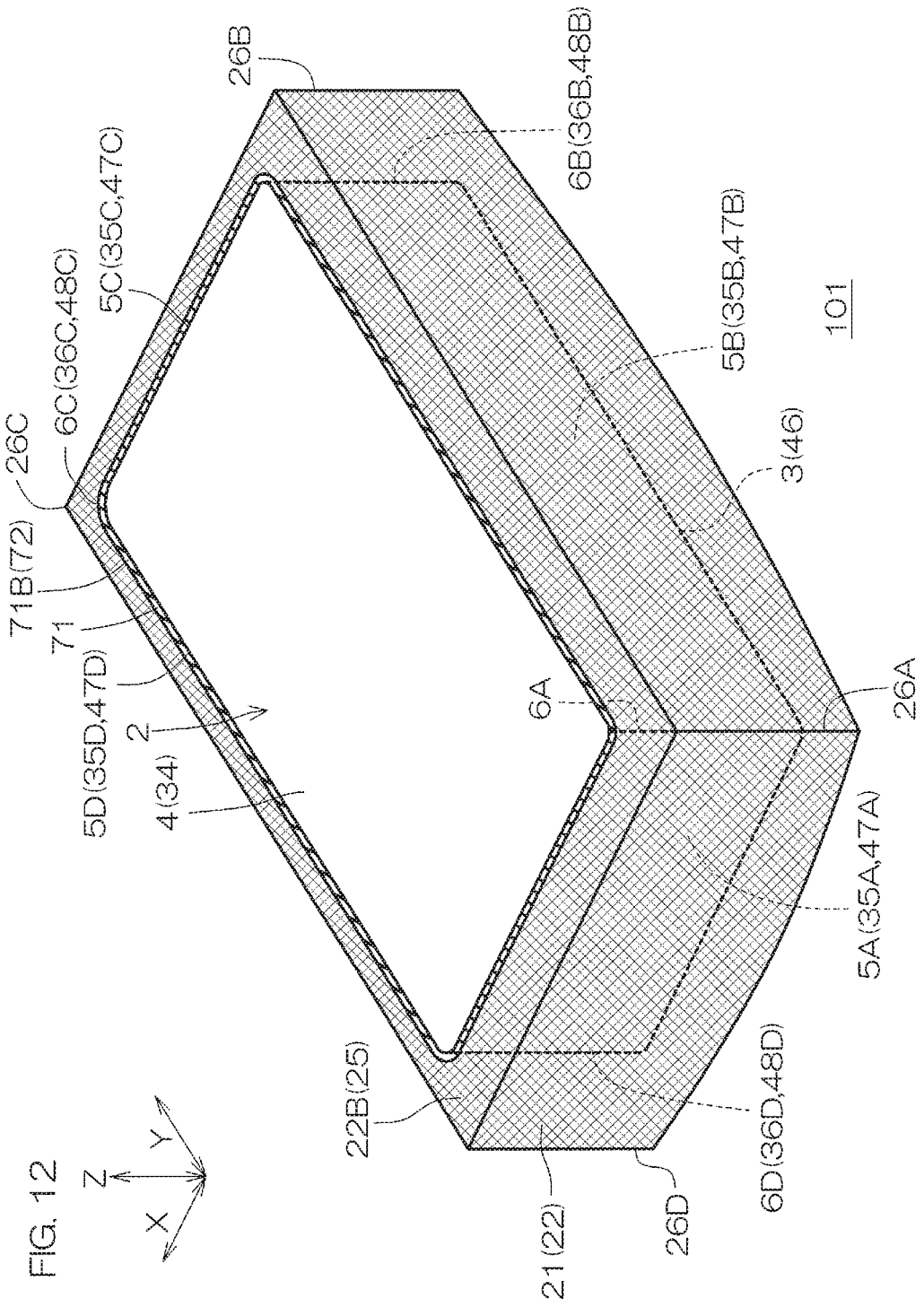
FIG. 12 is a perspective view which shows the chip part shown in FIG. 11 when viewed at another angle.

FIG. 11 is a perspective view which shows a chip part 101 according to a second preferred embodiment of the present invention when viewed at one angle. FIG. 12 is a perspective view which shows the chip part 101 shown in FIG. 11 when viewed at another angle. Hereinafter, a structure corresponding to the structure described in the chip part 1 will be given the same reference numerals, with a description thereof omitted.

The outer surface resin 21 of the previously described chip part 1 has the side surface covering portion 22 and the main surface covering portion 28. On the other hand, the outer surface resin 21 of the chip part 101 has only the side surface covering portion 22. The outer surface resin 21 of the chip part 101 is free from the main surface covering portion 28. The outer surface resin 21 exposes the second main surface 34 of the substrate 32.

The second end portion 22B of the side surface covering portion 22 continues to the second main surface 34 of the substrate 32 and the second end portion 71B of the side surface insulation layer 71. Thereby, one flat surface (grinding surface) is formed by the second main surface 34 of the substrate 32, the second end portion 22B of the side surface covering portion 22 and the second end portion 71B of the side surface insulation layer 71.

The chip part 101 having the above structure is manufactured by omitting the step of forming the second base resin layer 100 (refer to FIG. 10M) in the step of manufacturing the chip part 1 (refer to FIG. 10A to FIG. 10N). As described above, the chip part 101 is also able to provide the same effects as those described in the chip part 1.

Figure 13:
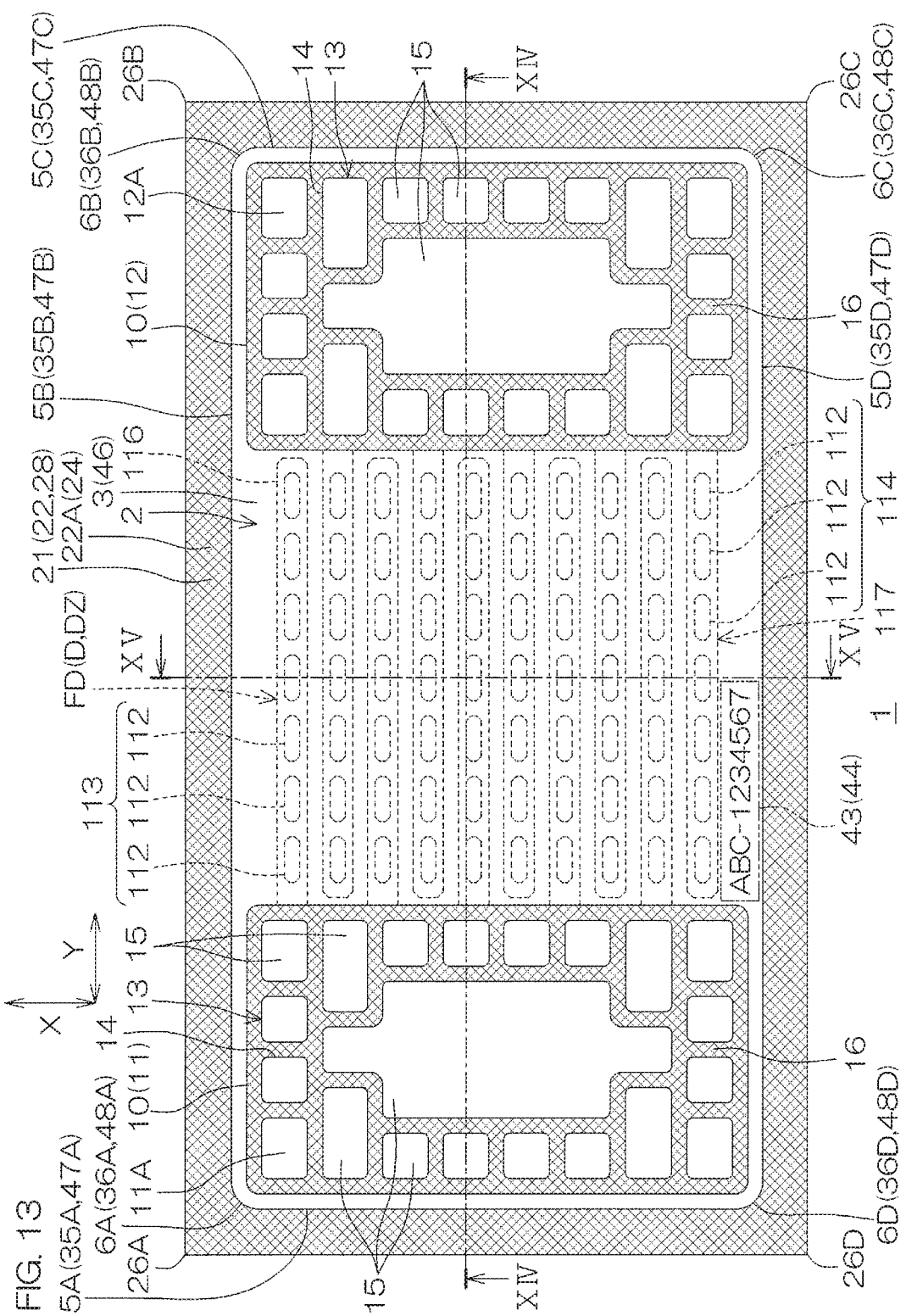
FIG. 13 is a plan view corresponding to FIG. 3 and a plan view for describing a functional device (diode) which is incorporated in the chip part according to a first mode example.
Figure 14:
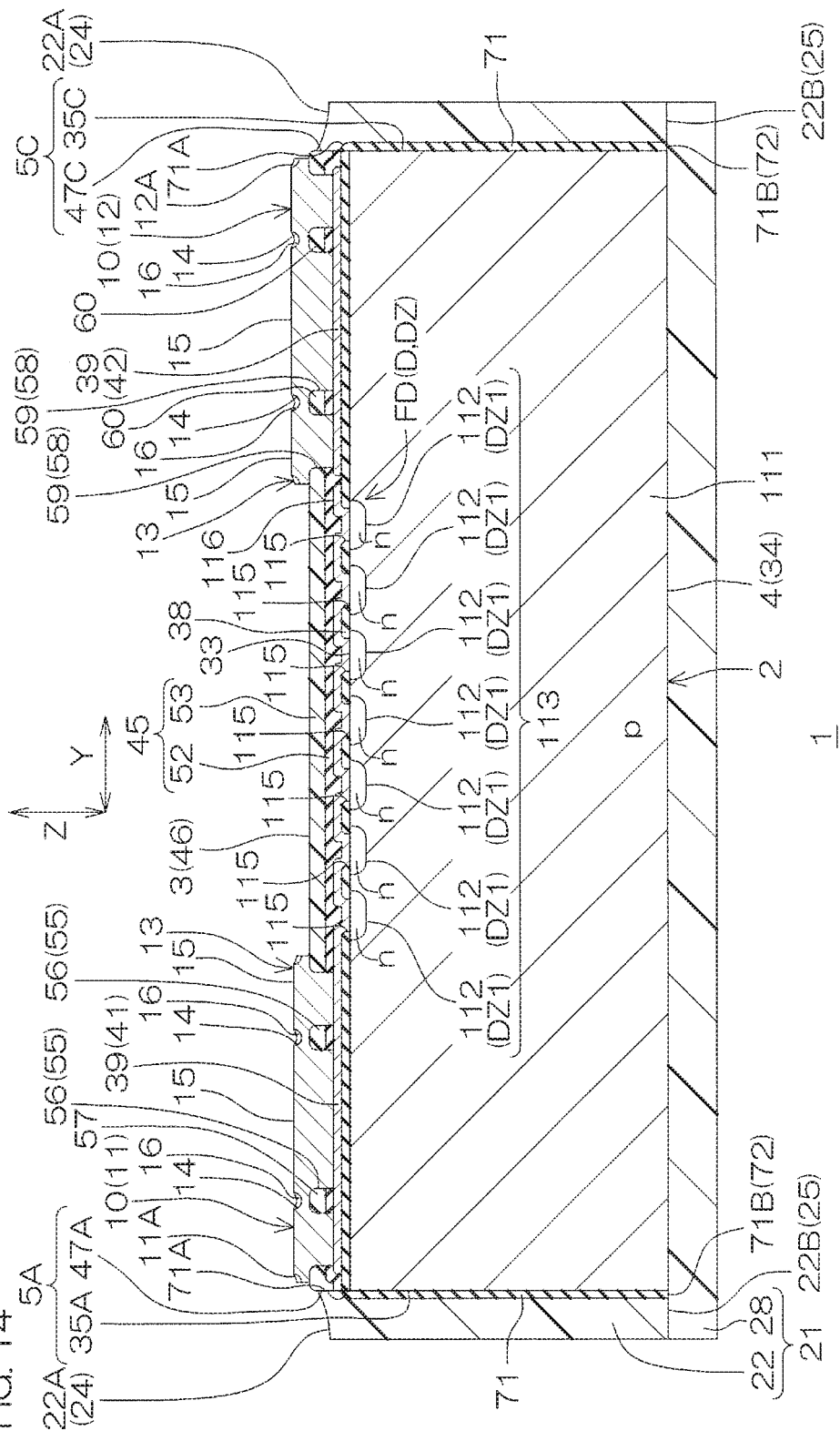
FIG. 14 is a cross-sectional view which is taken along line XIV-XIV shown in FIG. 13.
Figure 15:
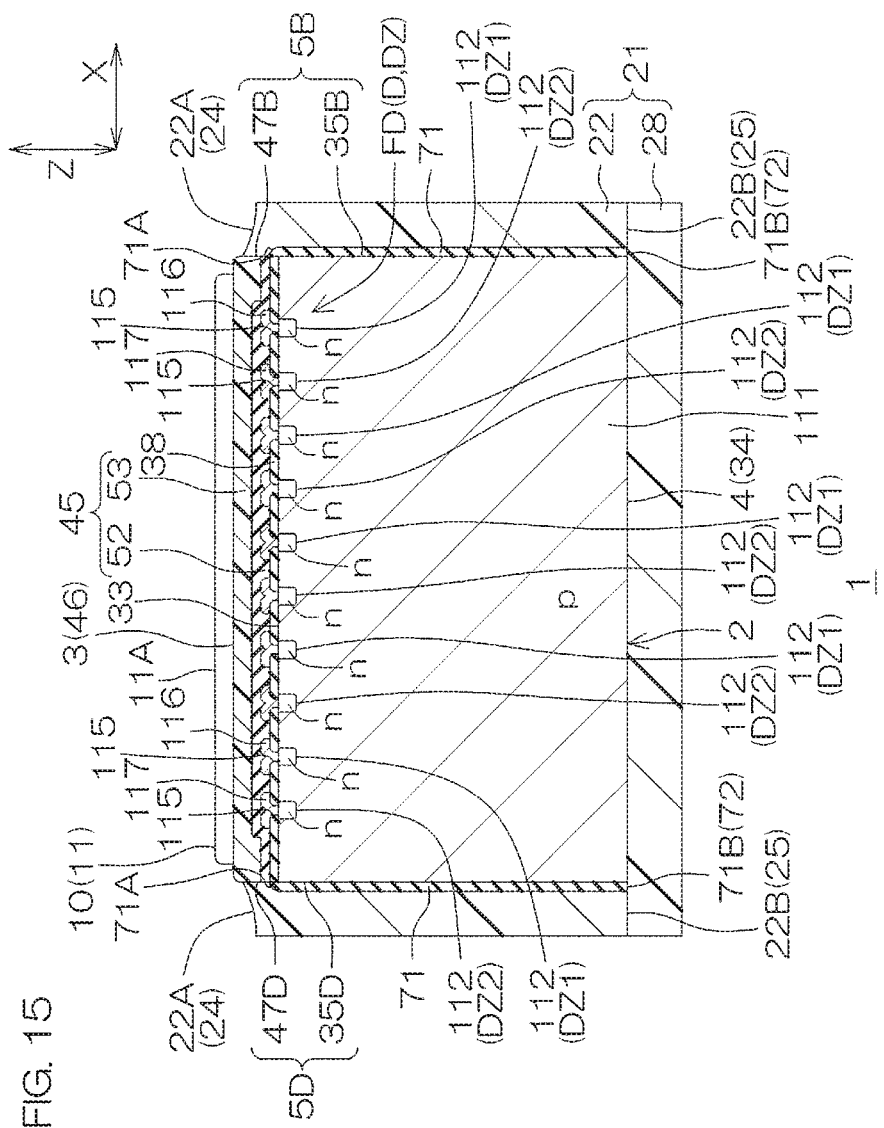
FIG. 15 is a cross-sectional view which is taken along line XV-XV shown in FIG. 13.
Figure 16:
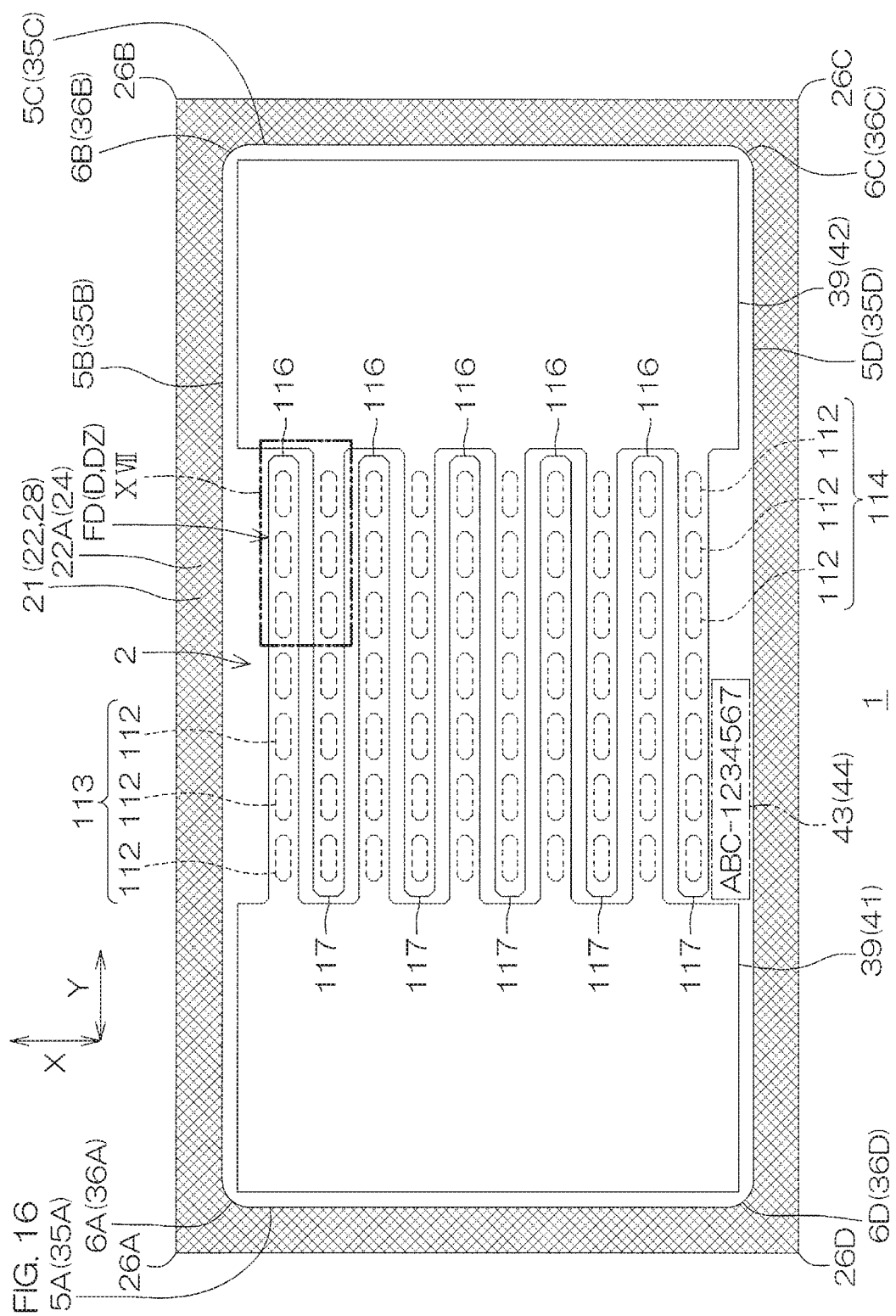
FIG. 16 is a plan view for describing a structure of an internal electrode by removing structures on the internal electrode from FIG. 13.
Figure 17:
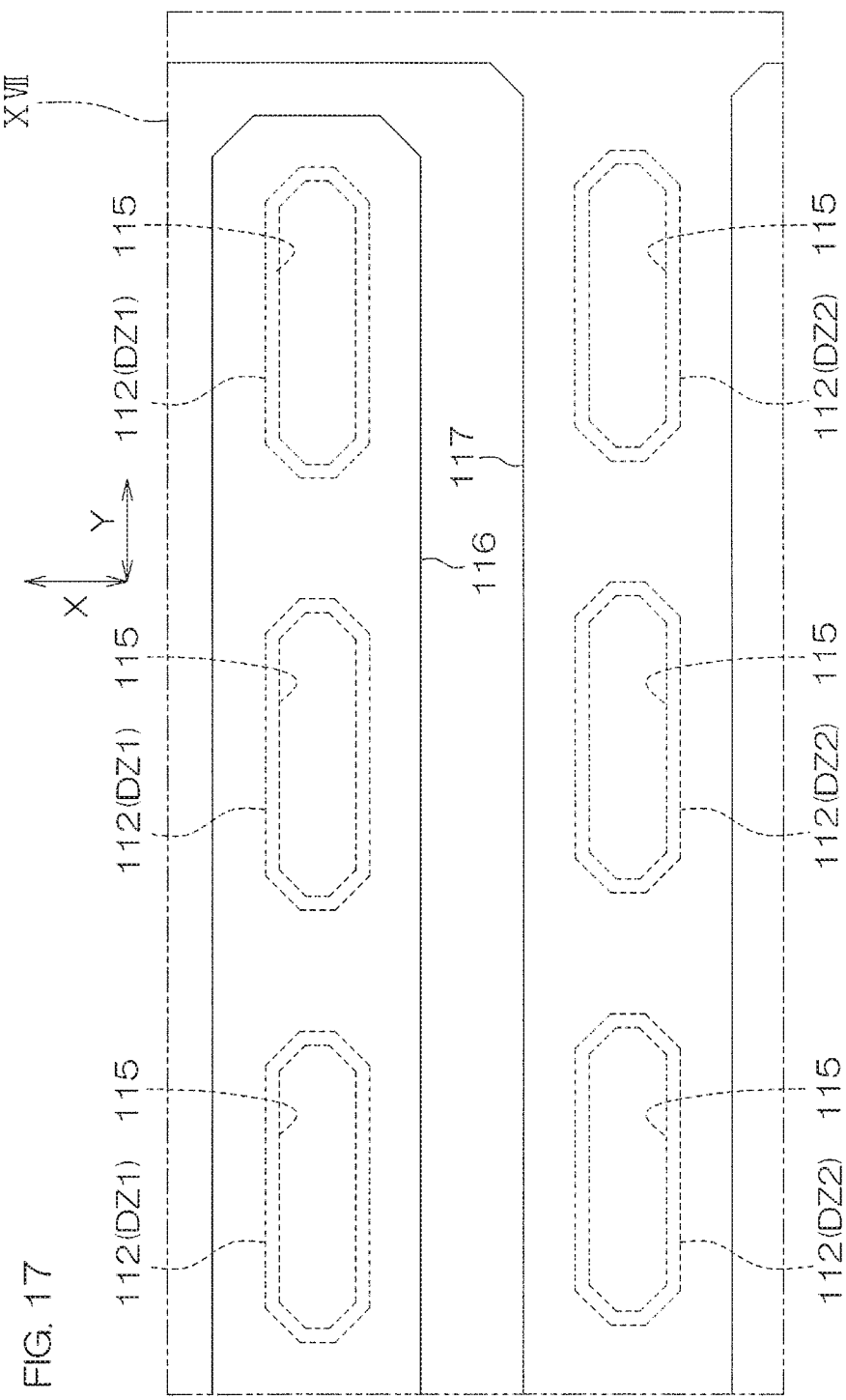
FIG. 17 is an enlarged view of a region XVII shown in FIG. 16.

FIG. 13 is a plan view corresponding to FIG. 3 and a plan view for describing a functional device FD (diode D) incorporated in the chip part 1 according to a first mode example. FIG. 14 is a cross-sectional view which is taken along line XIV-XIV shown in FIG. 13. FIG. 15 is a cross-sectional view which is taken along line XV-XV shown in FIG. 13. FIG. 16 is a plan view for describing a structure of an internal electrode 39 by removing structures on the internal electrode 39 from FIG. 13. FIG. 17 is an enlarged view of a region XVII shown in FIG. 16. Hereinafter, a structure corresponding to the structure described in the chip part 1 will be given the same reference numerals, with a description thereof omitted.

With reference to FIG. 13 to FIG. 17, the functional device FD according to the first mode example includes a diode D. In this embodiment, the functional device FD includes a bidirectional Zener diode DZ as an example of the diode D. The bidirectional Zener diode DZ includes a plurality of Zener diodes DZ1, DZ2 which are connected in series in a reverse direction.

A p-type base region 111 is formed on a surface layer portion of the first main surface 33 of the substrate 32. In this embodiment, the base region 111 is formed all over from the first main surface 33 of the substrate 32 to the second main surface 34 thereof. Thereby, the substrate 32 is formed as a p-type semiconductor region.

A specific resistance ρsub of the substrate 32 may be 1 mΩ·cm or more and 10 mΩ·cm or less. The specific resistance ρsub may be 1 mΩ·cm or more and 2 mΩ·cm or less, 2 mΩ·cm or more and 4 mΩ·cm or less, 4 mΩ·cm or more and 6 mΩ·cm or less, 6 mΩ·cm or more and 8 mΩ·cm or less, or 8 mΩ·cm or more and 10 mΩ·cm or less.

A plurality of n-type impurity regions 112 are formed in a surface layer portion of the base region 111. The plurality of impurity regions 112 are exposed from the first main surface 33 of the substrate 32. The plurality of impurity regions 112 are formed at a central portion of the first main surface 33 of the substrate 32 in plan view. Specifically, the plurality of impurity regions 112 are formed at a region between the first terminal electrode 11 and the second terminal electrode 12 in plan view.

The plurality of impurity regions 112 are arranged in a matrix shape to be spaced from each other along a first direction X and a second direction Y. The plurality of impurity regions 112 face each other in the first direction X. The plurality of impurity regions 112 face each other in the second direction Y.

In this embodiment, the plurality of impurity regions 112 are each formed in a band shape such as to extend along the second direction Y in plan view. In this embodiment, the plurality of impurity regions 112 are each formed in a rectangular shape such as to remove four corners in plan view (a rectangular shape, each corner of which is rounded). The plurality of impurity regions 112 are formed such as to be equal in shape and area in plan view.

The plurality of impurity regions 112 are each equal in thickness. The plurality of impurity regions 112 are each equal in n-type impurity concentration. The plurality of impurity regions 112 may be $1.0 \times 10^{19}$ cm$^{-3}$ or more and $1.0 \times 10^{21}$ cm$^{-3}$ or less in n-type impurity concentration. The plurality of impurity regions 112, each of which has the above-described structure, are able to suppress a variation of electrical characteristics resulting from each of the impurity regions 112.

The plurality of impurity regions 112 form a pn junction with the base region 111. Thereby, a plurality of Zener diodes DZ1, DZ2 having the base region 111 as an anode and the impurity region 112 as a cathode.

Specifically, the plurality of impurity regions 112 include a plurality of first impurity region groups 113 (two or more, five in this embodiment) and a plurality of second impurity region groups 114 (two or more, five in this embodiment). The plurality of first impurity region groups 113 are electrically connected to the first terminal electrode 11. The plurality of second impurity region groups 114 are electrically connected to the second terminal electrode 12.

The first impurity region group 113 includes the plurality of impurity regions 112 (two or more, six in this embodiment) which are formed to be spaced from each other along the second direction Y. The plurality of first impurity region groups 113 are formed to be spaced from each other along the first direction X. The plurality of impurity regions 112 included in the first impurity region group 113 each form the first Zener diode DZ1.

The second impurity region group 114 includes the plurality of impurity regions 112 (two or more, six in this embodiment) which are formed to be spaced from each other along the second direction Y. The plurality of second impurity region groups 114 are formed to be spaced from each other along the first direction X. In this embodiment, the plurality of second impurity region groups 114 and the plurality of first impurity region groups 113 are arranged alternately along the first direction X. The plurality of impurity regions 112 included in the second impurity region group 114 each form the second Zener diode DZ2.

The second Zener diode DZ2 is electrically connected to the first Zener diode DZ1 via the base region 111. Specifically, an anode of the second Zener diode DZ2 is electrically connected to an anode of the first Zener diode DZ1. Thereby, the bidirectional Zener diode DZ which includes the second Zener diode DZ2 connected to the first Zener diode DZ1 in a reverse-biased manner is formed.

In this embodiment, a description has been given of a case where the plurality of impurity regions 112 include the plurality of first impurity region groups 113 and the plurality of second impurity region groups 114. However, the plurality of impurity regions 112 may be constituted of one first impurity region group 113 and one second impurity region group 114.

Further, the plurality of impurity regions 112 may be formed in such a pattern that the impurity regions 112 electrically connected to the first terminal electrode 11 and the impurity regions 112 electrically connected to the second terminal electrode 12 are disposed in a line alternately along the first direction X.

The plurality of impurity regions 112 may be constituted of two impurity regions 112 which face each other in the first direction X. In this case, one of the impurity regions 112 is electrically connected to the first terminal electrode 11 and the other of the impurity regions 112 is electrically connected to the second terminal electrode 12.

The plurality of impurity regions 112 can be given in any planar shape, any plane area, any thickness and any n-type impurity concentration, etc., and is not restricted to a specific mode or a specific value. The specification of the plurality of impurity regions 112 can be given in various types of modes and values, depending on electrical characteristics to be attained.

With reference to FIG. 14, FIG. 15, and FIG. 17, the previously described main surface insulation layer 38 is formed on the first main surface 33 of the substrate 32. A plurality of contact holes 115 are formed on the main surface insulation layer 38. The plurality of contact holes 115 expose the corresponding impurity regions 112 with a one-to-one correspondence relationship. In this embodiment, each of the contact holes 115 has a plane area which is smaller than a plane area of a corresponding impurity region 112. Each of the contact holes 115 exposes an inner region excluding a peripheral edge of the corresponding impurity region 112.

With reference to FIG. 17, the previously described internal electrode 39 is formed on the main surface insulation layer 38. In this embodiment, the internal electrode 39 includes a plurality of first lead-out electrodes 116 and a plurality of second lead-out electrodes 117, in addition to the previously described first pad electrode 41 and the second pad electrode 42.

The plurality of first lead-out electrodes 116 are led out from the first pad electrode 41 toward the second pad electrode 42 and cover the corresponding first impurity region groups 113 with a one-to-one correspondence relationship. The plurality of first lead-out electrodes 116 are formed in a comb shape in plan view. The plurality of first lead-out electrodes 116 enter the corresponding contact holes 115 and are electrically connected to the corresponding impurity regions 112.

The plurality of first lead-out electrodes 116 may each include at least any one of aluminum, copper, aluminum alloy and copper alloy. The plurality of first lead-out electrodes 116 may each include at least any one of AlSiCu alloy, AlSi alloy and AlCu alloy. The plurality of first lead-out electrodes 116 may include the same electroconductive material as that of the first pad electrode 41 and/or that of the second pad electrode 42.

The plurality of second lead-out electrodes 117 are led out from the second pad electrode 42 toward the first pad electrode 41 and cover the corresponding second impurity region groups 114 with a one-to-one correspondence relationship. The plurality of second lead-out electrodes 117 are formed in a comb shape in plan view such as to mesh with the plurality of first lead-out electrodes 116. The plurality of second lead-out electrodes 117 enter the corresponding contact holes 115 and are electrically connected to the corresponding impurity regions 112.

The plurality of second lead-out electrodes 117 may each include at least any one of aluminum, copper, aluminum alloy and copper alloy. The plurality of second lead-out electrodes 117 may each include at least any one of AlSiCu alloy, AlSi alloy and AlCu alloy. The plurality of second lead-out electrodes 117 may include the same electroconductive material as that of the first pad electrode 41 and/or that of the second pad electrode 42.

The other structures are the same as those described in the first preferred embodiment. As described above, even where the functional device FD includes the diode D, it is possible to provide the same effects as those described in the chip part 1. The functional device FD (diode D) according to the first mode example may be incorporated in the chip part 101 according to the second preferred embodiment.

Figure 18:
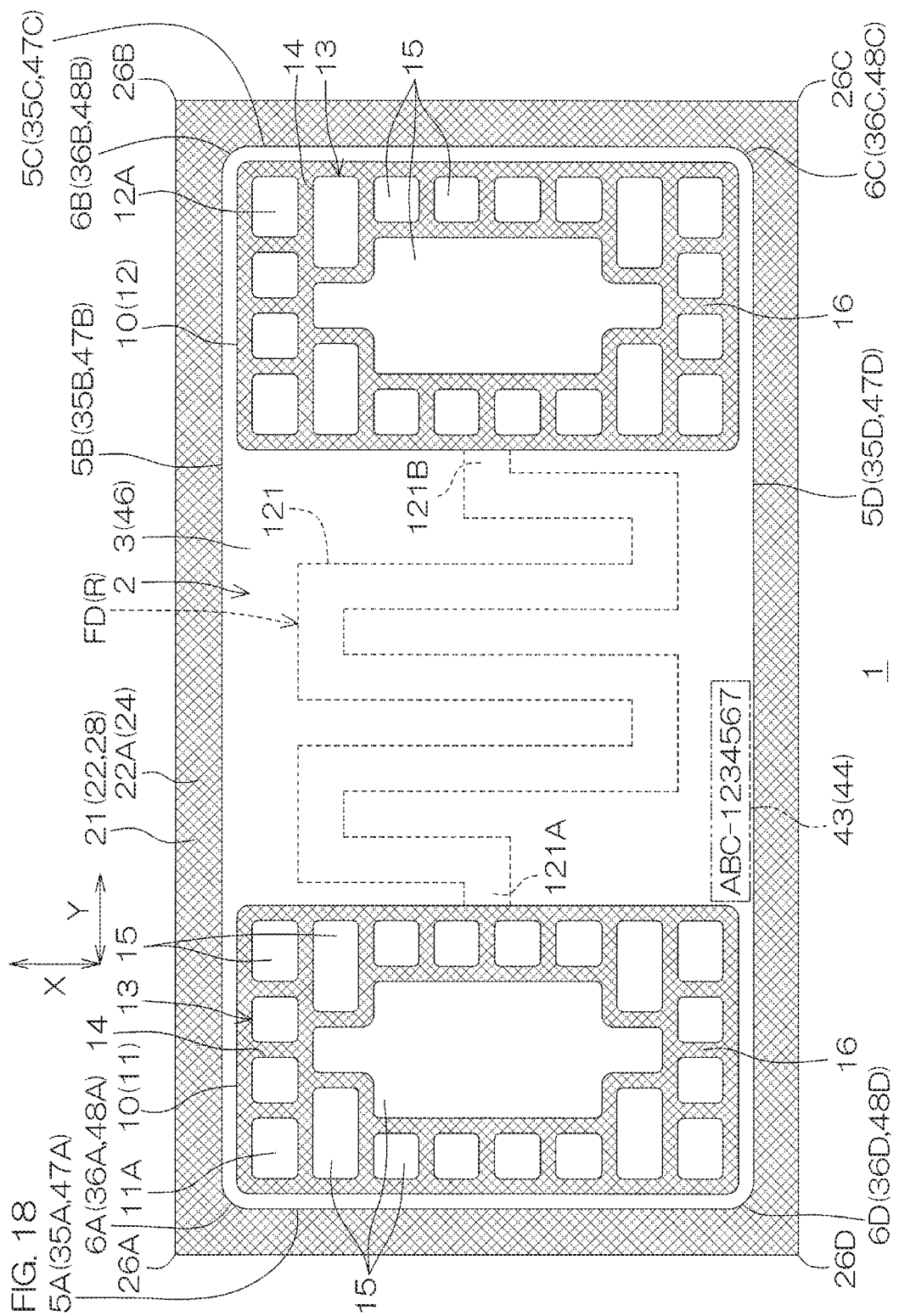
FIG. 18 is a plan view corresponding to FIG. 3 and a plan view for describing a functional device (resistor) which is incorporated in the chip part according to a second mode example.
Figure 19:
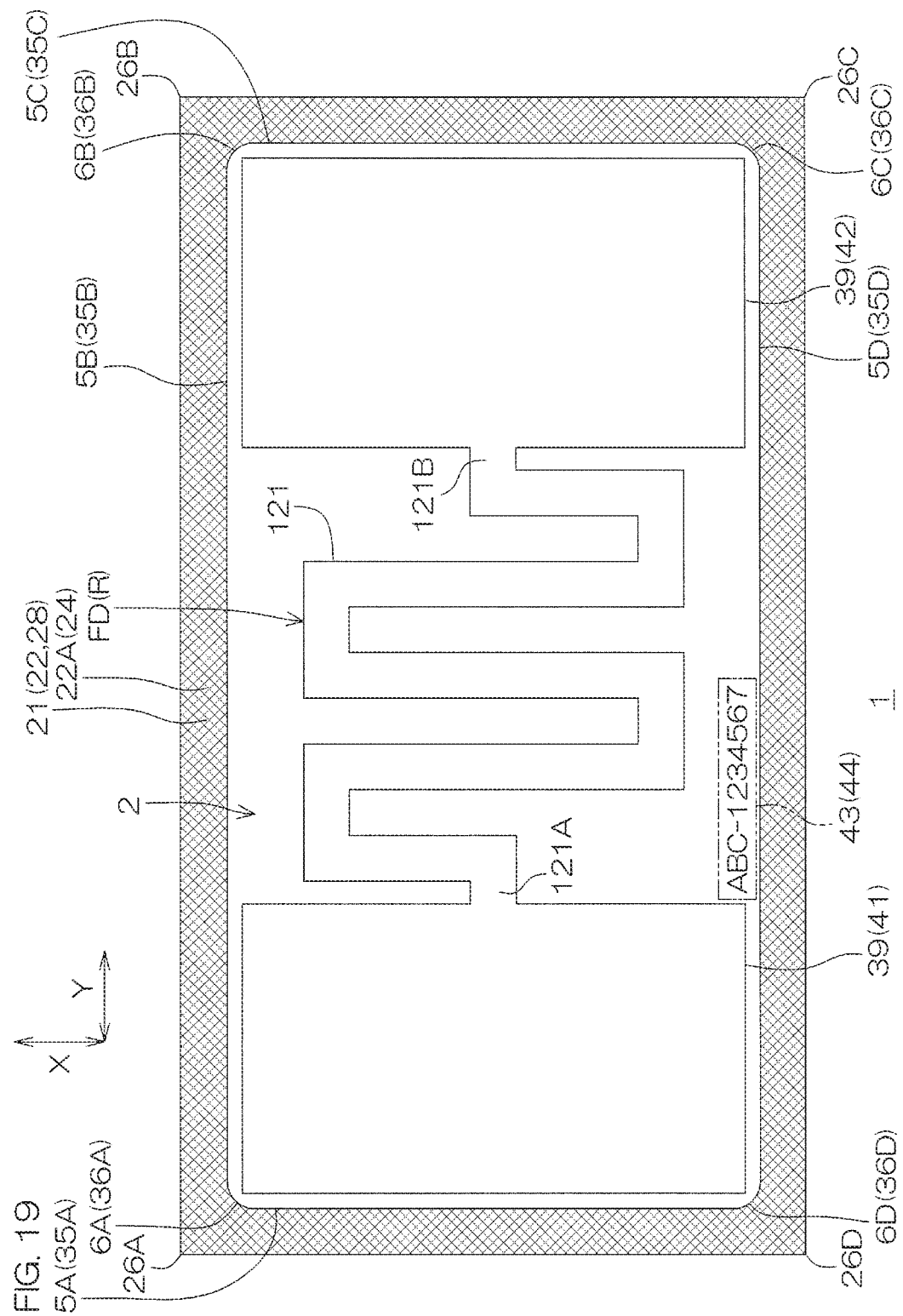
FIG. 19 is a plan view for describing a structure of an internal electrode by removing structures on the internal electrode from FIG. 18.

FIG. 18 is a plan view corresponding to FIG. 3 and a plan view for describing a functional device FD (resistor R) incorporated in the chip part 1 according to a second mode example. FIG. 19 is a plan view for describing a structure of an internal electrode 39 by removing structures on the internal electrode 39 from FIG. 18. Hereinafter, a structure corresponding to the structure described in the chip part 1 will be given the same reference numerals, with a description thereof omitted.

With reference to FIG. 18 and FIG. 19, the functional device FD according to the second mode example includes a resistor R. In this embodiment, the internal electrode 39 includes a resistor conductor layer 121, in addition to the first pad electrode 41 and the second pad electrode 42. The resistor conductor layer 121 is selectively drawn around at a region between the first pad electrode 41 and the second pad electrode 42 on the main surface insulation layer 38.

The resistor conductor layer 121 extends in a band shape at the region between the first pad electrode 41 and the second pad electrode 42. In this embodiment, the resistor conductor layer 121 is drawn around in a zigzag manner. The resistor conductor layer 121 may extend rectilinearly at the region between the first pad electrode 41 and the second pad electrode 42.

The resistor conductor layer 121 has a first end portion 121A at one side and a second end portion 121B at the other side. The first end portion 121A of the resistor conductor layer 121 is connected to the first pad electrode 41. The second end portion 121B of the resistor conductor layer 121 is connected to the second pad electrode 42.

The resistor conductor layer 121 is preferably formed with a metal material higher in resistivity than copper. The resistor conductor layer 121 may have a single layer structure including a Ti layer or a TiN layer. The resistor conductor layer 121 may have a stacked-layer structure including a Ti layer and a Ti N layer stacked in an arbitrary order.

The other structures are the same as those described in the first preferred embodiment. As described above, even where the functional device FD includes the resistor R, it is possible to provide the same effects as those described in the chip part 1. The functional device FD (resistor R) according to the second mode example may be incorporated in the chip part 101 according to the second preferred embodiment.

Figure 20:
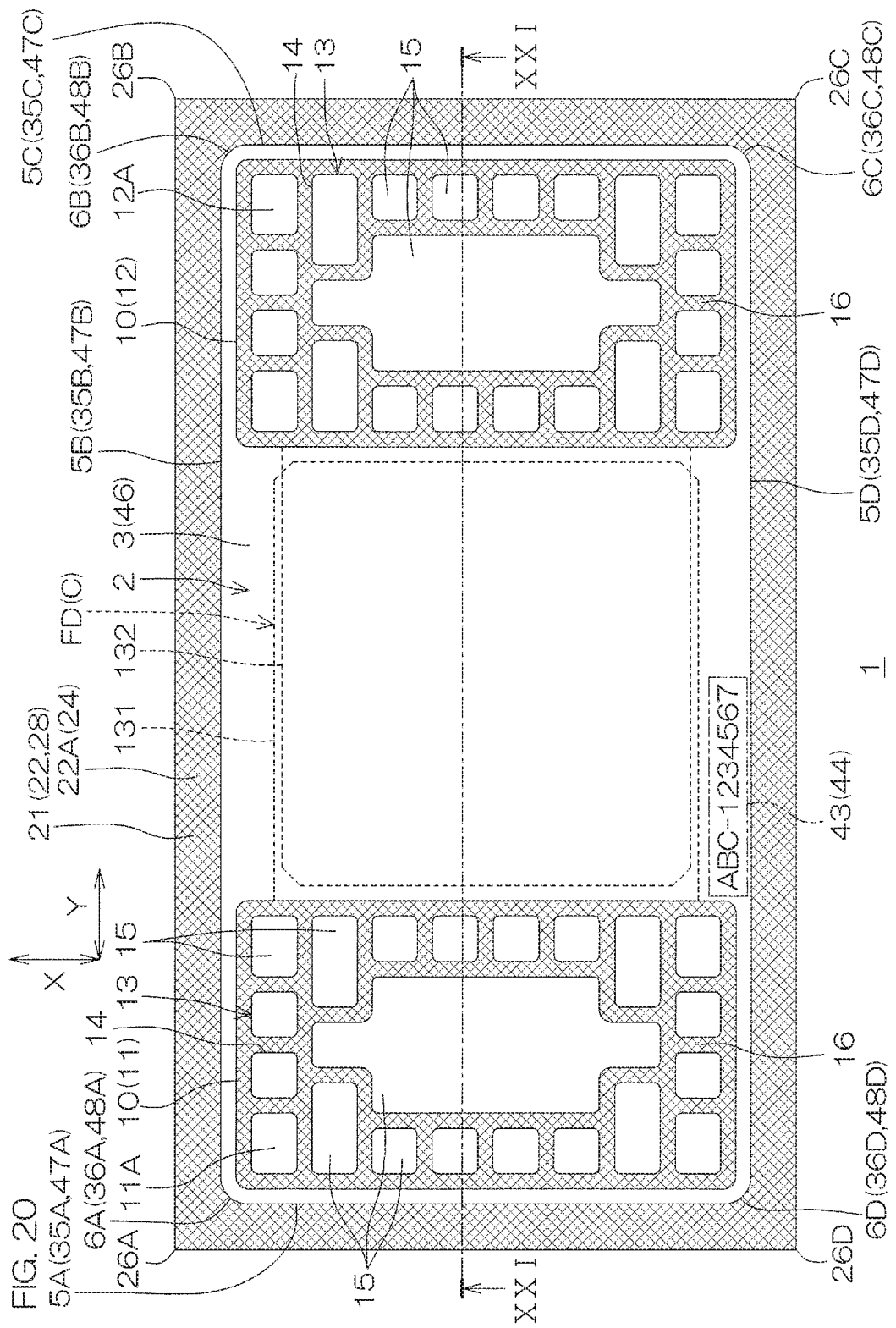
FIG. 20 is a plan view corresponding to FIG. 3 and a plan view for describing a functional device (capacitor) which is incorporated in the chip part according to a third mode example.

FIG. 20 is a plan view corresponding to FIG. 3 and a plan view for describing a functional device FD (capacitor C) incorporated in the chip part 1 according to a third mode example. FIG. 21 is a cross-sectional view which is taken along line XXI-XXI shown in FIG. 20. Hereinafter, a structure corresponding to the structure described in the chip part 1 will be given the same reference numerals, with a description thereof omitted.

With reference to FIG. 20 and FIG. 21, the functional device FD according to the third mode example includes a capacitor C. In this embodiment, the internal electrode 39 includes a first capacitor electrode 131 and a second capacitor electrode 132, in addition to the first pad electrode 41 and the second pad electrode 42. Further, in this embodiment, the chip main body 2 includes a dielectric layer 133 interposed between the first capacitor electrode 131 and the second capacitor electrode 132.

The first capacitor electrode 131 is formed on a main surface insulation layer 38 together with the first pad electrode 41. The first capacitor electrode 131 is led out from the first pad electrode 41 toward the second pad electrode 42. In this embodiment, the first capacitor electrode 131 is formed in a square shape in plan view.

The first capacitor electrode 131 may include at least any one of aluminum, copper, aluminum alloy and copper alloy. The first capacitor electrode 131 may include at least any one of AlSiCu alloy, AlSi alloy and AlCu alloy. The first capacitor electrode 131 may include the same electroconductive material as that of the first pad electrode 41 and/or that of the second pad electrode 42.

The dielectric layer 133 covers the first capacitor electrode 131 on the main surface insulation layer 38. The dielectric layer 133 may have a single layer structure including a silicon oxide layer or a silicon nitride layer. The dielectric layer 133 may have a stacked-layer structure including a silicon oxide layer and a silicon nitride layer stacked in an arbitrary order. The dielectric layer 133 may have an ONO structure including a silicon oxide layer, a silicon nitride layer and a silicon oxide layer stacked in this order from the side of the chip main body 2.

The second capacitor electrode 132 is formed on the dielectric layer 133. The second capacitor electrode 132 is led out from the second pad electrode 42 toward the first pad electrode 41. In this embodiment, the second capacitor electrode 132 is formed in a square shape in plan view. The second capacitor electrode 132 faces the first capacitor electrode 131, with the dielectric layer 133 interposed therebetween. The capacitor C is formed by a stacked-layer structure including the first capacitor electrode 131, the dielectric layer 133 and the second capacitor electrode 132.

The second capacitor electrode 132 may include at least any one of aluminum, copper, aluminum alloy and copper alloy. The second capacitor electrode 132 may include at least any one of AlSiCu alloy, AlSi alloy and AlCu alloy. The second capacitor electrode 132 may include the same electroconductive material as that of the first pad electrode 41 and/or that of the second pad electrode 42.

The other structures are the same as those described in the first preferred embodiment. As described above, even where the functional device FD includes the capacitor C, it is possible to provide the same effects as those described in the chip part 1. The functional device FD (capacitor C) according to the third mode example may be incorporated in the chip part 101 according to the second preferred embodiment.

FIG. 22 is a plan view corresponding to FIG. 3 and a plan view for describing a functional device FD (coil L) incorporated in a chip part 1 according to a fourth mode example. FIG. 23 is a cross-sectional view which is taken along line XXIII-XXIII shown in FIG. 22.

FIG. 24 is a plan view for describing a portion of a structure of an internal electrode 39 by removing a structure on a first pad electrode 41 from FIG. 22. FIG. 25 is a plan view for describing a portion of a structure of the internal electrode 39 by removing a structure on a second pad electrode 42 from FIG. 22. Hereinafter, a structure corresponding to the structure described in the chip part 1 will be given the same reference numerals, with a description thereof omitted.

With reference to FIG. 22 to FIG. 25, the functional device FD according to the fourth mode example includes a coil L. In this embodiment, the internal electrode 39 includes a coil conductor 141 and a lead-out electrode 142, in addition to the first pad electrode 41 and the second pad electrode 42. Further, in this embodiment, the chip main body 2 includes an intermediate insulation layer 143 interposed between the coil conductor 141 and the lead-out electrode 142.

The coil conductor 141 is formed on the main surface insulation layer 38 together with the first pad electrode 41. The coil conductor 141 is formed at a region between the first terminal electrode 11 and the second terminal electrode 12 in plan view. The coil conductor 141 includes a first coil end 141A at one side, a second coil end 141B at the other side and a spiral portion 141C.

The first coil end 141A of the coil conductor 141 is connected to the first pad electrode 41. The second coil end 141B of the coil conductor 141 is positioned at an inner region (central portion) of the first main surface 33 of the substrate 32 in plan view. The second coil end 141B forms a spiral center of the coil conductor 141. The spiral portion 141C is inwardly wound around from the first coil end 141A toward the second coil end 141B in plan view.

The coil conductor 141 may include at least any one of aluminum, copper, aluminum alloy and copper alloy. The coil conductor 141 may include at least any one of AlSiCu alloy, AlSi alloy and AlCu alloy. The coil conductor 141 may include the same electroconductive material as that of the first pad electrode 41 and/or that of the second pad electrode 42.

The intermediate insulation layer 143 covers the coil conductor 141 on the main surface insulation layer 38. The intermediate insulation layer 143 may have a single layer structure including a silicon oxide layer or a silicon nitride layer. The intermediate insulation layer 143 may have a stacked-layer structure including a silicon oxide layer and a silicon nitride layer stacked in an arbitrary order. A contact hole 144 which exposes the second coil end 141B of the coil conductor 141 is formed on the intermediate insulation layer 143.

The lead-out electrode 142 is formed on the intermediate insulation layer 143. The lead-out electrode 142 is led out from the second pad electrode 42 toward the contact hole 144. The lead-out electrode 142 enters the contact hole 144. The lead-out electrode 142 is connected to the second coil end 141B of the coil conductor 141 inside the contact hole 144.

The lead-out electrode 142 may include at least any one of aluminum, copper, aluminum alloy and copper alloy. The lead-out electrode 142 may include at least any one of AlSiCu alloy, AlSi alloy and AlCu alloy. The lead-out electrode 142 may include the same electroconductive material as that of the first pad electrode 41 and/or that of the second pad electrode 42.

The other structures are the same as those described in the first preferred embodiment. As described above, even where the functional device FD includes the coil L, it is possible to provide the same effects as those described in the chip part 1. The functional device FD (coil L) according to the fourth mode example may be incorporated in the chip part 101 according to the second preferred embodiment.

This embodiment of the present invention can be executed in other modes.

In each of the previously described preferred embodiments, the first terminal electrode 11 which has the first electrode surface 11A free from the recess 14 may be formed. In this case, a relatively wide first pad opening 54 is formed, and no first sub pad opening 55 is formed. Further, no buried substance 16 is formed in the first electrode surface 11A. In this case, the recess 14, the protrusion region 15 and the buried substance 16 may be formed in the second electrode surface 12A of the second terminal electrode 12.

In each of the previously described preferred embodiments, the second terminal electrode 12 which has the second electrode surface 12A free from the recess 14. In this case, a relatively wide second pad opening 58 is formed, and no second sub pad opening 59 is formed. Further, no buried substance 16 is formed in the second electrode surface 12A. In this case, the recess 14, the protrusion region 15 and the buried substance 16 may be formed in the first electrode surface 11A of the first terminal electrode 11.

In each of the previously described preferred embodiments, the first terminal electrode 11 which has the first electrode surface 11A free from the recess 14 and the second terminal electrode 12 which has the second electrode surface 12A free from the recess 14. In this case, a relatively wide first pad opening 54 and a relatively wide second pad opening 58 are formed, and no first sub pad opening 55 or no second sub pad opening 59 is formed. Further, no buried substance 16 is formed in the first electrode surface 11A or the second electrode surface 12A.

In each of the previously described preferred embodiments, a description has been given of an example in which the first covering portion 57 and the second covering portion 60 of the insulation layer 45 are used to introduce the recess 14 into the respective electrode surfaces 11A, 12A of the first terminal electrode 11 and the second terminal electrode 12. However, grooves may be formed at regions which face the first terminal electrode 11 and the second terminal electrode 12 in the first main surface 33 of a substrate 32, and the grooves may be used to introduce the recess 14 into the respective electrode surfaces 11A, 12A of the first terminal electrode 11 and the second terminal electrode 12.

In each of the previously described preferred embodiments, the substrate 32 may be a semiconductor substrate or an insulation substrate. In a case in which the chip part 1 includes the functional device FD which uses characteristics of a semiconductor (for example, the diode D, etc.), a semiconductor substrate may be adopted as the substrate 32. In a case in which the chip part 1 includes the functional device FD which does not use characteristics of a semiconductor (for example, the resistor R, the capacitor C, the coil L, etc.), a semiconductor substrate or an insulation substrate may be adopted as the substrate 32.

The substrate 32 may be a silicon substrate, a silicon carbide substrate or a nitride semiconductor substrate as an example of the semiconductor substrate. The substrate 32 may be a glass substrate, a ceramic substrate, a sapphire substrate or a resin substrate as an example of the insulation substrate.

In a case in which the substrate 32 is the semiconductor substrate, a process for manufacturing a semiconductor can be used to manufacture the chip parts 1 and 101. Even in a case in which the substrate 32 is the semiconductor substrate, the main surface insulation layer 38 is formed on a first main surface 33 to attain the same performance as that of an insulation substrate. In a case in which the substrate 32 is the insulation substrate, the main surface insulation layer 38 may be removed. In view of manufacturing costs, it is preferable that the substrate 32 is the silicon substrate excellent in availability and workability, irrespective of properties of a functional device FD.

In each of the previously described preferred embodiments, there may be formed the chip part 1 or the chip part 101 including the plurality of functional devices FD (the diode D, the resistor R, the capacitor C and the coil L) according to the first mode example, the second mode example, the third mode example and the fourth mode example.

In each of the previously described preferred embodiments, the chip part 1 or the chip part 101 including at the same time at least two types of the functional devices FD (the diode D, the resistor R, the capacitor C and the coil L) according to the first mode example, the second mode example, the third mode example and the fourth mode example is formed.

The following shows the examples of characteristics extracted from this description and the drawings.

[A1] An electronic component comprising: an electrode including an electrode surface having a recess; and a buried substance different in color from the electrode surface and buried in the recess.

According to the electronic component, contrast between the interior and the exterior of the recess on the electrode surface is enhanced by the buried substance. It is, thereby, possible to smoothly make a visual inspection by using the electrode surface. The visual inspection may include a judgment on whether the electronic component is placed face up or face down by using the electrode surface.

[A2] The electronic component according to A1, wherein the buried substance is darker in shade than the electrode.

[A3] The electronic component according to A1 or A2, wherein the buried substance includes an insulator.

[A4] The electronic component according to any one of A1 to A3, wherein the buried substance includes a resin.

[A5] The electronic component according to any one of A1 to A4, wherein the buried substance includes an opaque resin.

[A6] The electronic component according to any one of A1 to A5, wherein the buried substance includes a thermosetting resin.

[A7] The electronic component according to any one of A1 to A6, wherein the recess is formed in a lattice shape, a net shape, a line shape or a dot shape.

[A8] The electronic component according to any one of A1 to A7, wherein the electrode surface has a plurality of protrusion regions demarcated by the recess.

[A9] The electronic component according to any one of A1 to A8, wherein the electrode is a terminal electrode which is exposed outside.

[A10] A method for manufacturing an electronic component comprising: a step of forming an electrode which includes an electrode surface having a recess; and a burial step of burying a material different in color from the electrode surface in the recess.

According to the method for manufacturing an electronic component, contrast between the interior and the exterior of the recess on the electrode surface is enhanced by a buried substance which is buried in the recess. It is, thereby, possible to manufacture and provide the electronic component in which a visual inspection can be made smoothly by using the electrode surface. The visual inspection may include a judgment on whether the electronic component is placed face up or face down by using the electrode surface.

[A11] The method for manufacturing an electronic component according to A10, wherein the material is darker in shade than the electrode.

[A12] The method for manufacturing an electronic component according to A10 or A11, wherein the material includes an insulator.

[A13] The method for manufacturing an electronic component according to any one of A10 to A12, wherein the material includes a resin.

[A14] The method for manufacturing an electronic component according to any one of A10 to A13, wherein the material includes an opaque resin.

[A15] The method for manufacturing an electronic component according to any one of A10 to A14, wherein the material includes a thermosetting resin.

[A16] The method for manufacturing an electronic component according to any one of A10 to A15, wherein the recess is formed in a lattice shape, a net shape, a line shape or a dot shape.

[A17] The method for manufacturing an electronic component according to any one of A10 to A16, wherein the electrode surface has a plurality of protrusion regions demarcated by the recess.

[A18] The method for manufacturing an electronic component according to any one of A10 to A17, wherein the burial step includes a step of forming a material layer which includes the material and covers the electrode surface by burying the recess and a step of removing a portion of the material layer which covers the electrode surface so that a portion buried in the recess remains.

[A19] The method for manufacturing an electronic component according to any one of A10 to A18, wherein the electrode is a terminal electrode which is exposed outside.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A chip part comprising:
  a chip main body which has a first main surface at one side, a second main surface at another side and side surfaces that connect the first main surface and the second main surface and which includes a terminal electrode exposed from the first main surface; and
  an outer surface resin which is formed in a film shape following an outer surface of the chip main body such that the first main surface and the terminal electrode of the chip main body are exposed, and the outer surface of the chip main body is covered;
  wherein the terminal electrode protrudes from the first main surface of the chip main body and a side portion of the protruded terminal electrode is covered with an insulation side surface,
  wherein the outer surface resin includes a side surface covering portion which covers the side surfaces of the chip main body such that the first main surface is surrounded in a plan view,
  wherein the side surface covering portion has a first end portion at a side of the first main surface which covers the insulation side surface,
  wherein the first end portion of the side surface covering portion has an inclined surface which is downwardly inclined to the outside from the chip main body, and
  wherein the outer surface resin includes a main surface covering portion which covers the second main surface of the chip main body.

2. The chip part according to claim 1 further comprising:
  a side surface insulation layer that covers the side surfaces of the chip main body;

wherein the outer surface resin covers the outer surface of the chip main body with the side surface insulation layer interposed therebetween.

3. The chip part according to claim 1, wherein the side surface covering portion covers the side surfaces of the chip main body to be spaced from the first main surface to a side of the second main surface.

4. The chip part according to claim 1, wherein the second main surface is a grinding surface having a grinding mark, and the main surface covering portion buries the grinding mark and covers the second main surface.

5. The chip part according to claim 1, wherein the chip main body has a stacked-layer structure including a substrate and an insulation layer formed on the substrate and includes the first main surface, the first main surface being formed by the insulation layer, and the second main surface, the second main surface being formed by the substrate, and the side surfaces, the side surfaces being formed by the substrate and the insulation layer, and the outer surface resin covers the substrate.

6. The chip part according to claim 5, wherein the outer surface resin covers the insulation layer.

7. The chip part according to claim 6, wherein the insulation layer includes a resin, and the outer surface resin includes a resin different from the insulation layer.

8. The chip part according to claim 6, wherein the insulation layer includes a photosensitive resin, and the outer surface resin includes a thermosetting resin.

9. The chip part according to claim 1, wherein the terminal electrode has an electrode surface including a recess which is recessed toward the second main surface.

10. The chip part according to claim 9 further comprising: a buried substance which is buried in the recess.

11. The chip part according to claim 10, wherein the buried substance is different in color from the electrode surface.

12. The chip part according to claim 10, wherein the buried substance includes an insulator.

13. The chip part according to claim 10, wherein the buried substance includes a same type of resin as a type of the outer surface resin.

14. The chip part according to claim 1, wherein the main surface covering portion of the outer surface resin covers a whole region of the second main surface of the chip main body.

15. The chip part according to claim 1, wherein no terminal electrode is formed on the second main surface of the chip main body and on the main surface covering portion of the outer surface resin.

* * * * *